US008781808B2

(12) United States Patent
Yang

(10) Patent No.: US 8,781,808 B2
(45) Date of Patent: Jul. 15, 2014

(54) PREDICTION-BASED DISTRIBUTED PARALLEL SIMULATION METHOD

(76) Inventor: Sei Yang Yang, Busan (KR)

(*) Notice: Subject to any disclaimer, the term of this patent is extended or adjusted under 35 U.S.C. 154(b) by 434 days.

(21) Appl. No.: 12/987,481

(22) Filed: Jan. 10, 2011

(65) Prior Publication Data

US 2011/0184713 A1    Jul. 28, 2011

Related U.S. Application Data

(63) Continuation-in-part of application No. 12/089,665, filed as application No. PCT/KR2006/004059 on Oct. 10, 2006, now abandoned.

(30) Foreign Application Priority Data

| Oct. 10, 2005 | (KR) | 10-2005-0095803 |
|---|---|---|
| Oct. 18, 2005 | (KR) | 10-2005-0098941 |
| Dec. 12, 2005 | (KR) | 10-2005-0122926 |
| Dec. 19, 2005 | (KR) | 10-2005-0126636 |
| Jan. 20, 2006 | (KR) | 10-2006-0006079 |
| Mar. 1, 2006 | (KR) | 10-2006-0019738 |
| Apr. 25, 2006 | (KR) | 10-2006-0037412 |
| Apr. 27, 2006 | (KR) | 10-2006-0038426 |
| May 15, 2006 | (KR) | 10-2006-0043611 |
| May 29, 2006 | (KR) | 10-2006-0048394 |
| Jul. 23, 2006 | (KR) | 10-2006-0068811 |
| Sep. 22, 2006 | (KR) | 10-2006-0092573 |
| Sep. 22, 2006 | (KR) | 10-2006-0092574 |

(51) Int. Cl.
*G06F 17/50* (2006.01)
*G06F 7/62* (2006.01)

(52) U.S. Cl.
USPC ............................................. 703/13

(58) Field of Classification Search
CPC .................................................. G06F 17/5022
USPC ............................................. 703/13
See application file for complete search history.

(56) References Cited

U.S. PATENT DOCUMENTS

| 5,801,938 A | 9/1998 | Kalantery |
| 6,134,514 A * | 10/2000 | Liu et al. .................... 703/17 |
| 6,182,247 B1 | 1/2001 | Hermann et al. |
| 6,182,258 B1 | 1/2001 | Hollander |
| 6,247,147 B1 | 6/2001 | Beenstra et al. |
| 6,286,114 B1 | 9/2001 | Veenstra et al. |
| 6,345,240 B1 | 2/2002 | Havens |
| 6,389,558 B1 | 5/2002 | Hermann et al. |
| 6,457,162 B1 * | 9/2002 | Stanion ..................... 716/107 |
| 6,460,148 B2 | 10/2002 | Veenstra et al. |

(Continued)

FOREIGN PATENT DOCUMENTS

| JP | 2001256267 | 9/2001 |
| KR | 1020010057800 | 7/2001 |

(Continued)

*Primary Examiner* — David Silver
(74) *Attorney, Agent, or Firm* — Cantor Colburn LLP

(57) ABSTRACT

The simulation consists of a front-end simulation and a back-end simulation. The front-end simulation can use an equivalent model at different abstraction level, or a simulation model for the back-end simulation. The back-end simulation uses the simulation result of front-end simulation so that it can run one or more simulation runs sequentially or in parallel. Alternatively, models at lower level of abstraction are simulated together with a model at higher level of abstraction in parallel using two or more simulators.

13 Claims, 55 Drawing Sheets

(56) References Cited

U.S. PATENT DOCUMENTS

| | | |
|---|---|---|
| 6,701,491 B1 | 3/2004 | Yang |
| 6,704,889 B2 | 3/2004 | Veenstra et al. |
| 6,748,352 B1 * | 6/2004 | Yuen et al. ............ 703/16 |
| 6,760,898 B1 | 7/2004 | Sanchez et al. |
| 6,816,828 B1 * | 11/2004 | Ikegami ............... 703/15 |
| 6,826,717 B1 | 11/2004 | Draper et al. |
| 6,856,950 B1 * | 2/2005 | Abts et al. ........... 703/13 |
| 7,020,722 B2 * | 3/2006 | Sivier et al. .......... 709/248 |
| 7,036,046 B2 | 4/2006 | Rally et al. |
| 2002/0116694 A1 | 8/2002 | Fournier et al. |
| 2002/0133325 A1 * | 9/2002 | Hoare et al. ......... 703/17 |
| 2003/0093569 A1 * | 5/2003 | Sivier et al. ......... 709/248 |
| 2006/0004862 A1 | 1/2006 | Fisher et al. |
| 2006/0117274 A1 | 6/2006 | Tseng et al. |
| 2008/0306721 A1 * | 12/2008 | Yang ................... 703/14 |

FOREIGN PATENT DOCUMENTS

| | | |
|---|---|---|
| KR | 1020040093310 | 1/2006 |
| KR | 1020050116706 | 6/2006 |
| WO | 2005093575 | 10/2005 |

* cited by examiner

Figure 6
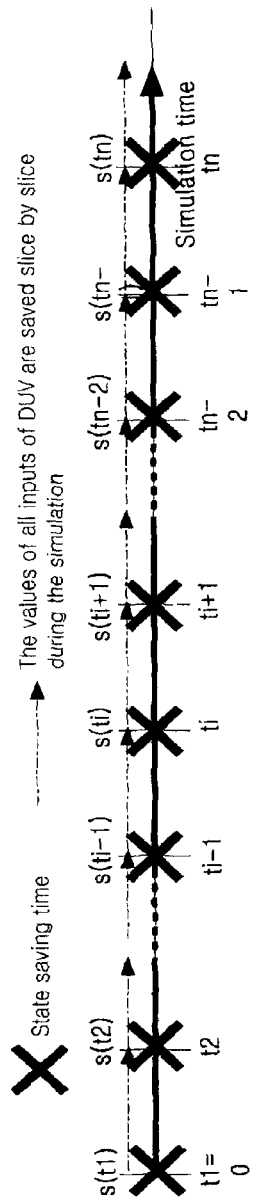
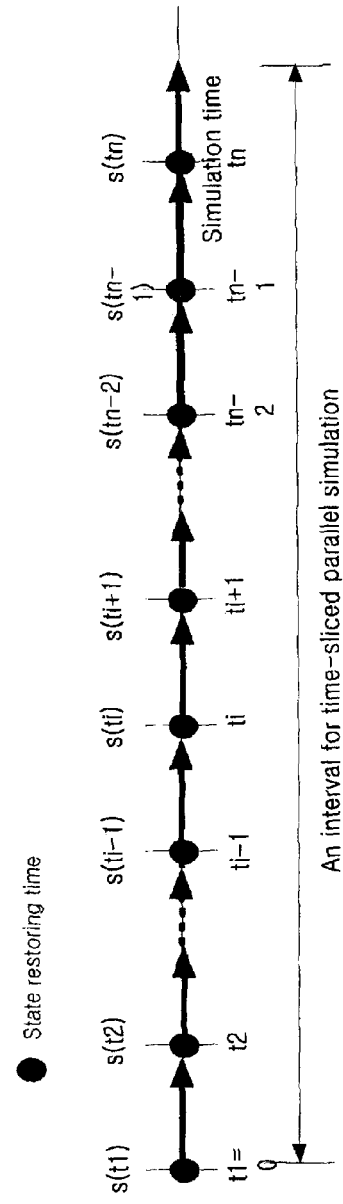
i) Front-end simulation with a model at higher level of abstraction
ii) Back-end simulation with a model at lower level of abstraction Figure 10
i) ESL model
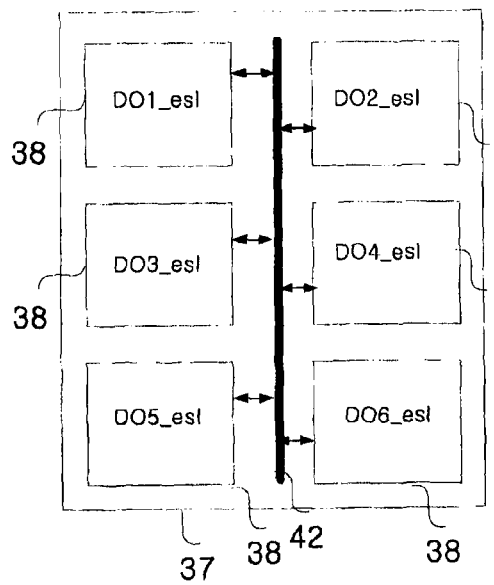
ii) RTL model
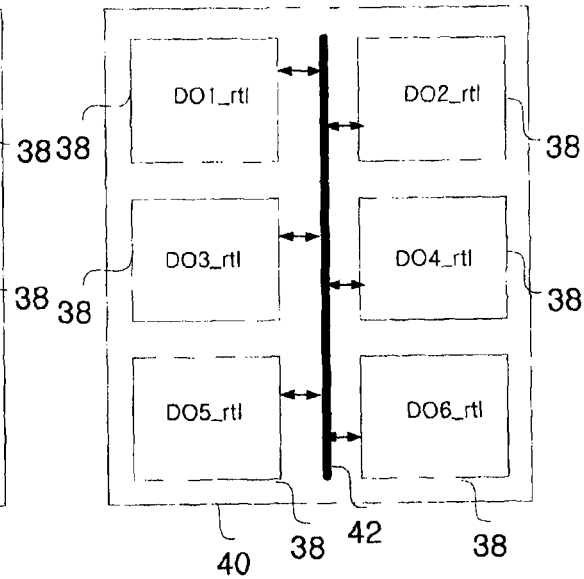
iii) DO_t_mixed(1)
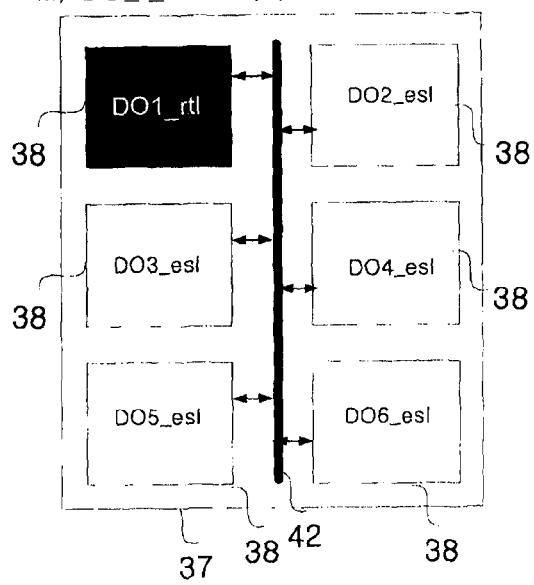

Figure 12
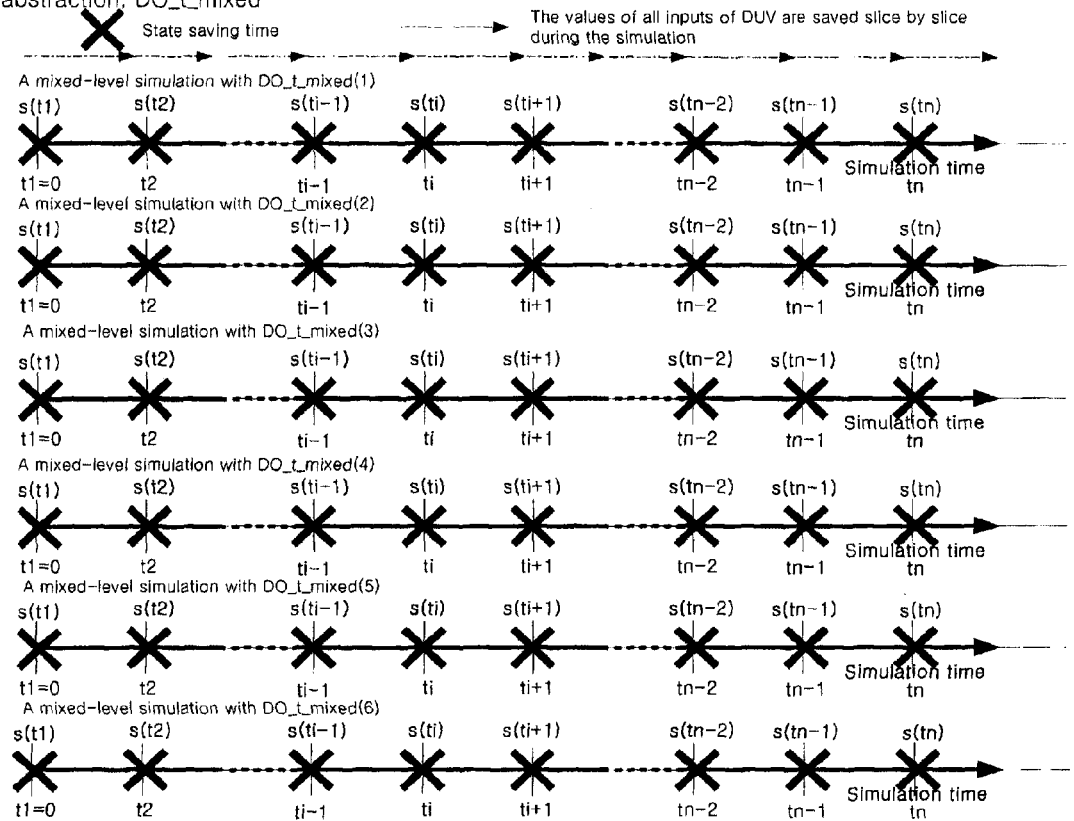
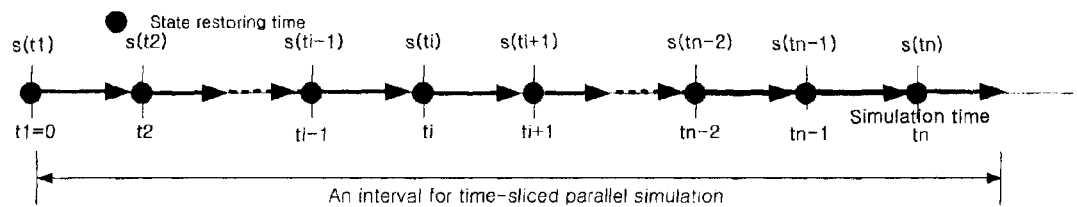

Figure 16

```
timescale 1ns / 1ns module tb;

reg clk;
reg rst;

initial clk = 0;
always begin
    #5 clk = 1;
    #5 clk = 0;
end initial
begin
    rst = 1;
    #6 rst = 0;
end initial #50_0 $finish;

wire [1:0] dout;

dut i_dut(
    .rst(rst),
    .dout(dout),
    .clk(clk)
);
endmodule
```

Figure 16 (continued)

```
module dut(rst, dout, clk );

input rst;
input clk;
output [1:0] dout;

wire updown;
count i_count ( .rst ( rst ), .updown ( updown), .dout ( dout ), .clk ( clk ) );
assign updown= &dout;
endmodule module count(rst, updown, dout, clk );
input rst;
input clk;
input updown;
output [1:0] dout;
reg [1:0] dout;

always @(posedge clk )
begin
    if(rst) dout = 0;
        else if( updown == 1 ) dout = dout − 1;
        else if( updown == 0 ) dout = dout + 1;
end
endmodule
```

Figure 17

```
`timescale 1ns / 1ns
module tb;
wire clk; wire rst; wire updown ( updown ); wire [1:0] dout;
count i_count(.rst(rst), .updown( updown ), .dout( dout ), .clk(clk));
wire clk_into; wire rst_into; wire updown_into;
nemo_into_subdutWtb.dut.i_count nemo_into_subdutWtb.dut.i_count (
    .clk( clk_into ), .rst( rst_into ), .updown( updown_into ));
wire [1:0] dout_outfrom;
nemo_outfrom_subdutWtb.dut.i_count nemo_outfrom_subdutWtb.dut.i_count
    ({.dout( dout_outfrom )});
integer fd;
always @(dout_outfrom, dout)
begin
    #0
    if ( dout_outfrom !== dout )
    begin
        $possible_rollback($time);

end
end
endmodule

`timescale 1 ps/1 ps
module nemo_into_subdutWtb.dut.i_count (clk,rst,updown);
output clk; output rst; output updown;
reg clk; reg rst; reg updown;
reg [2:0] sType; reg [127:0] memTable [127000:0]; reg [127:0] tmpReg; reg [63:0] delay;
integer memIndex; integer i;
initial
```

Figure 17 (continued)

```
begin
    memIndex = 0;
    break_flag = 0;
    $readmemb("ct/nemo_into_subdut#tb.dut.i_count.dat",memTable,0);
    while(!break_flag) begin
        #0
        tmpReg = memTable[memIndex];
        sType = tmpReg[2:0];
        memIndex = memIndex + 1;
        tmpReg = memTable[memIndex];
        memIndex = memIndex + 1;
        case(sType)
            3'd2:clk = tmpReg[0];
            3'd3:rst = tmpReg[0];
            3'd4:updown = tmpReg[0];
            3'd0:
                begin
                    delay = tmpReg[63:0];
                    #(delay);
                end
            3'd1:
                begin
                    break_flag = 1;
                end
            default:
                begin
                    $display("Invalid signal ",$time,sType);
                    $finish;
                end
        endcase
    end
endmodule
```

Figure 18

```
'timescale 1 ps/1 ps
module nemo_outputfrom_subdut\tb.dut.i_count(dout);
output [1:0] dout;
reg dout; reg [2:0] sType: reg [127:0] memTable [127000:0] reg [127:0] tmpReg: reg [63:0] delay;
integer memIndex; integer i;
initial
begin
    memIndex = 0;
    break_flag = 0;
    $readmemb("ct/nemo_outfrom_subdut#tb.dut.i_count.dat",    memTable, 0);
    while(!break_flag) begin
    #0
    tmpReg = memTable [memIndex];
    sType = tmpReg [2:0];
    memIndex = memIndex +1;
    tmpReg = memTable[memIndex];
    memIndex = memIndex +1;
    case(sType)
            3'd2:dout = tmpReg[0];
            3'd0:
            begin
                    delay = tmpReg[63:0]
                    #(delay);
            end
            3'd1:
            begin
                    break_flag = 1;
            end
            default;
            begin
                    $display("Invalid signal",$time, sType);
                    $finish;
            end
```

Figure 18 (continued)

```
        endcase
    end
endmodule include <stdio.h>
include <string.h>
#include <veriuser.h>
#include <vxl_veriuser.h>
#include <acc_user.h>
int load_register_state_misctf(int data, int reason)
{
    register int I;
switch(reason)
{
case REASON_ENDOFCOMPILE:
    break
case REASON_FINISH:
    break;
}
} int ReleaseSignal(handle hndl )
{
    s_setval_value valueStruct;;
    s_setval_delay delayStruct;
    s_acc_time timeStruct;
    timeStruct.type = accTime;
    timeStruct.low = timeStruct.high = 0;
    delayStruct.model = accReleaseFlag;
    delayStruct.time = timeStruct;
    valueStruct.value.str = NULL;
    valueStruct.format = accBinStrVal;
    acc_set_value(sig, &valueStruct, &delayStruct);
    return 0;
]
```

Figure 18 (further continued)

```
int ForceSignal(handle hnd], char *value)
{
s_setval_value valueStruct;
s_setval_delay delayStruct;
s_acc_time timeStruct;
timeStruct.type = accTime;
timeStruct.low = timeStruct.high = 0;
delayStruct.model = accForceFlag;
delayStruct.time = timeStruct;
valueStruct.value.str = value;
valueStruct.format = accBinStrVal;
acc_set_value(sig, &valueStruct, &delayStruct);
return 0;
}
int force_register_state_calltf()
{
    register int I;
    unsigned int num_regs = 1;
    handle Hndl;
    acc_initialize();
    for (i=0; i<num_regs; i++)
    { Hndl = acc_handle_by_name("tb.i_dut.i_count.dout", NULL);}
    return 0;
}
p_tfcell force_release_bootstrap()
{   static s_tfcell veriusertfs [2] =
    {
            {usertask,   0,    0,    0,    force_register_state_calltf,   0,
"$force_register_state"}
            {usertask,   0,    0,    0,    release_register_state_calltf, 0,
"$release_register_state"}
        {0}
    };
    return veriusertfs;
}
```

Figure 19

```verilog
`define maxDelay 5
`define Overlap_count 1
`define nemo_equal_count_max 3
module nemo_glbl();
time start_time_of_selected_slice;
reg incsim_dut_input_ctrl, incsim_dut_output_ctrl; reg nemo_equal_count; wire dummy_tb_clk,dummy_tb_rst;
initial
begin
    if ( $value$plusargs("start_time_of_selected_slice=%t",start_time_of_selected_slice) );
    else $display("[NEMO_ERROR] start_time_of_selected_slice is not specified");
end
initial
begin
nemo_equal_count = 0; incsim_dut_input_ctrl = 0; incsim_dut_output_ctrl = 0;
`ifdef FORCE_RELEASE_USING_PLI
$force_register_state;
`else // USING force & release statement
force tb.i_dut.i_count.dout = 2'b10;
`endif
#(start_time_of_selected_slice-`maxDelay * `Overlap_count )
incsim_dut_input_ctrl = 1;
#(`maxDelay * `Overlap_count)
`ifdef FORCE_RELEASE_USING_PLI
$release_register_state;
`else
release tb.i_dut.i_count.dout;
`endif
incsim_dut_output_ctrl = 1;
#0
begin : forever_block
forever @(tb.clk or tb.rst or dummy_tb_clk or dummy_tb_rst )
begin
    if ( tb.clk == dummy_tb_clk && tb.rst == dummy_tb_rst )
    begin
        nemo_equal_count = nemo_equal_count + 1;
    end
    if ( nemo_equal_count > nemo_equal_count_max )
    begin
        force tb.i_dut.clk = clk; force tb.i_dut.rst = rst; disable forever_block;
    end
end
```

Figure 19 (continued)

```
end
end
end
dummy_tb i_dummy_tb (.clk(dummy_tb_clk), .rst(dummy_tb_rst));
endmodule module dummy_tb( clk,rst);
output clk,output rst;reg clk;reg rst; reg [2:0] sType; reg [127:0] memTable [127000:0]; reg [127:0]
tmpReg;reg [63:0] delay;
integer memIndex, integer i;
initial
begin
    memIndex = 0;
    break_flag = 0;
    $readmemb("ct/dummy_tb.dat",memTable,0);
    while(!break_flag) begin
        #0
        tmpReg = memTable[memIndex];
        sType = tmpReg[2:0];
        memIndex = memIndex + 1;
        tmpReg = memTable[memIndex];
        memIndex = memIndex + 1;
        case(sType)
            3'd2:clk = tmpReg[0];
            3'd3:rst = tmpReg[0];
            3'd0:
                begin
                    delay = tmpReg[63:0];
                    #(delay);
                end
            3'd1:
                begin
                    break_flag = 1;
                end
            default:
                begin
                    $display("Invalid signal ",$time,sType);
                    $finish;
                end
        endcase
    end
endmodule
```

Figure 20
i) Obtaining s-DCP from a simulation executed earlier than a mixed simulation of distributed-processing-based-parallel-execution/singular-execution
ii) A mixed simulation of distributed-processing-based-parallel-execution/singular-execution using s-DCP obtained from the previous simulation
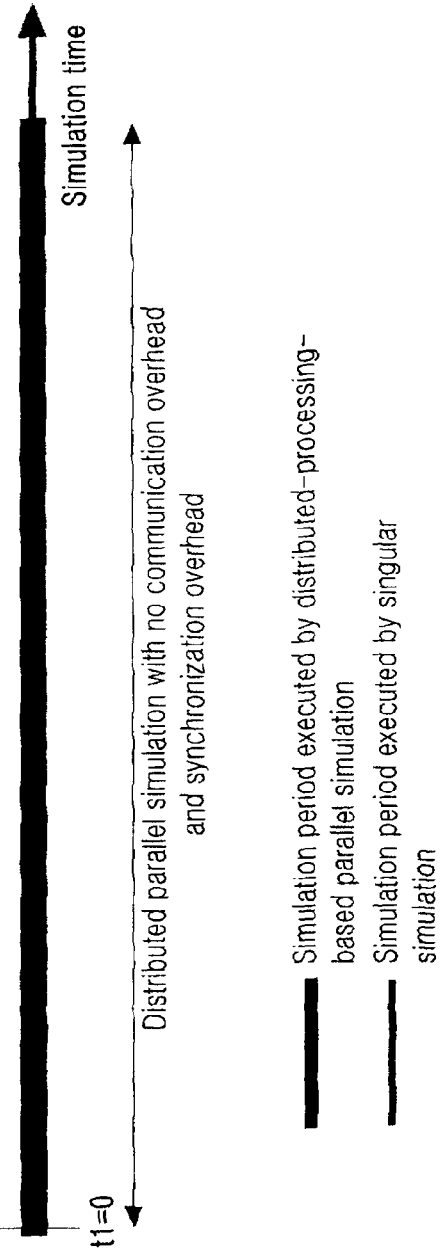

Figure 22

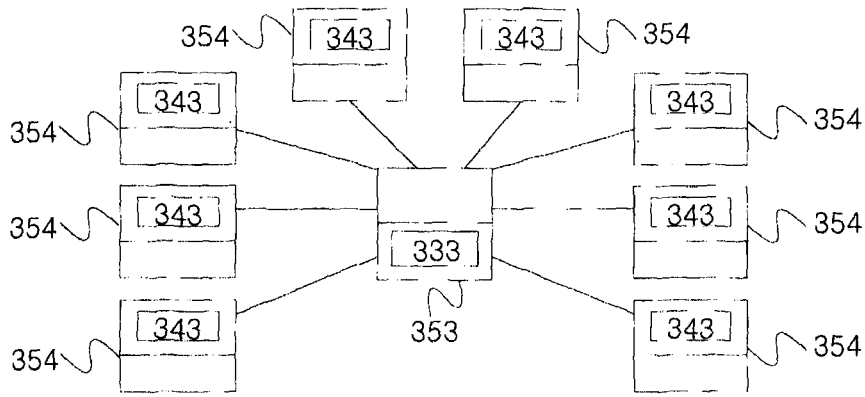

(a) Star connection topology in which the central computer does not perform a local simulation, but is responsible for the control and connection of local simulations that performed by peripheral computers

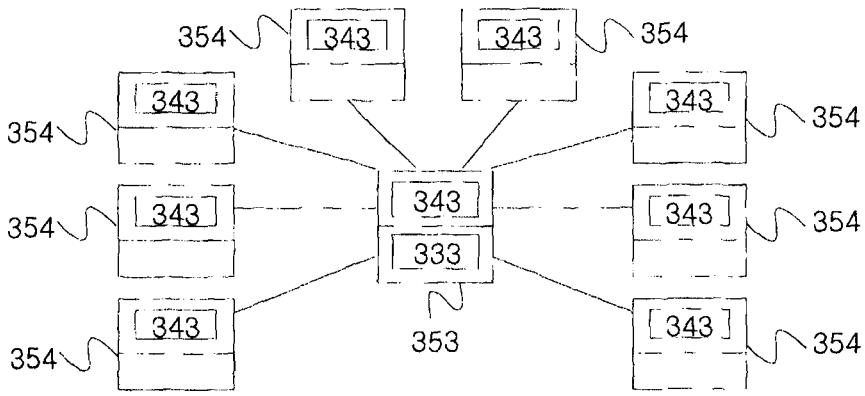

(b) Star connection topology in which the central computer performs a local simulation, and is also responsible for the control and connection of local simulations that performed by peripheral computers

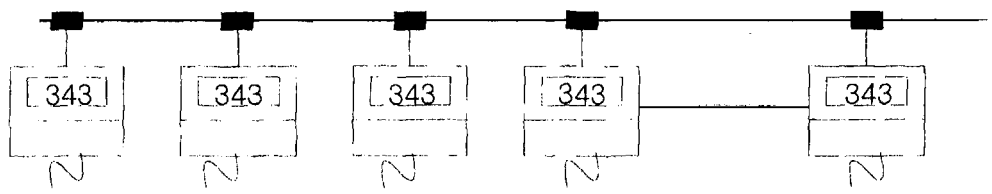

(c) Bus connection topology

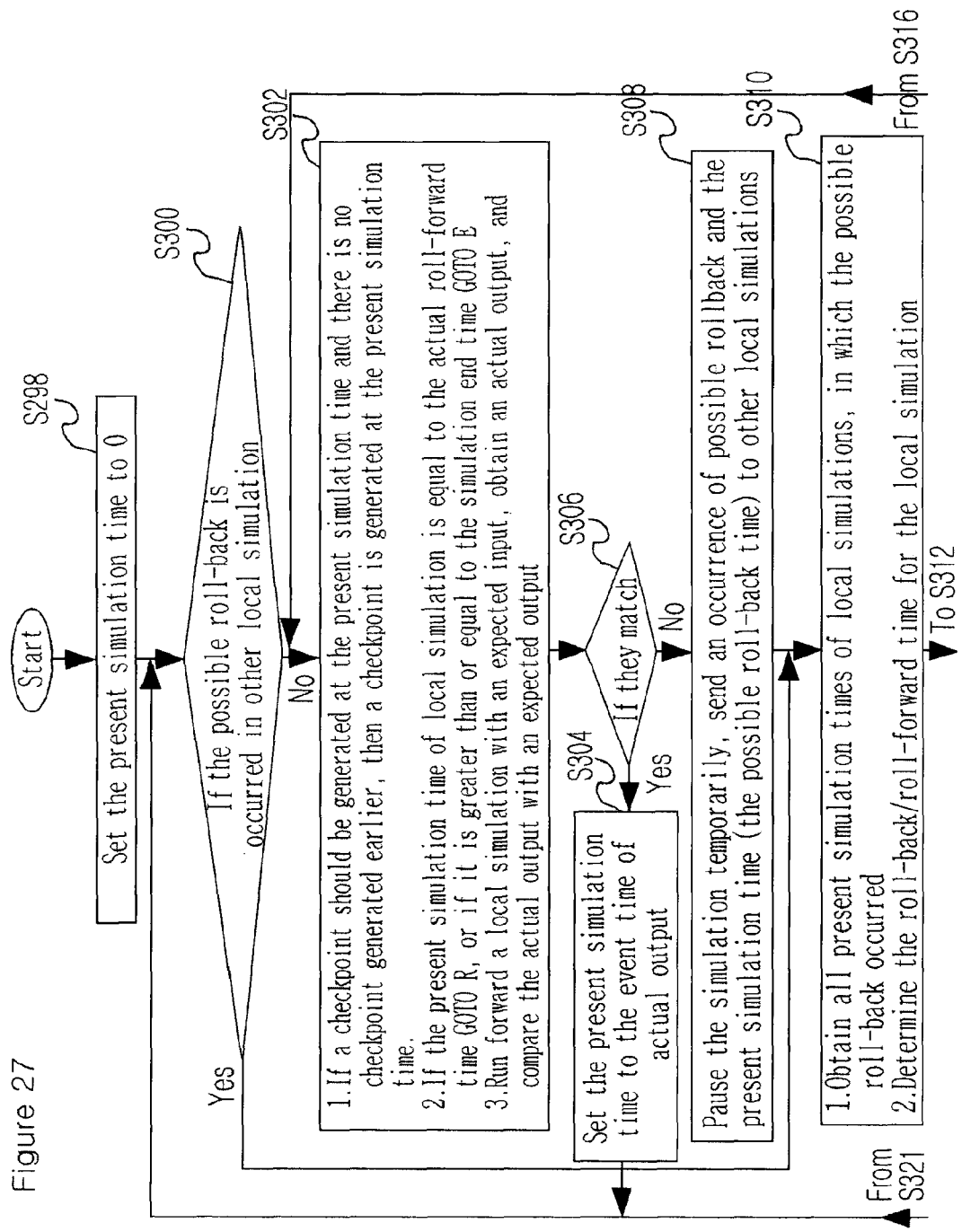

Figure 30

(a) Control module of run-with-expected-input&output/run-with-actual-input&output

```
module RUN_CONTROL()
{Initial
    state = run_with_expected_data_mode;
Initial_end;
process {
if each of all local simulations reaches the simulation_end_time, then STOP;
case(state){
    1: run_with_expected_data_mode
    {
    if(checkpoint_time())  generate a checkpoint;
    output a signal INPUT_SEL() so that INPUT_SEL() selects an expected input, and
    output a signal s-DCP_BOX() to obtain an expected input from s-DCP_BOX();
    control to perform a simulation run with an input and to get an output;
    if(the actual output is matched with the expected output)
        {output a signal INPUT_SEL() so that INPUT_SEL() selects an expected input and
        output a signal s-DCP_BOX to provide an expected input from s-DCP_BOX();
        control to perform a simulation run with the input and to get an output;}
    else
        {state = rollback_mode;
        current_simulation_time = get_current_simulation_time();
        output the current_simulation_time to COMM_SYNCH() as a possible_rollback_time;
        output a signal of the necessity of run_with_actual_data to COMM_SYNCH();}
    }
```

Figure 30 (continued)

```
2: run_with_actual_data_mode
{
    output a signal INPUT_SEL() so that INPUT_SEL() selects an actual input from
    COMM_SYNCH();
    control to perform a simulation run with an input and to get an output;
    output an actual output to COMM_SYNCH();
    if(INPUT_COMP())
        {state = run_with_expected_data_mode;
        output a signal of the possibility of run_with_expected_data to COMM_SYNCH();
        generate a checkpoint;}
}
3: rollback_mode
{
    get the rollback_time from COMM_SYNCH();
    if(rollback_time < current_simulation_time)
        {rollback(nearest_checkpoint)
        state = run_with_actual_data_mode;}
    elsif(rollback > current_simulation_time)
        state = rollforward_mode;
    else
        state = run_with_actual_data_mode;
}
4: rollforward_mode
{
    while(rollback_time = current_simulation_time)    rollfoward();
    state = run_with_actual_data_mode;
}
process_end;
}
```

Figure 31

(b) Selection module of expected –input/actual-input

```
module INPUT_SEL()
{
process{
if(state = run_with_actual_data_mode)
     input_sel_out = actual_input from COMM_SYNCH();
else input_sel_out = expected_input from S-DCP_BOX();}
}
```

(c) Compare module of expected –output/actual –output

```
module OUT_COMP()
{
process {
if(simulation_time is advanced)
  {if(state = run_with_expectedl_data_mode)
     {compare an actual_output and an expected_output;
      if(comparison is not equal)
         {possible_rollback_time = get_current_simulation_time();
          output a signal of match to RUN_CONTROL();
          output a signal of possible_rollback_time to COMM_SYNCH();}
      }
   }}
end_process;
}
```

Figure 31 (continued)

(d) Compare module of expected – input/actual-input

```
module IN_COMP()
{
initial
    count = 0;
end_initial;
process {
    if(simulation_time is advanced)
        {if(state = run_with_actual_data_mode)
            {compare an actual_input and an expected_input;
            if(comparison is equal) count = count + 1;    else  count = 0 ;
            if(count = threshold)  output a signal of match to RUN_CONTROL();
            }
        }
end_process;
}
```

(e) s-DCP generation/save module

```
module s-DCP_BOX()
{process{
    if(there is a request from RUN_CONTROL())
        {if(request is for expected_input)    provide an expected_input;
        if(request is for expected_output)   provide an expected_output;
        }
    }
}
```

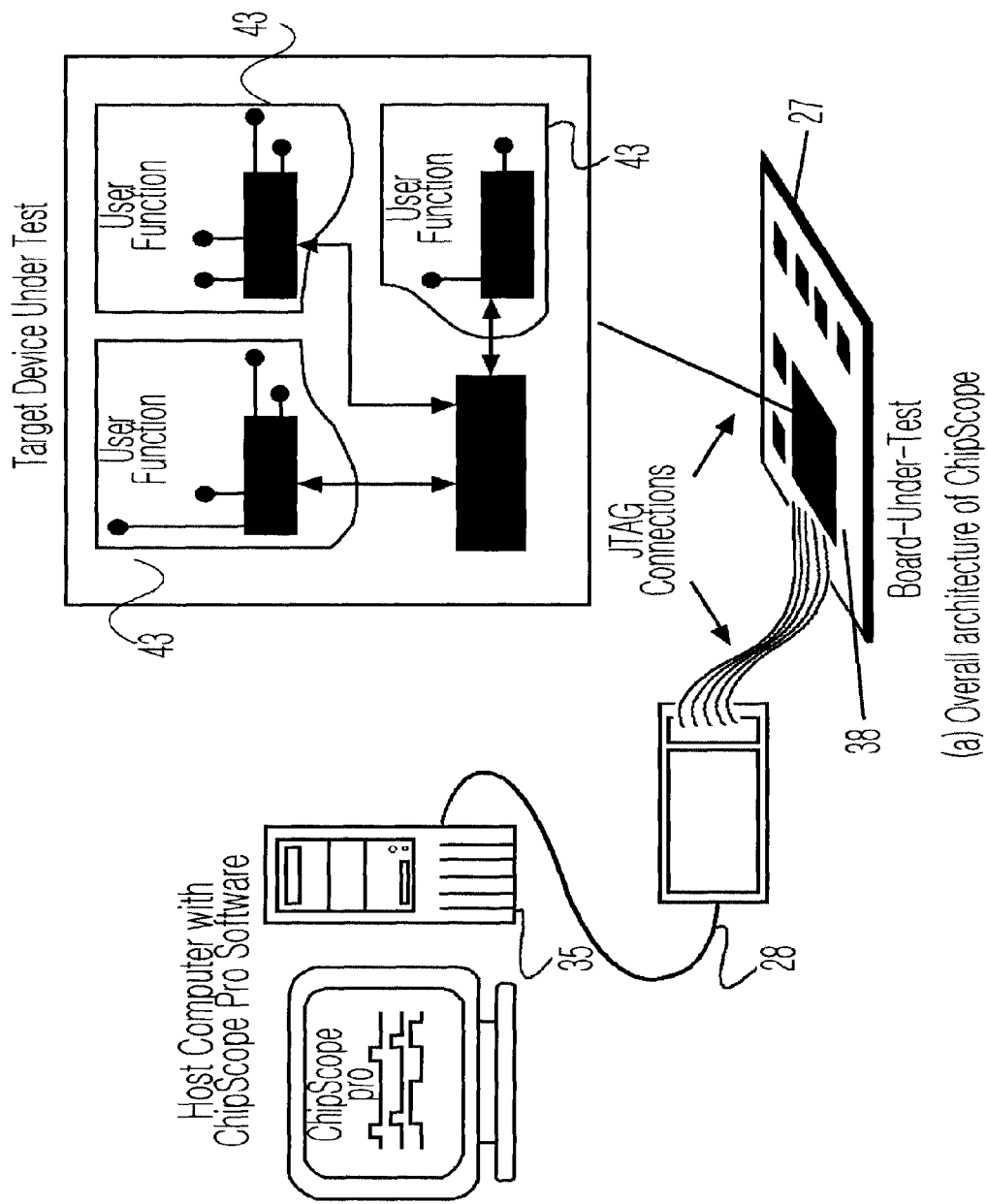

US 8,781,808 B2

PREDICTION-BASED DISTRIBUTED PARALLEL SIMULATION METHOD

CROSS-REFERENCE TO RELATED PATENT APPLICATIONS

This application is a continuation-in-part of application Ser. No. 12/089,665, filed Apr. 9, 2008, which is National Phase entry case of PCT Application PCT/KR2006/004059 filed on Oct. 10, 2006.

Also, this application claims the benefit of Korean Patent Application No. 10-2005-0095803, Korean Patent Application No. 10-2005-0098941, Korean Patent Application No. 10-2005-0122926, Korean Patent Application No. 10-2005-0126636, Korean Patent Application No. 10-2006-0006079, Korean Patent Application No. 10-2006-0019738, Korean Patent Application No. 10-2006-0037412, Korean Patent Application No. 10-2006-0038426, Korean Patent Application No. 10-2006-0043611, Korean Patent Application No. 10-2006-0048394, Korean Patent Application No. 10-2006-0068811, Korean Patent Application No. 10-2006-0092573, and Korean Patent Application No. 10-2006-0092574, filed in Korean Intellectual Property Office, the disclosure of which is incorporated herein in its entirety by reference.

BACKGROUND OF THE INVENTION (1) Field of the Invention

The present invention is to increase the verification performance and efficiency for systematically verifying digital systems with more than multi-million gates by using simulation and prototyping from Electronic System Level (ESL) down to Gate Level (GL) through Register Transfer Level (RTL).

(2) Description of the Related Art

In design verification, simulation is to build a pair of computer-executable models which consists of DUV (Design Under Verification) or one or more than one design object (to be defined later) inside of DUV, and TB (testbench) which drives it, to translate it into a sequence of machine instructions of a computer through a simulation compilation process, and to execute it on the computer. Therefore, simulation execution is basically accomplished by the sequential execution of machine instructions of a computer, and there are many simulation methods (event-driven simulation, cycle-driven simulation, cycle-based simulation, compiled simulation, interpreted simulation, co-simulation, algorithmic-level simulation, instruction-level simulation, transaction-level simulation, RTL simulation, gate-level simulation, transistor-level simulation, circuit-level simulation, etc). In other words, simulation represents a variety of processes in which DUV and TB, that are executable SW models built in a computer at a proper abstraction level (there are many abstraction level existed in IC design such as circuit-level, transistor-level, gate-level, RTL, transaction-level, instruction-level (if the design object is a processor), algorithmic-level, etc) by a modeling process, are executed in a computer to realize its functional specification or functional characteristic in SW. The advantage of simulation is to virtually evaluate the functional specification or functional characteristic of design object before the design objects is actually implemented and fabricated, to provide a high flexibility due to the SW nature, and to obtain high visibility and controllability on DUV or TB which is critical for debugging. But, its shortcoming is a low performance comes from the fact that the simulation execution is a sequential execution of machine instructions sequence. If the design complexity is large alike to the modern designs having 100 million or more gates, the simulation speed becomes extremely slow (for example, it will take 3.2 years to simulation an 100 million gates design for 100,000,000 cycles by an event-driven simulation whose speed is 1 cycle/sec). In this present invention, the simulation is defined as any SW modeling and SW execution method of DUV and TB at the proper abstraction level. More specifically, in this present invention, the simulation is defined as the process including implementing the behavior of DUV and TB at a specific abstraction level as a specific computer data structure and its well defined operations on it so that it is computer-executable, and performing a series of computations and processing of the operations on the data structure with input values in computer (Therefore, in this present invention, the simulation can be carried out by not only any commercial simulator, but also internally built simulators. Also, any process including a series of computation or processing the operations on the data structure with input values in computer is considered as the simulation if the process meets the above definition of simulation).

In contrast, the traditional prototyping is to build a system on PCB (Printed Circuit Board) by using manufactured semiconductor chips (for example, sample chips) or FPGA (Field Programmable Gate Array) chips, which implement DUV, and other components necessary to the construction of the entire system (in simulation, other components are modeled as TB), and to verify the DUV in either in-circuit or in-system environment while the entire system is running a real or almost real operation speed. If DUV and TB are not modeled virtually in SW, but physically implemented for verification, it is advantageous to verify at the extremely high speed. However, as in the prototyping environment the visibility and controllability are very low, the debugging is very difficult when it operates incorrectly.

The design size of digital circuits or digital systems are growing to tens of million or hundreds of million gates and their functionality is becoming very complex as the IC (Integrated Circuit) design and fabrication technology has been being developed rapidly. Especially, system-level ICs so called SOC (System On Chip) has usually one or more embedded processor cores (RISC core or DSP core, and specific examples are ARM11 core from ARM or Teak DSP core from CEVA), and the large part of its functionality is realized in SW. The reduction of design time is very critical to the related products success because of short time to market due to the growing competition in the market. Therefore, there is a growing interest from the industry about ESL design methodology for designing chips. Chips that are designed by using ESL design methodology, which exists at the higher level abstraction level than traditional RTL (Register Transfer Level), need the SW developments that drives them as well as the HW designs. Therefore, in recent development trend the Virtual Platform which is a SW model of a real HW (we will call it VP hereafter) is built as a system level model (ESL model) for architecture exploration, SW development, HW/SW co-verification, and system verification (whereas, traditional prototyping is a physical platform (we will call it PP hereafter)). VP can be also used as an executable specification, i.e. a golden reference model. As VP is made of at higher abstraction level, its development time is short. Also, it can be used to verify TB before DUV is available. VP also plays a critical role in platform-based design (PBS), which is widely adopted in SOC designs, because VP can be made of transaction-level on-chip bus models and other transaction-level component models (these are called TLM models), which can be simulated at much higher simulation speed (about 100 to 10,000 times faster than RTL model). Currently, there are many commercial tools for creating and executing VP, such as MaxSim from ARM, ConvergenSC from CoWare, Incisive from Cadence, VisualElite from Summit Design, VSP from Vast Systems Technology, SystemStudio from Synopsys, Platform Express from Mentor Graphics, VTOC from TenisonEDA, VSP from Carbon Design Systems, VirtualPlatform from Virutech, etc. Therefore, VP can provide many benefits in SOC designs. In SOC designs, as the most important factor of VP is its fast execution speed suitable to develop some softwares, it is modeled not at RTL using Verilog or VHDL, but at higher abstraction level such as transaction-level or algorithmic-level using SystemC or C/C++. The abstraction level, which is the most important concept in system-level designs, is the level of the representation detail of corresponding design object (explained in detail later). Digital systems can be classified into layout-level, transistor-level, gate-level, RTL, transaction-level, algorithmic-level, etc from the low level of abstraction to the high level of abstraction. That is, gate-level is a lower abstraction than RTL, RTL is a lower abstraction than transaction-level, and transaction-level is a lower abstraction than algorithmic-level. Therefore, if the abstraction level of a specific design object A is transaction-level and its abstraction level of a design object B refined from A is RTL, then it is defined design object A is at higher level of abstraction than design object B. Also, if a design object X has design objects A and C, and a design object Y has design objects B, which is a refined design object from A, and C, it is defined design object X is at higher level of abstraction than design object Y. Moreover, the accuracy of delay model determines the level of abstraction at same gate level or same RTL. That is, even though there are at same gate-level, the net-list with zero-delay model is at higher abstraction than the net-list with unit-delay model, and the net-list with unit-delay model is at higher abstraction than the net-list with full timing model using SDF (Standard Delay Format). Recent SOC designs can be thought as a progressive refinement process of an initial design object, which must be implemented as a chip eventually, from the initial abstraction level, e.g. transaction-level, to the final abstraction level, e.g. gate-level (refer FIG. 14). The core of design methodology using progressive refinement process is to refine the design blocks progressively existed inside a design object MODEL_DUV(HIGH) modeled at high level of abstraction so that a refined design object MODEL_DUV(LOW) modeled at low level of abstraction is obtained automatically (for example, through logic synthesis or high-level synthesis), manually, or by both. As a detailed example, in the refinement process of ESL to RTL, which is to get an implementable RTL model from an ESL model (this process is currently carried out by human, high-level synthesis, or both), the ESL model is MODEL_DUV(HIGH) and the implementable RTL model is MODEL_DUV(LOW), and in the refinement process of RTL to GL (Gate Level), which is to get a GL model, i.e. gate-level netlist, from an implementable RTL model (this process is currently carried out by logic synthesis), the RTL model is MODEL_DUV(HIGH) and the GL model is MODEL_DUV(LOW). The GL model can become a timing accurate GL model if the delay information in SDF (Standard Delay Format), which is extracted from the placement and routing, is back-annotated.

There is one thing to mention. It is not absolutely necessary for an ESL model that all design objects in the model are at system level. This is also true for a RTL model. In an ESL model, it is possible that a few design objects are at RTL and they are surrounded by the abstraction wrappers which make the abstraction of the RTL objects same as the other ESL objects. Also, in an RTL model, it is possible that a few design objects are at GL and they are surrounded by the abstraction wrappers which make the abstraction of the GL objects same as the other RTL objects. At the same reason, in a GL model a few design objects, e.g. memory block which is not produced a net-list at gate-level by logic synthesis, can be at RTL. Therefore, in this present invention "a model at the specific level of abstraction" is a model at any level of abstraction (not only ESL, RTL, and GL, but also any mixed levels of abstraction such as a mixed level of ESL/RTL, a mixed level of RTL/GL, a mixed level of ESL/RTL/GL, etc) that can be existed in a refinement process from ESL to GL. Also, the "abstraction level" includes not only ESL, RTL, and GL, but also any mixed levels of abstraction such as a mixed level of ESL/RTL, a mixed level of RTL/GL, a mixed level of ESL/RTL/GL, etc. For example, if a DUV consists of four design objects, A, B, C, and D, A and B are at ESL, C is at RTL, and D is at GL, the DUV is a mixed ESL/RTL/GL model of abstraction and can be called a model at the specific level of abstraction (Also, it is possible to be called a model at mixed ESL/RTL/GL of abstraction). From now on, we will call a model at mixed levels of abstraction if we must clearly mention that the model is represented at the mixed levels of abstraction (Arbitrary design object, such as DUV or TB, can be called a model, but if there is no specific mention, a model is defined as a design object including DUV (Design Under Verification) and TB (Testbench)).

Transaction, which is the most important concept at ESL, represents an information that is defined over logically related multiple signals or pins as a single unit, and uses function calls to communicate among design objects. By contrast, the information on the signals or pins at RTL is represented by bit or bit vector only. Transaction can be defined cycle by cycle (we'll call this type of transaction cycle-accurate transaction, and ca-transaction in short), over multiple cycles (we'll call this type of transaction timed transaction, cycle-count transaction, or PV-T transaction and timed-transaction in short), or without the concept of cycles (we'll call this type of transaction untimed-transaction in short). The timed-transaction is represented by Transaction_name (start_time, end_time, other_attributes. In fact, there is no standard definition about transaction, but it is mostly general to define and classify into untimed-transaction, timed-transaction, and ca-transaction explained above. Within the transaction, untimed-transaction is at the highest level of abstraction, but the least accurate in timing, and ca-transaction is at the lowest level of abstraction, but the most accurate in timing. Timed-transaction is at between.

The refinement process is incremental so that the design objects at TL (Transaction-level) in VP are progressively refined into the design objects at RTL which have at least signal-level cycle accuracy. At the end of the transformation, design objects at TL are translated into design objects ar RTL, therefore the transaction-level VP is refined into the implementable RTL model. Also, the design objects at RTL (Transaction-level) in the RTL model are progressively refined into the design objects at GL which have at least signal-level timing accuracy. At the end of the transformation, design objects at RTL are translated into design objects ar GL, therefore the RTL model is refined into an GL model. FIG. 14 shows the example of the refinement process explained above.

There are two objects to be designed in SOC designs, the first is DUV (Design Under Verification) and the second is TB (Testbench). DUV is the design entity that should be manufactured as chip, and TB is a SW model which represents an environment in which the chip is mounted and operated. TB is for simulating DUV. During the simulation, it is general TB provides stimuli to DUV, and processes the output from DUV.

In general, DUV and TB has a hierarchy so that there may be one or more lower modules at inside, each of these lower module can be called design block. In a design block there may be one or more design modules inside, and a design module there may be one or more submodules inside. In this present invention, we will call any of design blocks, design modules, submodules, DUV, TB, some part of design blocks, design modules, submodules, DUV, or TB, or any combination of design blocks, design modules, submodules, DUV, and TB, "design object" (For example, any module or part of the module in Verilog is a design object, any entity or part of the entity in VHDL is a design object, or any sc_module or part of the sc_module in SystemC is a design object). Therefore, VP can be seen as a design object. So are the part of VP, one or more design blocks in VP, the part of a design block, some design modules in a design block, some submodules in a design module, the part of a design block, the part of a submodule, etc. (In short, entire DUV and TB, or some part of DUV and TB can be seen as design object).

In the design process using progressive refinement the simulation at high level of abstraction can be run fast, but the simulation at low level of abstraction is relatively slow. Therefore, the simulation speed decreases dramatically as the refinement process goes down to lower level of abstraction. Contrast to the conventional single simulation (in this present invention, the definition of single simulation includes not only using one simulators, but also using more than one simulators, e.g. using one Verilog simulator and one Vera simulator, and running these simulators on a single CPU), there is a distributed parallel simulation method using two or more simulators for increasing the simulation speed. The examples of the simulator are HDL (Hardware Description Language) simulators (such as NC-Verilog/Verilog-XL and X-sim from Cadence, VCS from Synopsys, ModelSim from Mentor, Riviera/Active-HDL from Aldec, FinSim from Fintronic, etc), HVL (Hardware Verification Language) simulators (such as e simulator from Cadence, Vera simulator from Synopsys, etc), SDL (System Description Language) simulators (e.g. SystemC simulator such as Incisive simulator from Cadence, etc), and ISS (Instruction-Set Simulator)(such as ARM RealView Development Suite Instruction Set Simulator, etc). For another classification, there are event-driven simulators or cycle-based simulator. The simulators in this present invention include any of these simulators. Therefore, when two or more simulators use in this present invention, each of simulators can be any of simulators mentioned above. Distributed parallel simulation (or parallel distributed simulation, or parallel simulation in short), which is to perform a simulation in a distributed processing environment, is the most general parallel simulation technique, in which DUV and TB, i.e. a model at specific level of abstraction, are partitioned into two or more design objects, and each of design objects is distributed into a simulator and executed on it (see FIG. 5). Therefore, the distributed parallel simulation requires the partitioning step at which divides a simulation model into two or more design objects. In this present invention, we will call the design object that should be executed in a specific local simulation (to be defined later) through the partition a "local design object".

Recently, distributed parallel simulation can be possible by connecting two or more computers with a high speed computer network such as giga-bit ethernet and running a simulator on each computer, or using multiprocessor-computer which has two or more CPU cores (in this present invention, local simulation is the simulation executed by each of those simulators that is called a local simulator in the distributed parallel simulation). However, the performance of traditional distributed parallel simulation severely suffer from the communication and synchronization overhead among local simulators. Therefore, two basic methods are known for synchronization, one conservative (or pessimistic) the other optimistic. The conservative synchronization guarantees the causality relation among simulation events so that these is no need to roll-back, but the speed of distributed parallel simulation is dictated by the slowest local simulation and these is too much synchronizations. The optimistic synchronization temporally allows the violation of the causality relation, but corrects it later by roll-back so that the reduction of roll-backs is very critical for the simulation speed. But, because current distributed parallel simulation using optimistic synchronization does not consider to minimize the roll-back by maximizing the simulation periods when a local simulation does not require any synchronization with other local simulations, the simulation performance degrades significantly due to the excessive roll-backs. Distributed parallel simulation using conventional optimistic approach and one using conventional pessimistic approach are well known in many documents and papers, therefore the detailed explanation is omitted in this present invention. One more thing to mention is it is desirable to have same number of processors in a distributed parallel simulation as the number of local simulations for maximizing the simulation performance, but it is still possible to perform a distributed parallel simulation as long as there are two or more processors available even though the number of local simulation is larger than that of processors. In summary, the synchronization and communication methods for both optimistic approach and pessimistic approach greatly limit the performance of distributed parallel simulation using two or more simulators.

Moreover, during the progressive refinement process it is very important to maintain the model consistency between a model at high level of abstraction and a model at low level of abstraction because the model at high level of abstraction serves as a reference model for the model at low level of abstraction. However, in the current progressive refinement process there is no efficient method to maintain the model consistency between two models existing at two different abstraction levels.

Moreover, as there is no systematic method in the debugging process in which the design errors are identified and removed in the design process using the progressive refinement, the large amount of time must be consumed.

PRIOR ART DOCUMENTS

Korean Laid-open Patent Publication No. 10-2006-0066634 which corresponds to Korean Patent Application No. 10-2005-116706
Korean Laid-open Patent Publication No. 10-0921314 which corresponds to Korean Patent Application No. 10-2004-93310
Korean Laid-open Patent Publication No. 10-2001-0057800
Japanese Laid-open Patent Publication No, JP2001-256267
U.S. Pat. No. 6,182,247
U.S. Pat. No. 6,247,147
U.S. Pat. No. 6,286,114
U.S. Pat. No. 6,389,558
U.S. Pat. No. 6,460,148
U.S. Pat. No. 6,704,889
U.S. Pat. No. 6,760,898
U.S. Pat. No. 6,826,717
U.S. Pat. No. 7,036,046
U.S. Pat. No. 6,345,240
U.S. Pat. No. 5,801,938
U.S. Pat. No. 6,701,491

SUMMARY OF THE INVENTION

(1) Technical Problem

The object of present invention is to provide a systematic verification method through the progressive refinement from the system level to the gate level.

Another object of present invention is to provide a systematic verification method which can solve the degradation of verification performance as the progressive refinement goes down to the low level of abstraction.

Still, another object of present invention is to allow the entire design and verification process using progressive refinement from the high level of abstraction to the low level of abstraction in a systematic and automatic way.

Still, another object of present invention is to provide a verification method in which the model consistency is effectively maintained among two or more models existed at different levels of abstraction.

Still, another object of present invention is to provide an efficient verification method through progressive refinement, in which a model at the low level of abstraction is efficiently verified using a model at the high level of abstraction as a reference model.

Still, another object of present invention is to provide a method for increasing the speed of distributed parallel simulation by eliminating synchronization overhead and communication overhead.

Still, another object of present invention is to provide a systematic and consistent fast debugging method for correcting design errors (these design errors are not only HW design errors, but also SW design errors) in the entire verification phase from simulation-based verification to physical prototype-based verification.

Still, another object of present invention is to provide a high visibility and controllability throughout virtual prototypes or simulators for debugging the incorrect behavior of physical prototype in which DUV is operated in the in-circuit or in-system environment where DUV has one or more user clocks (in the case of two or more user clocks, these are asynchronous with no phase relation).

In the design verification of complex system-level designs such as embedded systems, the verification includes not only HW-centric verification, but also SW-centric verification so that it must be a system-level design verification. Therefore, in the present invention, the design verification covers not only traditional HW verification, but also HW/SW co-verification verifying SW as well as HW.

(2) Technical Solution

According to an embodiment of the present invention, a distributed parallel simulation method for a predetermined model which has a specific abstraction level comprising:

(a) obtaining expected inputs and expected outputs for at least one local simulation among a plurality of local simulations in the distributed parallel simulation for the predetermined model, wherein the local simulation is defined as each of simulations for local design objects in case of executing a parallel simulation by spatially dividing the predetermined model into a plurality of local design objects; and (b) executing said at least one local simulation in the distribution parallel simulation for the predetermined model by using the expected inputs and the expected outputs, for at least a part of entire simulation time period.

An example of this embodiment is shown in FIGS. 6, 7, and so on. Also, an example of flow chart of a distributed parallel simulation is shown in FIG. 24.

More preferably, the step (b) comprises:

(c1) determining whether said at least one local simulation among the plurality of local simulations can be executed independently with other local simulations by using the expected inputs and the expected outputs while omitting a communication and a synchronization with other local simulations; and (c2) executing said at least one local simulation independently with other local simulations if it is determined that said at least one local simulation can be independently executed in the step (c1), or executing said at least one local simulation by using actual inputs which are obtained through the communication and the synchronization with the other local simulations if it is determined that said at least one local simulation cannot be independently executed in the step (c1).

An example of this embodiment is shown in FIGS. 6, 7, and so on.

More preferably, the step (b) comprises:

(d1) determining whether the actual outputs match with the expected outputs obtained in the step (a), wherein said actual outputs are outputs obtained from an execution in which said at least one local simulation among the plurality of local simulations is executed independently with other local simulations by using the expected inputs as inputs of simulation for local design object corresponding to the local simulation while omitting a communication and a synchronization with other local simulations; and (d2) if it is determined that the actual outputs do not match with the expected outputs in the step (d1), executing at least one local simulation among the plurality of local simulations by using the actual inputs as inputs of simulation for local design object corresponding to the local simulation, wherein the actual inputs are inputs obtained from an execution in which the at least one local simulation is executed while performing a communication and a synchronization with other local simulations.

Flow charts for this embodiment are shown in FIG. 25.

More preferably, through the step (b), at least one local simulation among said plurality of local simulations is executed while performing at least one checkpoint, the checkpoint being performed for roll-back which can happen in the future, wherein the step (b) comprises:

(e1) determining whether the actual outputs match with the expected outputs obtained in the step (a), wherein the actual outputs are outputs obtained from an execution in which said at least one local simulation among the plurality of local simulations is executed independently with other local simulations by using the expected inputs as inputs of simulation for local design object corresponding to the local simulation while omitting a communication and a synchronization with other local simulations;

(e2) if the actual outputs do not match with the expected outputs in the step (e1), informing other local simulations of an occurrence of mismatch and a corresponding simulation time at which the mismatch occurred, (e3) in each of the local simulations, determining whether the roll-back is needed by comparing the corresponding simulation time informed by the local simulation in which the mismatch occurred in the step (e2) to a current simulation time, and performing the roll-back if it is determined that the roll-back is needed, and (e4) executing at least one local simulation among said plurality of local simulations by using the actual inputs as inputs of simulation for local design object corresponding to the local simulation, wherein the actual inputs are inputs obtained from an execution in which the at least one local simulation is executed while performing a communication and a synchronization with other local simulations.

An example of checkpointing shown in FIG. 12 as X marks. Also, flow charts for this embodiment are shown in FIGS. 26-29, especially FIGS. 26 and 27.

More preferably, the step (b) comprises:

(f1) determining whether the actual outputs match with the expected outputs obtained in the step (a), wherein the actual outputs are outputs obtained from an execution in which said at least one local simulation among the plurality of local simulations is executed by using the expected inputs as inputs of simulation for local design object corresponding to the local simulation while omitting a communication and a synchronization with other local simulations;

(f2) if the actual outputs do not match with the expected outputs in the step (f1), informing other local simulations of an occurrence of mismatch and a corresponding simulation time t_d at which the mismatch occurred, (f3) in each of the local simulations, comparing the corresponding simulation time t_d, which is informed by the local simulation in which the mismatch occurred in the step (f2), to a current simulation time t_d of each of local simulations, (f4) setting the current simulation time of every local simulation identical by either determining that a roll-back is needed if the time t_c is later than the time t_d (i.e., t_c>t_d) and performing a roll-back, or determining that a roll-forward is needed if the time t_c is earlier than the time t_d (i.e., t_c<t_d) and performing a roll-forward, and (f5) executing every local simulation by using actual inputs as inputs of simulation for local design object corresponding to the local simulation, wherein the actual inputs are inputs obtained from an execution in which the every local simulation is executed while performing a communication and a synchronization with other local simulations.

Flow charts for this embodiment are shown in FIGS. 26-29, especially FIGS. 26 and 27.

More preferably, the step (b) comprises:

(g1) determining whether the actual outputs match with the expected outputs obtained in the step (a), wherein the actual outputs are outputs obtained from an execution in which said at least one local simulation among the plurality of local simulations is executed by using said actual inputs, which is obtained through a communication and a synchronization with other local simulations, as inputs of simulation for local design object corresponding to the local simulation; and (g2) executing said at least one local simulation among the plurality of local simulations by using again the expected inputs and the expected outputs of the step (a) from a specific time point while omitting a communication and a synchronization with other local simulations, wherein the specific time point is when the actual outputs match with the expected outputs at least for a predetermined times.

Flow charts for this embodiment are shown in FIGS. 26-29. An example of the predetermined times is three times. For the details, please refer to the description on FIGS. 26 and 28.

More preferably, the step of obtaining the expected inputs and the expected outputs for said at least one local simulation is achieved by:

while executing the distributed parallel simulation for the predetermined model which has the specific abstraction level, in said at least one local simulation, simultaneously simulating a first model and a local design object corresponding to the local simulation, wherein the first model is same to the predetermined model except that an abstraction level of the first model is higher than an abstraction level of the predetermined model.

An example of abstraction levels are shown in FIG. 13. Also, this embodiment relates to FIG. 12.

More preferably, the step of obtaining the expected inputs and the expected outputs for said at least one local simulation comprises:

prior to execution of the distributed parallel simulation for the predetermined model which has the specific abstraction level, while performing a simulation with a first model which is same to the predetermined model except that an abstraction level of the first model is higher than an abstraction level of the predetermined model, storing input information and output information for at least one design object which exist in the first model.

An example of abstraction levels are shown in FIG. 13. Also, this embodiment relates to FIG. 12.

More preferably, the abstraction level of said first model is RTL (Register Transfer Level) or mixed level of RTL and GL (Gate level) if said specific abstraction level of said predetermined model is GL (Gate Level), or wherein the abstraction level of said first model is ESL (Electronic System Level) or mixed level of ESL and RTL if said specific abstraction level of said predetermined model is RTL.

An example of abstraction levels are shown in FIG. 13. This is simply an example, and the abstraction level is not limited thereto. Also, a combination of the abstraction levels are possible.

(3) Advantageous Effects

As already explained, an advantageous effect of present invention is to reduce the total verification time and increase the verification efficiency by executing the verification for a model at lower level of abstraction fast by using the simulation result of a model at higher level of abstraction when a complex design start at ESL.

Another advantageous effect of present invention is to provide a systematic verification method through the progressive refinement from the system level to the gate level such that the high execution speed and 100% visibility are provided from simulation-based verification to physical-prototype-based verification.

Still, another advantageous effect of present invention is to provide a systematic verification method which can solve the degradation of verification performance as the progressive refinement goes down to the low level of abstraction.

Still, another advantageous effect of present invention is to allow the entire design and verification process using progressive refinement from the high level of abstraction to the low level of abstraction in a systematic and automatic way.

Still, another advantageous effect of present invention is to provide a verification method in which the model consistency is effectively maintained among two or more models existed at different levels of abstraction.

Still, another advantageous effect of present invention is to provide an efficient verification method through progressive refinement, in which a model at the low level of abstraction is efficiently verified using a model at the high level of abstraction as a reference model.

Still, another advantageous effect of present invention is to provide a method for increasing the speed of distributed parallel simulation by eliminating synchronization overhead and communication overhead.

Still, another advantageous effect of present invention is to provide a systematic and consistent fast debugging method for correcting design errors in the entire verification phase from simulation-based verification to physical prototype-based verification.

Still, another advantageous effect of present invention is to provide a high visibility and controllability throughout virtual prototypes or simulators for debugging the incorrect behavior of physical prototype in which DUV is operated in the in-circuit or in-system environment where DUV has one or more user clocks.

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims.

BRIEF DESCRIPTION OF THE DRAWINGS

FIG. 6 is a schematic diagram of an example of the execution of a time-sliced parallel simulation, where t-DCP is obtained at the front-end simulation with a model of higher level of abstraction, and back-end simulation is executed in temporally parallel.

FIG. 10 is a schematic diagram of an example showing design objects in the ESL model and its corresponding design objects in the RTL model depicted in FIG. 3.

FIG. 12 is a schematic diagram of an example of an execution of a distributed-processing-based parallel simulation with a RTL model as back-end simulation by using the design state information collected at one or more simulation times and periods when six independent parallel front-end simulations with six mixed design objects DO_t_mixed(1), DO_t_mixed(2), . . . , DO_t_mixed(6) depicted in FIG. 11 are being executed.

FIG. 16 is a schematic diagram of an example of a part of a model for the simulation method in this present invention.

FIG. 17 is a schematic diagram of an example of a part of the instrumentation code added to the model partially depicted in FIG. 16 for a distributed-processing-based parallel simulation by the verification software in this present invention.

FIG. 18 is a schematic diagram of an example of another part of the instrumentation code added to the model partially depicted in FIG. 16 for a distributed-processing-based parallel simulation by the verification software in this present invention.

FIG. 19 is a schematic diagram of an example of another part of the instrumentation code added to the model partially depicted in FIG. 16 for a distributed-processing-based parallel simulation by the verification software in this present invention.

FIG. 20 is a schematic diagram of an example of a combined method of distributed-processing-based parallel execution/singular execution.

FIG. 22 is a schematic diagram of an example of logical connection topology among two or more local simulators installed in two or more computers for a distributed-processing-based parallel simulation in this present invention.

FIG. 30 is a schematic diagram of an example of pseudo code for the behavior of some components in FIG. 8.

FIG. 31 is a schematic diagram of an example of pseudo code for the behavior of the other components in FIG. 8.

EXPLANATION OF SYMBOL NUMBERS IN THE FIGURES

Figure 1:
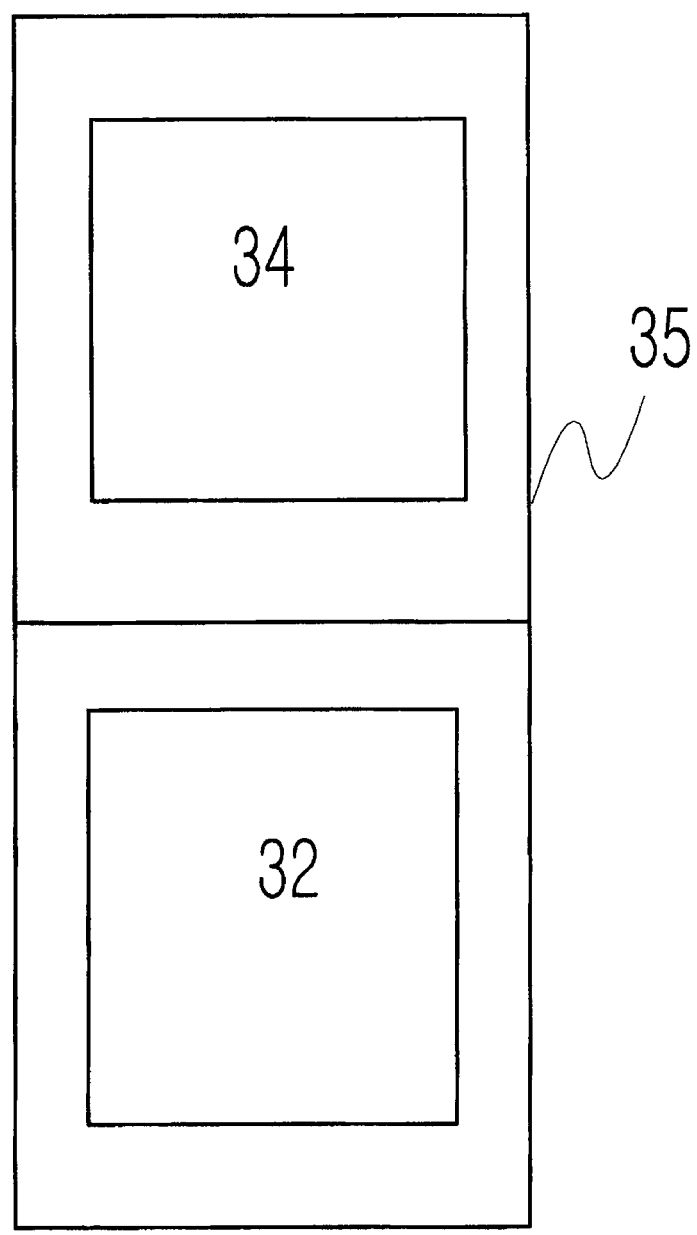
FIG. 1 is a schematic diagram of an example of the design verification apparatus in this present invention.

32: Verification software
34: HDL simulator
35: Computer
37: ESL model
38: Design object for design block
39: Design objects for design module
40: RTL model
42: On-chip bus
50: Expected input
52: Expected output
53: Design object containing DUV and TB at higher level of abstraction
54: Control module of run-with-expected-input&output/run-with-actual-input&output
56: Selection module of expected-input/actual-input
58: Compare module of expected-output/actual-output
59: Compare module of expected-input/actual-input
60: s-DCP generation/save module
62: Instrumentation code added to a design under verification by the verification software
64: Communication and synchronization module for distributed parallel simulation
333: SW server module existed in a central computer, which is responsible for controlling and connecting the local simulations of distributed parallel simulation in the star connection topology
343: Simulator executing a local simulation in an environment of distributed parallel simulation
353: central computer
354: peripheral computer
370: GL model
380: A specific design object in a RTL model
381: Another specific design object in a RTL model
382: Still another specific design object in a RTL model
383: Still another specific design object in a RTL model
384: Still another specific design object in a RTL model
385: Still another specific design object in a RTL model
387: Design object representing a design module existed in a GL model, but not in a RTL model
404: A part of a model for design verification executed in a local simulator
420: On-chip bus design object including a bus arbiter and an address decoder in a RTL model
606: s-DCP save buffer
644: Local simulation run-time module for distributed parallel simulation
646: Communication and synchronization module for simulation acceleration
648: Hardware-based verification platform
650: Simulation acceleration run-time module
660: Design object in a model partitioned to be executed in a local simulator of distributed parallel simulation
670: VPI/PLI/FLI
674: Socket API
676: TCP/IP socket
678: Device API
680: Device Driver
682: HAL (Hardware Abstraction Layer)
684: Giga-bit LAN card
827: Target board
828: Debugging interface cable
832: In-circuit/in-system debugging software
834: HDL simulator
835: Computer
838: FPGA or non-memory IC chip
840: Other devices on board
842: DUV
843: Design object
844: Trigger module
846: CAPTURE_VIRTEX primitive module
848: Flipflop or latch in a design object that requires 100% visibility
850: Parallel-load/serial-scanout register
852: Parallel-load register
854: Two-level parallel-load/serial-scanout register
855: Model checker
856: Interface between a target board and a computer
857: Software executed in a server computer in simulation acceleration mode/mixed simulation acceleration mode
858: Design block implemented in an FPGA
860: Computer network
868: Transactor
880: State information and input information saving and obtaining controller including a controller for loading time of a two-level parallel-load/serial-scanout register
882: Clock domain of user clock 1 in a two-level parallel-load/serial-scanout register

884: Clock domain of user clock 2 in a two-level parallel-load/serial-scanout register

886: Clock domain of user clock m in a two-level parallel-load/serial-scanout register

890: State information and input information saving and obtaining controller including a controller for loading time of a parallel-load register

892: Clock domain of user clock 1 in a parallel-load register

894: Clock domain of user clock 2 in a parallel-load register

896: Clock domain of user clock m in a parallel-load register

900: State information and input information saving and obtaining controller including a controller for loading time of a parallel-load register with a single clock

902: Instrumentation circuit for debugging, or instrumentation code for debugging

904: Embedded memory for saving the input information

906: Two-level parallel-load/serial-scanout register

908: Serial-scanout register of two-level parallel-load/serial-scanout register

910: Binary counter

912: Control FSM for saving and obtaining the state information and input information

914: JTAG macro

DETAILED DESCRIPTION OF THE INVENTION

The accompanying drawings, which are included to provide a further understanding of the invention and which constitute a part of the specification, illustrate embodiments of the invention and together with the description serve to explain the principles of the invention.

FIG. 1 is a schematic diagram of an example of the design verification apparatus in this present invention.

In FIG. 1, reference numeral 32 denotes verification software, reference numeral 34 denotes HDL simulator, and reference numeral 35 denotes computer.

Figure 2:
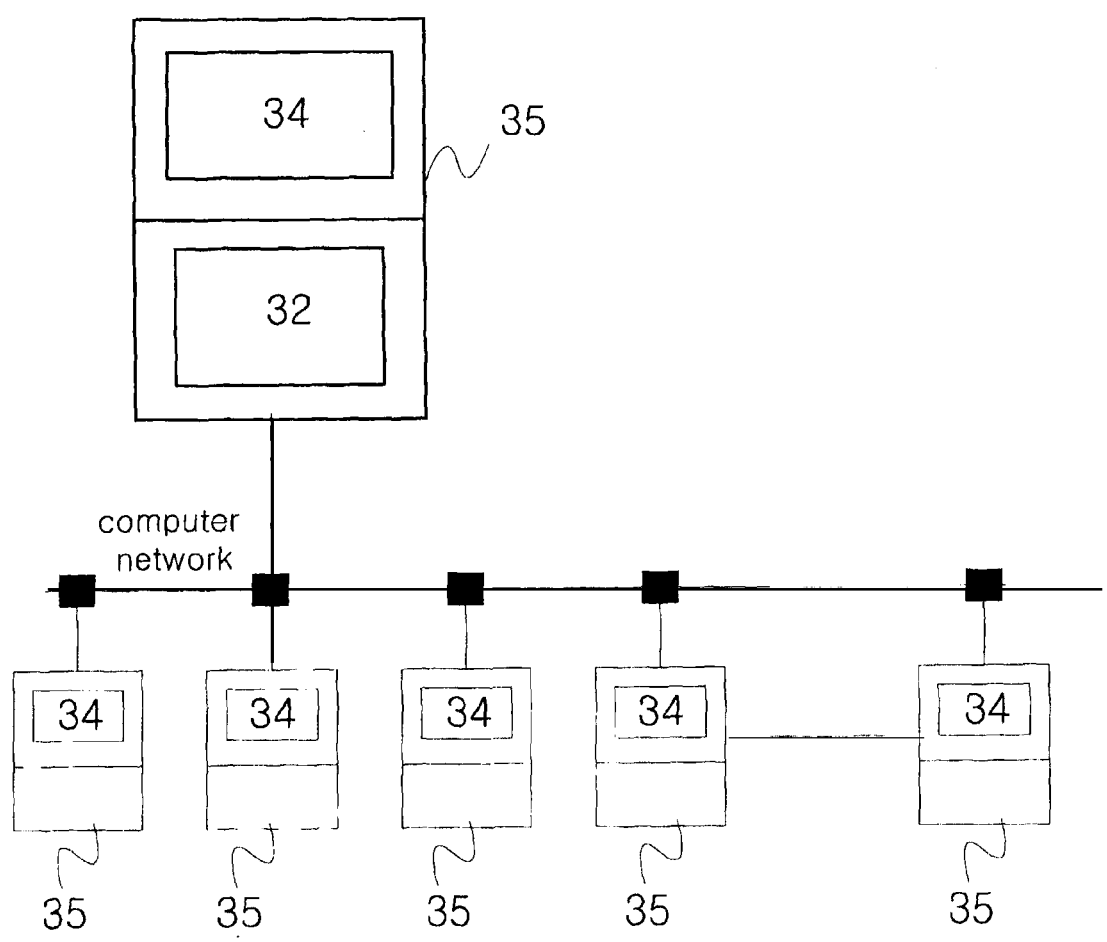
FIG. 2 is another schematic diagram of an example of the design verification apparatus in this present invention.

FIG. 2 is another schematic diagram of an example of the design verification apparatus in this present invention.

In FIG. 2, a plurality of computers 35 are connected to computer network.

Figure 3:
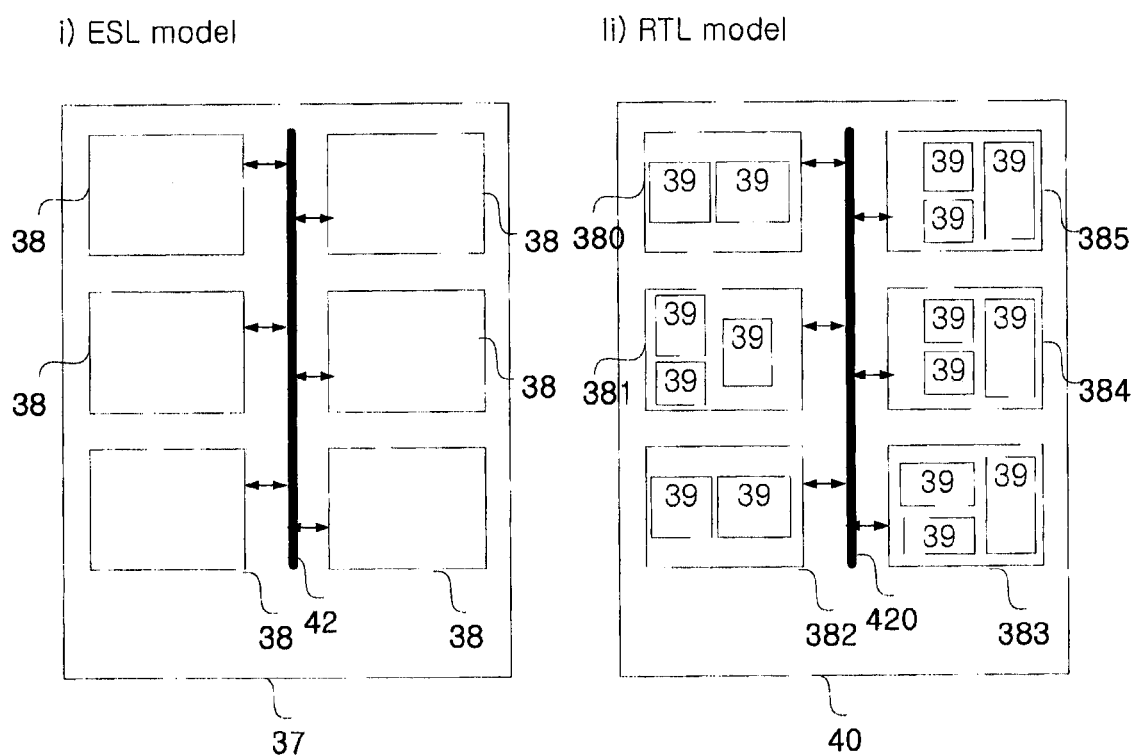
FIG. 3 is a schematic diagram of an example of the hierarchy of an ESL model and its corresponding hierarchy of a RTL model.

FIG. 3 is a schematic diagram of an example of the hierarchy of an ESL model and its corresponding hierarchy of a RTL model.

The design verification apparatus that can be used for applying the design verification method in the present invention can be consisted of a verification software 32, and one or more computers 35, which install one or more simulators 34. Another design verification apparatus that can be used for applying the design verification method in the present invention can be consisted of a verification software, one or more computers, which install one or more simulators, and one or more simulation accelerators (FPGA boards having simulation acceleration capability are seen as the simulation accelerator), hardware emulators, or physical prototyping boards having one or more FPGA chips or ASIC chips (hereafter, prototyping board in short). We will call simulation accelerators, hardware emulators, and prototyping boards as hardware-based verification platforms. The verification software is running on the computer, and if there are 2 or more computers, then they are connected by a network (for example, Internet or giga-bit ethernet) so that the files or data are transferred among them through the network. One or more simulators for design verification can be consisted of various simulators mentioned before. For example, they can be made of event-driven simulators only (in this case, the distributed parallel simulation becomes PDES (Parallel Discrete Event Simulation)), cycle-based simulators and event-driven simulators, cycle-based simulators and transaction-based simulators, transaction-based simulators only, event-driven simulators and transaction-based simulators, event-driven simulators and cycle-based simulators and transaction-based simulators, instruction-level simulators and event-driven simulators, instruction-level simulators and cycle-based simulators, instruction-level simulators and event-driven simulators and cycle-based simulator, etc. If said two or more simulators consist of event-driven simulators and cycle-based simulators, the distributed parallel simulation runs in co-simulation mode such a way that some design objects are run by event-driven simulation and other design objects are run by cycle-based simulation. Or, said two or more simulators consist of event-driven simulators, cycle-based simulators, and transaction-based simulators, the distributed parallel simulation runs in co-simulation mode such a way that some design objects are run by event-driven simulation, some other design objects are run by cycle-based simulation, and remaining design objects are run by transaction-based simulation. In other words, the distributed parallel simulation runs in co-simulation mode if said two or more simulators consist of different kinds of simulators. Moreover, one or more hardware-based verification platforms can be used together with different kinds of simulators in the distributed parallel simulation for running in co-simulation mode (In this case, we will call this co-simulation too even though it can be also called co-emulation).

In FIG. 3, ESL model 37 and RTL model 40 are shown.

In case of ESL model 37, design object for design block 38 are connected to on-chip bus 42.

In case of RTL model 40, design objects for design module 39 is shown. Another specific design object 381 in a RTL model, still another specific design object 382 in a RTL model, still another specific design object 383 in a RTL model, still another specific design object 384 in a RTL model, and still another specific design object 385 in a RTL model are shown. Each of specific design objects 381, 382, 383, 384, 385 consists of design objects 39 for design module. Reference numeral 420 denotes on-chip bus design object including a bus arbiter and an address decoder in a RTL model.

Figure 4:
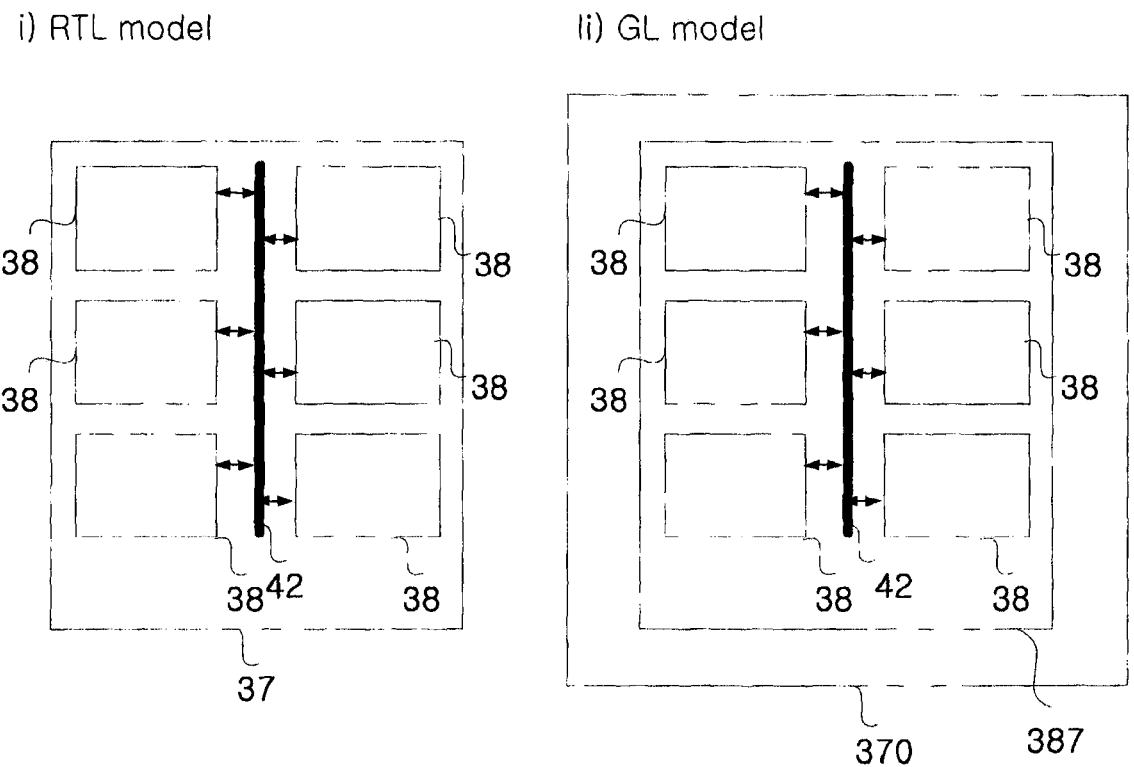
FIG. 4 is a schematic diagram of an example of the hierarchy of a RTL model and its corresponding hierarchy of a GL model.

FIG. 4 is a schematic diagram of an example of the hierarchy of a RTL model and its corresponding hierarchy of a GL model. In this example, a design object 387, which has boundary scan cells, shows the additional hierarchy at GL model.

In FIG. 4, GL model 370 is shown. Reference numeral 387 denotes design object representing a design module existed in a GL model, but not in a RTL model.

Regarding FIG. 3 and FIG. 4, in this present invention, the progressive refinement process from ESL to GL is considered as two-step process, at the first step an implementable RTL model (hereafter it will be call a RTL model) is obtained from a transaction-level model (hereafter it will be called an ESL model) and at the second step a GL model (a GL model is a gate-level netlist which represents an interconnection structure of cells in a specific implementation library with which the placement and routing can be carried out) is obtained from a RTL model. We will call the first refinement step an ESL-to-RTL design, and the second refinement step a RTL-to-GL design. Also, we will call each of the various models existed at different abstraction levels in the progressive refinement process an "equivalent model at different abstraction level."

In general, it is important to have a same or similar hierarchical structure between a model at higher level of abstraction, MODEL_DUV(HIGH), and a model at lower level of abstraction, MODEL_DUV(LOW) (Refer FIG. 3 and FIG. 4). In SOC design, as the complexity of DUV is high, models at different levels of abstraction naturally have a same or similar hierarchical structure from the top hierarchy to a certain hierarchy. In this situation, there are corresponding design objects among the models. We'll call this partial hierarchy matching relation among the models. Therefore, a design by a progressive refinement can be thought as the process in which one or more design objects in a model at higher level of abstraction are replaced by their corresponding design objects in a model at lower level of abstraction that have said partial hierarchy matching relation. At the final stage of refinement process for a specific design object B(i)_refined, the verification for correct refinement of B(i)_refined is needed. But it is possible that other design objects are not refined yet. In such case, the design object B(i)_refined replaces the corresponding design object B(i)_abst in a model at high level of abstraction MODEL_DUV(HIGH) to make a model at mixed level of abstraction MODEL_DUV(MIXED) (we will call this kind of progressive refinement "partial refinement", where as the refinement process from MODEL_DUV(HIGH) to MODEL_DUV(LOW) is called "complete refinement"), and MODEL_DUV(MIXED) is executed for comparing its result with that of MODEL_DUV(HIGH). In a model MODEL_DUV(MIXED) there are already refined design object B(i)_refined and un-refined design objects B(k)_ abst. But as the input/output port of B(i)_refined has different abstraction from those ports of B(k)_abst, the additional interface may be needed to connect those ports between B(i)_ refined and B(k)_abst.

For example, in the case of ESL to RTL refinement, transactors are needed because the port at ESL is transaction-level on the transaction and the port at RTL is cycle-level on the pins or signals. The transactors can be different upon the degree of abstraction of the transaction, for example if a transaction at ESL is cycle accurate, the transactor may be simple, and if a transaction is cycle-count accurate, then the transactor may be relatively quite complex. Also, even though there is no need to have an extra interface between the input/output port at RTL and the input/output port at GL because they are the same as pins or signals, some timing adjustor may be needed to generate some signals with correct timing at the port boundaries if the verification at GL is to verify the timing (The delay values used in the timing adjustor can be obtained by analyzing SDF or delay parameters in the library cells, performing a very short gate-level timing simulation using SDF or a static timing analysis, or both).

The correctness of design can be verified by comparing the simulation result of a model at lower level of abstraction, MODEL_DUV(LOW), by a complete refinement process with the simulation result of a model at higher level of abstraction, MODEL_DUV(HIGH), or with the simulation result of a model at mixed level of abstraction, MODEL_DUV(MIXED), if necessary. However, the simulation speed of a model at mixed level of abstraction MODEL_DUV(MIXED) is lower than that of a model at higher level of abstraction MODEL_DUV(HIGH), and the simulation speed of a model at lower level of abstraction MODEL_DUV(LOW) is even lower than that of a model at higher level of abstraction MODEL_DUV(MIXED). This simulation speed degradation is one of main problems of the verification in the progressive refinement process.

During the partial refinement or complete refinement, the speeds of simulation with MODEL_DUV(MIXED) or MODEL_DUV(LOW) drop significantly compared to the speed of simulation with MODEL_DUV(HIGH), and this results in the increase of total verification time. For example, the speed of a RTL model is 10 to 10,000 times slower than that of a ESL model, and the speed of a GL model is 100 to 300 times slower than that of a RTL model.

In systematically progressive refinement verification method (hereafter, it will be called SPR in short) proposed in this present invention, a RTL verification run with an implementable RTL model at RTL can be executed in parallel or partially (partially execution can be possible by the incremental simulation method which will be explained later) by using the result of ESL verification runs with an ESL model at ESL or the result of ESL/RTL verification runs with a mixed ESL/RTL model MODEL_DUV(MIXED)_i at mixed ESL/RTL of abstraction, which is made of in the progressive refinement process. Moreover, in SPR method proposed in this present invention, a GL verification run with a GL model at GL can be executed in parallel or partially (partially execution can be possible by the incremental simulation method which will be explained later) by using the result of RTL verification runs with a RTL model at RTL or the result of RTL/GL verification runs with a mixed RTL/GL model MODEL_DUV(MIXED)_i at mixed RTL/GL of abstraction, which is made of in the progressive refinement process. Also, in SPR method proposed in this present invention, a ESL verification run with an ESL model at the specific transaction-level can be executed in parallel or partially (partially execution can be possible by the incremental simulation method which will be explained later) by using the result of ESL verification runs with an ESL model at higher transaction-level or the result of ESL verification runs with a mixed ESL model MODEL_DUV(MIXED)_i at mixed high transaction and low transaction level of abstraction, which is made of in the progressive refinement process.

The verification runs mentioned above are basically executed by simulation using one or more simulators, but it is also possible to execute them by simulation acceleration using one or more simulation accelerators, hardware emulators, or prototyping boards with simulators. As the simulation acceleration is simply to increase the speed of simulation by using hardware-based verification platform such as simulation accelerators, hardware emulators, or prototyping boards (in this case, the prototyping boards are controlled to operate in simulation acceleration mode by software, and are not in the in-circuit or in-system environment), we will include it (simulation acceleration) in simulation too in this present invention. Also, as in this present invention we do not consider any formal verification techniques, the verification in this present invention actually means the simulation. Therefore, in this present invention, the verification can be thought as a synonym for the simulation.

Figure 5:
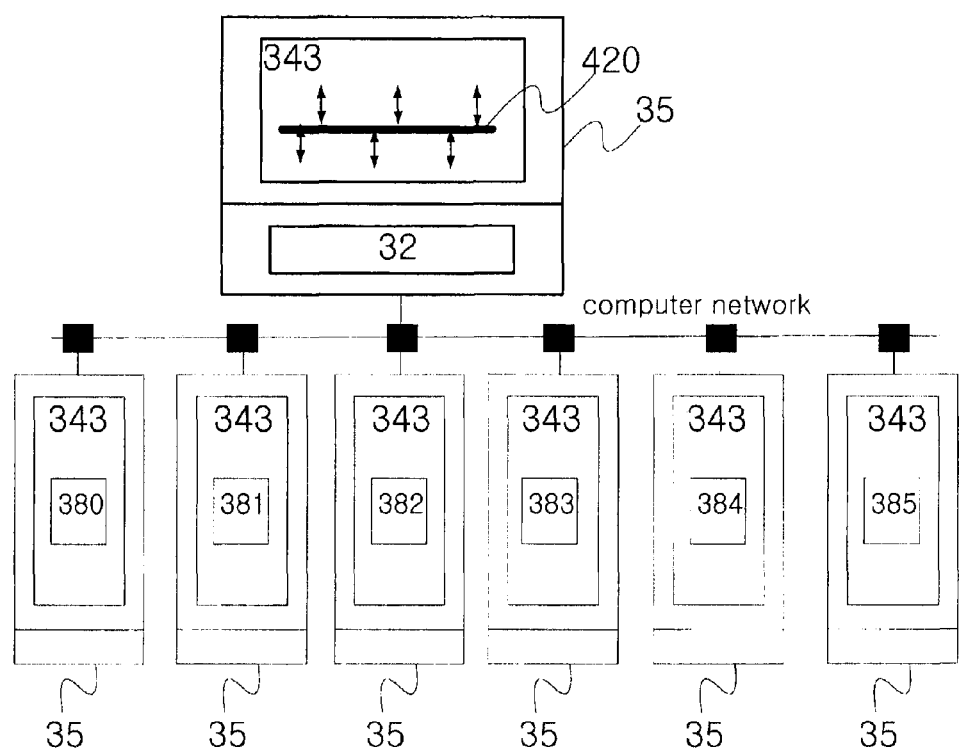
FIG. 5 is a schematic diagram of an example of the execution of a distributed parallel simulation whose environment is consisted of two or more computers connected a computer network.

FIG. 5 is a schematic diagram of an example of the execution of a distributed parallel simulation whose environment consists of two or more computers connected a computer network.

In FIG. 5, a plurality of computers 35 are connected to computer network. Reference numeral 343 denotes simulator executing a local simulation in an environment of distributed parallel simulation. Computer 35 includes simulator 343 and verification software 32. Simulator 343 may include specific design object 380, 381, 382, 383, 384, 385 in a RTL model.

FIG. 6 is a schematic diagram of an example of the execution of a time-sliced parallel simulation, where t-DCP is obtained at the front-end simulation with a model of higher level of abstraction, and back-end simulation is executed in temporally parallel.

FIG. 6 shows an example of simulation method for a predetermined model which has a specific abstraction level.

A first model (i.e., the front-end simulation in FIG. 6) is set; the first model is the same to the predetermined model except that the abstraction level of the first model is higher than the abstraction level of the predetermined model.

In other words, target to be actually verified is the predetermined model (i.e., the back-end simulation in FIG. 6), but the first model is set in order to efficiently verify the predetermined model.

Figure 7:
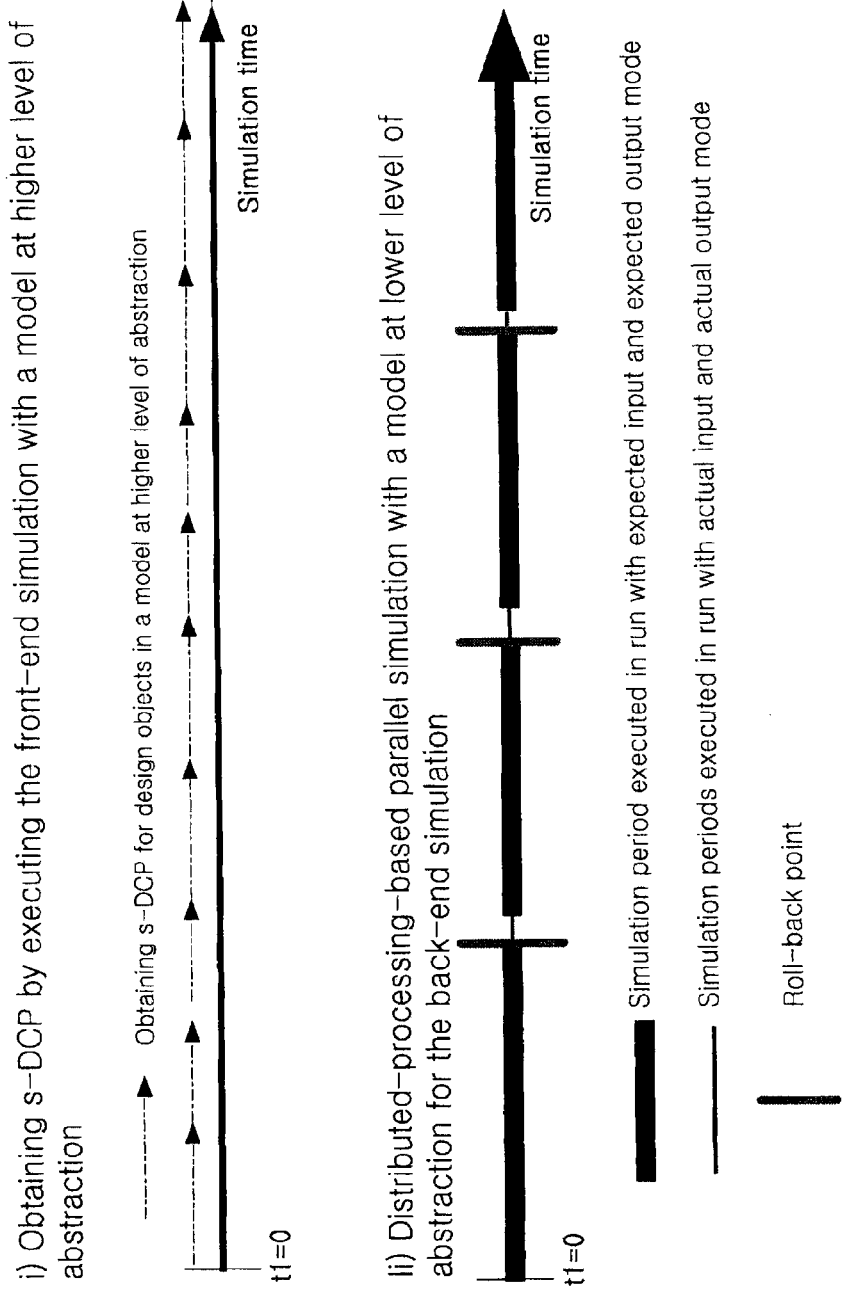
FIG. 7 is a schematic diagram of an example of the execution of a distributed-processing-based parallel simulation, where s-DCP is obtained at the front-end simulation with a model of higher level of abstraction, and back-end simulation is executed in spatially parallel.

Dynamic information is obtained while simulating the first model. At this time, a plurality of simulations may be executed as shown in FIG. 12 which will be described later, although one simulation for the first model is shown in FIGS. 6 and 7.

The local simulation is, for example, each of simulations for local design objects in case of executing a parallel simulation by spatially dividing the predetermined model into a plurality of local design objects. From the dynamic information obtained for the first model, expected input and expected outputs might be obtained.

By using the expected inputs and the expected outputs, a plurality of local simulations regarding the predetermined model might be executed. In other words, the result of front-end simulation may be used in the back-end simulation.

Although the word 'front-end' and 'back-end' is used, it does not always mean that the front-end simulation is executed earlier than the back-end simulation. For example, the front-end simulation and the back-end simulation might be executed almost at the same time.

Using the expected input and the expected output makes the simulation faster because it may allow the simulation not to perform the communication and the synchronization with the other local simulations which are simulations for the local design objects.

Regarding FIG. 6 (also regarding FIG. 7), the embodiment of the present invention may also have the following procedures.

The procedure includes:
determining whether the at least one local simulation among the plurality of local simulations can be executed independently with other local simulations by using the expected inputs and the expected outputs while omitting a communication and a synchronization with other local simulations; and executing said at least one local simulation independently with other local simulations if it is determined that said at least one local simulation can be independently executed in the said step, or executing said at least one local simulation by using actual inputs which are obtained through the communication and the synchronization with the other local simulations if it is determined that said at least one local simulation cannot be independently executed in the said step.

If the local simulations can be executed independently with other local simulations, the overall speed of the simulation increases because it means that no communication and no synchronization might be needed.

In SPR verification method in the present invention, the parallel or partial run of simulation at the low level of abstraction is carried out by using the simulation results at the high level of abstraction or the high/low mixed level of abstraction in the progressive refinement process, or by using the simulation results at the same level of abstraction which are obtained from the previous earlier simulation runs. Rarely, in SPR verification method in the present invention, the parallel or partial run of simulation at the high level of abstraction can be carried out by using the simulation results at the low level of abstraction, too (this is in the case when the design iteration occurs). In summary, an important thing in this present invention is to perform a present simulation fast by using the result of previous earlier simulation. Normally, the present simulation is carried out at the lower level of abstraction than that of the previous earlier simulation. But, in rare cases, the present simulation is carried out at the higher level of abstraction than that of the previous earlier simulation. Moreover, there can be one or more design modifications between the current simulation and the previous earlier simulation.

In the case of the previous earlier simulation at the higher level of abstraction than that of the present simulation, there are four methods which are explained below in detail. First, the design state information (defined later, and hereafter state information in short) of some design objects in a model at the high level of abstraction saved at one or more specific simulation times or periods during the simulation run with a model at the high level of abstraction is used in the simulation at the low level of abstraction (we will call this "usage method-1"). Second, the design state information of some design objects in one or more models at the mixed high/low level of abstraction saved at one or more specific simulation times or periods during two or more simulation runs with models at the mixed high/low level of abstraction is used in the simulation at the low level of abstraction (we will call this "usage method-2"). Third, the input/output information (defined later) of one or more design objects in a model at the high level of abstraction saved at the entire or partial simulation time during the simulation run with a model at the high level of abstraction is used in the simulation at the low level of abstraction (we will call this "usage method-3"). Fourth, the input/output information of one or more design objects in one or more models at the mixed high/low level of abstraction saved at the entire or partial simulation time during two or more simulation runs with models at the mixed high/low level of abstraction is used in the simulation at the low level of abstraction (we will call this "usage method-4").

Also, in the unique distributed-processing-based parallel execution method for distributed parallel simulation in this present invention, each of local simulations executes not only each of local design objects, but also a complete model of DUV and TB at higher level of abstraction or a complete model of DUV and TB optimized for faster simulation (for example, a model for cycle-based simulation is optimized for 10× faster simulation than a model for event-driven simulation) on each of local computers (by contrast, in traditional distributed parallel simulation, each of local simulations executes each of local design objects only) for obtaining the dynamic information from the complete model of DUV and TB, which is used as the expected inputs and expected outputs of the local design object to eliminate the synchronization overhead and communication overhead with other local simulations of the distributed parallel simulation, and to increase the speed of each of local simulations by each of local simulations (More detailed explanation will be later). The dynamic information of a model or design object is the logic values of one or more signals, values of one or more variables, or constants at one or more specific simulation times or periods (the period can be the entire simulation time) in the model or design object during the simulation. An example to get the dynamic information during the simulation is to use Verilog built-in system tasks, $dumpvars, $dumpports, $dumpall, $readmemb, $readmemh, etc., or user-defined system tasks (more detail can be found in Korean patent application 10-2005-116706. The dynamic information can be saved in VCD, SHM, VCD+, FSDB, or user-defined binary or text format.

The state information of a model is the dynamic information containing values of all flipflop output signals or variables, all latch output signals or variables and all combinational feedback signals or variables if there are any closed combinational feedback loops in the model at a specific simulation time (for example, at 29, 100, 511 nano-second simulation time) or for a specific simulation period (for example, 1 nano-second period from 29, 100, 200 nano-second to 29, 100, 201 nano-second). The state information of a design object is the dynamic information containing values of all flipflop output signals or variables, all latch output signals or variables and all combinational feedback signals or variables if there are any closed combinational feedback loops in the design object at a specific simulation time or for a specific simulation period.

The input information of a design object is values of all inputs and inputs of the design objects for a specific simulation time interval (this simulation time interval can be the entire simulation time). The output information of a design object is values of all outputs and inputs of the design objects for a specific simulation time interval (this simulation time interval can be the entire simulation time). The input/output information of a design object is values of all inputs, outputs and inputs of the design objects for a specific simulation time interval (this simulation time interval can be the entire simulation time).

The parallel simulation execution using a model at the specific level of abstraction in this present invention includes both distributed-processing-based parallel execution (hereafter, it will be called DPE in short), and time-sliced parallel execution (hereafter, it will be called TPE in short) (In other words, DPE and TPE are our unique parallel simulation methods in this present invention). For detailed explanation, t-DCP (Temporal Design Check Point) is defined first.

t-DCP (Temporal Design Check Point) is defined as the dynamic information of DUV or one or more design objects in DUV which is necessary for starting the simulation for DUV or one or more design objects in DUV from the arbitrary simulation time Ta, not the simulation time 0. Therefore, the state information of a design object is a specific example of t-DCP. But, a model for simulation must have both DUV and TB. Therefore, to start the simulation at the arbitrary simulation time Ta, other than simulation time 0, considering not only DUV but also TB is necessary. There are about three ways to do it. First, TB is executed from simulation time 0, and DUV from Ta. To do so, if TB is reactive, the output information of DUV (it may be necessary to save this at the previous simulation run) drives TB to run TB only from the simulation time 0 to Ta, and both DUV and TB are simulated together from Ta. If TB is non-reactive, executing TB alone from the simulation time 0 to Ta and executing both TB and DUV from Ta is possible. Second, to restart TB at the simulation time Ta, TB is saved for restart. That is to save the TB state, which are values of all variables and constants at a specific simulation time or period in TB, or the simulation state, and restore it later. However, to restart the execution from the saved TB state, the description style of TB must be confined (for example, synthesizable TB) or some manual TB modification may be needed. Third, the algorithmic-based input generation subcomponent in TB, which is difficult to start the execution at Ta, may be replaced with the pattern-based input generation subcomponent, which is easy to start the execution at Ta using a pattern pointer.

To apply one of three methods, the instrumentation code may need to be instrumented into a model for simulation or the simulation environment. Such instrumentation code can be automatically instrumented by the verification software in this present invention (the specific examples of such instrumentation code are given in FIGS. 16-18 which will be shown later).

The detailed simulation method using t-DCP such as a state information of a design object is given in Korean patent application 10-2005-116706.

FIG. 7 is a schematic diagram of an example of the execution of a distributed-processing-based parallel simulation, where s-DCP is obtained at the front-end simulation with a model of higher level of abstraction, and back-end simulation is executed in spatially parallel.

Regarding S-DCP, s-DCP is defined as the dynamic information of the equivalent model at different abstraction level of DUV or TB, the dynamic information of one or more design objects in the equivalent model at different abstraction level, the dynamic information of DUV and TB, the dynamic information of one or more design objects in DUV and TB, a model of DUV and TB at the higher level of abstraction than that of DUV and TB, or a model of DUV and TB optimized for faster simulation (for example, in VCS from Synopsys there are methods for obtaining faster simulation models such as two-state simulation option or using Radiant Technology, and NC-sim or ModelSim also has similar methods). Such s-DCP will be simulated together with the specific local design object in a local simulation by a local simulator in the distributed parallel simulation so that it (s-DCP) serves as the expected input and expected output of said local simulation S_l(k) for said local design object or is used for obtaining the expected input and expected output of said local simulation S_l(k) for said local design object. With the expected input as the input stimulus, in the local simulation said local design object is simulated to produce the corresponding actual output without interacting with other local simulations. And then, the produced actual output is compared with the expected output. If the comparison matches, the corresponding local simulation can proceed further without interacting with other local simulations, therefore avoiding synchronization overhead and communication overhead, by being stimulated by next expected input and producing next corresponding actual output until the mismatch between the expected output and the actual output occurs (In this present invention, "the expected input and the expected output for the execution of local simulation" means the expected input values and the expected output values which are obtained before the actual execution or being obtained during the actual execution. Specifically, the expected something obtained before the actual execution or being obtained during the actual execution includes the expected one already available before the actual simulation starts, the expected one dynamically generated at the earlier than or the same time when the corresponding input has to be given or the corresponding output is produced during the actual simulation is running, or both. Therefore, s-DCP could be a model of DUV and TB at the higher level of abstraction than that of DUV and TB, an optimized model of DUV and TB for faster simulation, an input/output information for one or more design objects saved in the previous simulation runs). To provide said s-DCP information, which can be used for expected input and expected output of said local design object in said local simulation and control the execution of the simulation (such as run with expected input/output mode, run with actual input/output mode, roll-back mode, etc will be explained later), the extra code must be instrumented into a design code (normally written in HDL, C/C++, SystemC, HVL, or any combination of these) or a simulation environment. The extra code to be instrumented (hereafter, instrumentation code, in short) can be written in HDL such as Verilog, SystemVerilog, or VHDL so that it is included into a model written in HDL, in C/C++/SystemC so that it is interfaced with a model in HDL using PLI/VPI/FLI or directly, or in the combination of them. Such instrumentation code is normally instrumented outside of DUV, possibly in C/C++. But, if necessary, the instrumentation code can be instrumented into DUV. Such instrumentation can be done automatically by the verification software in this present invention, which can read all design source files containing the codes of DUV and TB, and all simulation environment files (For a specific example, refer FIGS. 16-19. For an example of the internal structure and functionality of instrumentation code, refer FIGS. 8 and 27).

Such instrumentation code should play the role which includes to apply the expected input to the local design object for a local simulation, to compare the actual output of the local design object produced in the simulation run with the expected output, and apply the next expected input if they match. As this is pretty similar to the primary role of normal testbench, automatic generation of such instrumentation code is not difficult.

Moreover, when roll-forward is necessary, the local simulation is running in the run with expected input and expected output mode. When roll-back is needed (Roll-forward for a local simulation S(t_c) is needed when there is a mismatch occurred at the simulation time t_d in other local simulation and t_d is the later simulation time than the current simulation time t_c of S(t_c). S(t_c) must simulate forward from t_c to t_d until either t_d is reached or there is a mismatch occurred in S(t_c). If there is the mismatch occurred at t_b between t_c and t_d in S(t_c), then the local simulation S(t_c) should stop temporally and inform the mismatch to other local simulations. Therefore, the roll-forward is not different from the run with expected input/output for the local simulation S(t_c)), then the roll-back is performed, and from this roll-back point the traditional distributed local simulation is performed with actual input and actual output, (hereafter, we will call this "the run with actual input and actual output mode" in this present invention, and the run with actual input and actual output mode actually performs the transfer of simulation data—input to each of local simulations from some other local simulations or output from each of local simulations to some other local simulations—among local simulations in the distributed parallel simulation. In this transfer, either optimistic or pessimistic synchronization is needed. The data transfer (communication) interval and synchronization interval could be smallest simulation precision time, minimum simulation time unit (time unit), a cycle, a transaction, etc), until the next run with expected input/output mode will be active again. For control such roll-backs, roll-back methods used in traditional pessimistic distributed parallel simulation or save/restart method proposed in Korean patent application 10-2005-116706 can be used. It is also already well known for running local simulations with actual inputs and actual outputs. Therefore, the instrumentation code for controlling those operations explained above can be generated automatically by the verification software without difficulty (For the detailed example refer FIGS. 16-19. The example structure of instrumentation for this is in FIG. 8. The example of its pseudo code is in FIG. 27).

Each of local design objects executed by each of local simulators in the distributed parallel simulation environment uses the expected input obtained from s-DCP as the input for independently simulating the local simulation and obtaining the actual output of each of local simulations, compares this actual output with the expected output obtained from s-DCP, and if these two matches the corresponding local simulation can proceed with no synchronization overhead and communication overhead at all or minimal overheads (we'll call this mode of operation "the run with expected input and expected output mode") so that the simulation speed can be greatly increased. If the actual output does not match with the expected output obtained from s-DCP (we'll call this a time point of mismatch between expected output and actual output) at the certain simulation time during the simulation, the distributed parallel simulation should be carried out while the communication and synchronization among local simulators are being established after roll-back. Even after the simulation switches to the run with actual input and actual output mode in which the communication and synchronization occur, the actual inputs produced during the simulation are kept on being compared with the expected inputs obtained from s-DCP or the actual outputs produced during the simulation are kept on being compared with the expected outputs obtained from s-DCP. If this comparison produces the certain number of matches (the specific umber can be set before the simulation, or even can be adaptively changed during the simulation), then the simulation can switch back to the simulation with expected input and expected output, i.e. the run with expected input and expected output mode, from this simulation time (we will call this time a "cancellation time of run with actual input/output") so that the communication overhead and synchronization overhead are again eliminated for high speed distributed parallel simulation (For the efficiency of comparison, the expected values, e.g. expected output or expected input, can be compared with the actual values, e.g. actual output or actual input by aligning the abstraction level. Alignment of the level of abstraction can be done by adaptor modules or transactor modules. For example, for the comparison for a distributed parallel simulation at RTL, the abstraction level of actual values can be raised to ca-transaction level same as the level of expected values, or both the RTL abstraction level of actual values and the TL abstraction level of expected values can be raised to timed-transaction level as well). These processes will be repeated until the simulation ends. The exact time for applying the run with actual input/output could be any time t_advance_lock earlier than t_lock, which is the earliest time of mismatch between expected output and actual output among those of local simulations in distributed parallel simulation. However, for maximizing the simulation performance, the time for applying the run with actual input/output should be close to t_lock as much as possible. Therefore, in each of local simulations if said mismatch between expected output and actual output occurs, then the time of mismatch must be broadcasted to other local simulations. For performing any possible roll-back, each of local simulations in the distributed parallel simulation must save the simulation state (the simulation state is the run-time image of simulation process at a specific simulation time for checkpointing. Most of commercial simulators have such capability. For example, the save/restart feature in VCS from Synopsys, NC-Verilog from Cadence, ModelSim from Mentor, etc) or the state information of local design object periodically or non-periodically (for example, if certain conditions are met). Some specific examples of s-DCP are; the input/output information for one or more design objects in DUV and TB, a simulation model includes DUV and TB which are described at higher level of abstraction than that of said DUV and TB consisting of local design objects, or an optimized model for faster simulation includes DUV and TB. If the boundaries of local design objects for local simulations in a distributed parallel simulation are not same as the boundaries of design objects (for examples, modules in Verilog, entities in VHDL, sc_modules in SystemC, etc) in DUV, s-DCP could be the input/output information of said local design objects for said local simulations.

One thing to consider said distributed parallel simulation with reduced communication and synchronization overhead is that said times of mismatch between expected output and actual output could be different in local simulations. In this case, all of local simulations must re-simulate in the run with actual-input/actual-output mode from the earliest time t_e among two or more expected-output/actual-output mismatch points in time. To do so, some of local simulations which already have proceeded over t_e must perform a roll-back to t_e before the re-simulation. To support roll-back, the simulation save & restart capability must be provided. There are two ways to do it. One is to save the simulation state at regular interval, or at one or more specific times during the simulation, and reload it later for restart. The other is to save the design state (the design state is the state information of corresponding design objects) at regular interval, or at one or more specific times during the simulation, and reload it later for restart. More detail can be founded in Korean patent applications, 10-2005-116706. We will call this saving process of the simulation state or design state for restarting checkpointing. Those one or more simulation times or simulation periods, which the checkpointing are made, are called checkpoints. Therefore, the roll-back point in time for said roll-back is not the earliest mismatch point in time, t_est, but the checkpoint, which is closest but no later than t_est.

The expected inputs/expected outputs used in the distributed-processing-based parallel simulation of the present invention for minimizing communication overhead and synchronization overhead can be represented in signals with bit/bit-vector type, or transactions with abstracted data structure (such as record type). In the case of transaction, it can be cycle-by-cycle transaction or cycle-count transaction. Therefore, such comparison between expected input and actual input, or expected output and actual output could be in cycle-by-cycle at signal, cycle-by-cycle at transaction, or cycles-by-cycles at transaction. Therefore, in the case of comparison between expected input and actual input, or expected output and actual output, it includes cycle-by-cycle comparison at signal, cycle-by-cycle comparison at transaction, or cycles-by-cycles comparison at transaction.

The distributed parallel simulation method described above is called a distributed parallel simulation using s-DCP, distributed-processing-based parallel execution method, or distributed-processing-based parallel simulation (Distributed-processing-based parallel execution method, or distributed-processing-based parallel simulation only represents the distributed parallel simulation proposed in this present invention for minimizing communication overhead and synchronization overhead of distributed parallel simulation with expected inputs and expected outputs obtained from s-DCP, and does not represent the conventional distributed parallel simulation). For maximizing the performance of distributed parallel simulation using s-DCP, it is very important to minimize the number of cancellations of run with actual input/output and the total simulation time for run with actual input/output. To do this, the accuracy of s-DCP used for obtaining expected inputs and expected outputs for local simulations is also very important. That is, more accurate s-DCP is, less the simulation periods by run with actual input/output are and more simulation periods by run with expected input/output are for eliminating communication overhead and synchronization overhead among local simulations in a distributed parallel simulation. However, not only the accuracy of s-DCP is important, but also the time to get s-DCP is important. This is because the highest accuracy of s-DCP for expected input, expected output, or expected input and expected output can be obtained from the simulation with a model at the same level of abstraction as that of the model for distributed parallel simulation, but this takes very long time so that it is not practical in most situations. However, such approach is pretty effective in the case of regression test, when the design is modified locally, or when s-DCP previously obtained is reused if the simulation with a same testbench should be repeated. In regression test, where the back-ward compatibility is examined, most of tests are passed without detecting design errors. Therefore, the regression test can be performed with a high performance by a distributed-processing-based parallel simulation or a combination of distributed-processing-based parallel execution/singular execution (explained later) using s-DCP obtained from the simulation prior to the regression test, because the accuracy of s-DCP is high so that the number of cancellations of run with actual input/output and the total simulation time for run with actual input/output is highly minimized. Also, in the case where the design is only locally modified due to debugging or specification change, the simulation can be executed with a high performance if a combination of distributed-processing-based parallel execution/singular execution or distributed-processing-based parallel execution using incremental simulation (explained later) is used.

When the distributed parallel simulation with actual input/output is not desirable from the simulation time t_lockstep(i) when the i-th of run with actual input/output of said distributed-processing-based parallel simulation in the present invention needs to apply (for example, because no more simulation licenses left, the simulation performance for run with actual input/output is not satisfactory, etc), a single simulation can be executed from t_lockstep(i) for DUV and possibly TB (TB can be executed by other simulator if it should be run by a HVL simulator, for instance) instead of distributed parallel simulation.

In such execution, for a specific simulation period (for example, from simulation time 0 to the 1st time of mismatch between expected output and actual output), the distributed-processing-based parallel simulation is executed for minimizing synchronization overhead and communication overhead, and at the end of above distributed-processing-based parallel simulation t-DCP of DUV (it is the union of all t-DCP's of local design objects in local simulation) is produced to start the simulation with a single simulator from that point. We will call this kind of simulation "a combination of distributed-processing-based parallel execution/singular execution", which uses both s-DCP and t-DCP (This requires a new simulation compilation for singular execution).

Figure 8:
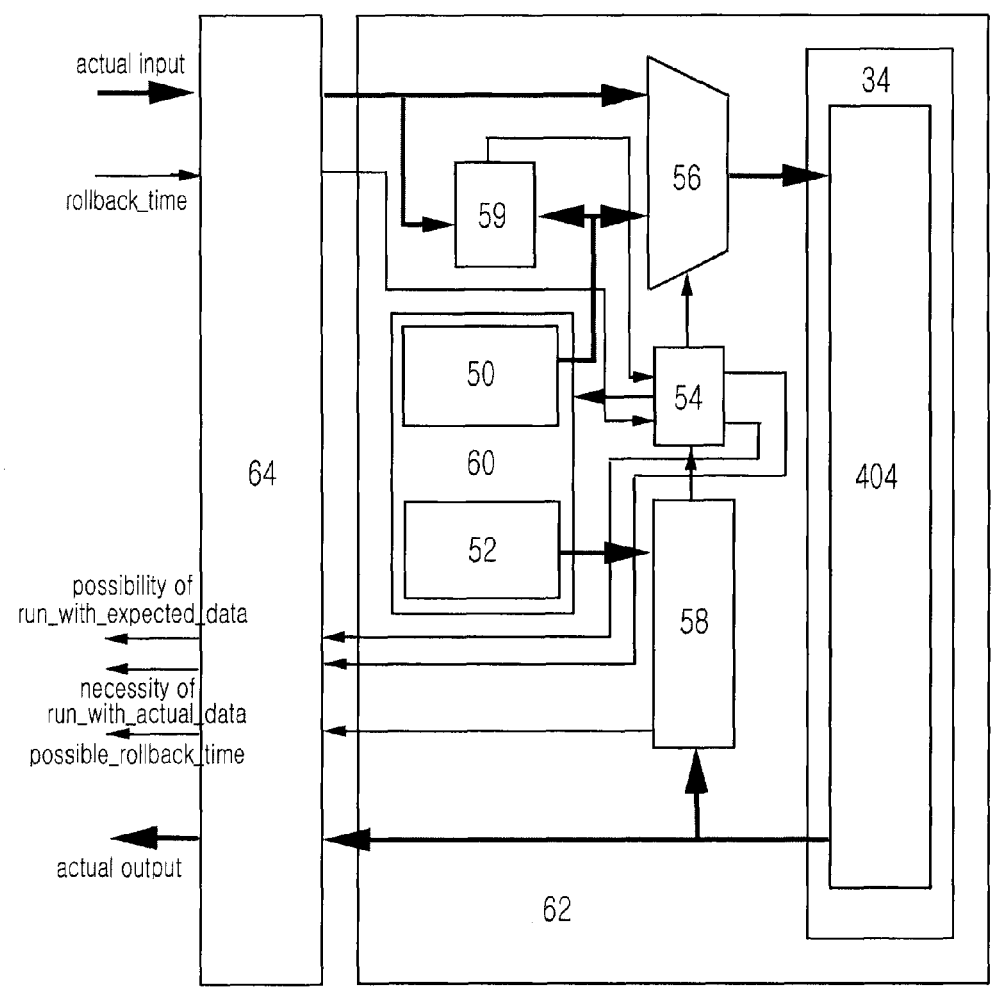
FIG. 8 is a schematic diagram of an example of the components consisting of the instrumentation code added for a parallel-processing-based distributed simulation in this present invention.

FIG. 8 is a schematic diagram of an example of the components consisting of a behavior of the instrumentation code added for a parallel-processing-based distributed simulation in this present invention.

In FIG. 8, HDL simulator 34 includes reference numeral 404 which is a part of a model for design verification executed in a local simulator.

Also, in FIG. 8, s-DCP generation/save module 60 includes expected input 50, expected output 52.

Reference numeral 54 denotes control module of run-with-expected-input&output/run-with-actual-input&output; reference numeral 56 denotes selection module of expected-input/actual-input; reference numeral 58 denotes compare module of expected-output/actual-output; and reference numeral 59 compare module of expected-input/actual-input. Reference numeral 64 denotes communication and synchronization module for distributed parallel simulation.

Signals flow as shown by arrows in FIG. 8.

The figure shows the components consisting of a behavior of the instrumentation code (62) added to a part of a model for verification (404) (if each part is combined together, then a complete model M is formed) executed in each local simulator or local hardware-based verification platform (in this present invention, the hardware-based verification platform includes hardware emulators, simulation accelerators, or prototyping boards such as Palladium/Extreme series from Cadence, Vstation series, Hammer series from Tharas, Gemini series from Fortelink, SystemExplorer series from Aptix, ZeBu series from EVE, HES series from Aldec, CHIPit series from ProDesion, HAPS series from HARDI, IP porter series fromS2Cinc, Nitro-Sim from Liga-Systems, etc) in the distributed parallel simulation environment.

Therefore, said instrumentation code (62) should be added to a model so that its functionality should be one provided by those components (control module of run-with-expected-input&output/run-with-actual-input&output (54), selection module of expected-input/actual-input (58), compare module of expected-output/actual-output (58), compare module of expected-input/actual-input (59), s-DCP generation/save module (60)) in FIG. 8.

The behavior of each module will be explained next. A control module of run-with-expected-input & output run-with-actual-input & output (54) produces an output to a selection module of expected-input/actual-input (56) so that it selects either expected input or actual input, or an control for a roll-back if roll-back is required before selecting actual input, by using the inputs from a compare module of expected-output/actual-output (58), a compare module of expected-input/actual-input (59), and a communication and synchronization module for distributed parallel simulation (64) and the its current status (therefore, a control module of run-with-expected-input & output run-with-actual-input & output (54) has its own status variable inside to know the current running mode of the local simulation is either the run with expected input and expected output mode or the run with actual input and actual output mode).

That is, if the current local simulation is being executed in the run with expected input and expected output mode (therefore, a control module of run-with-expected-input & output/run-with-actual-input & output (54) sends an output to a selection module of expected-input/actual-input (58) so that it selects expected input) and received an input from a compare module of expected-output/actual-output (58) such that the current actual output and expected output does not match, then a control module of run-with-expected-input & output/run-with-actual-input & output (54) produces an output to a selection module of expected-input/actual-input (56) so that it selects actual input, and switches its current status variable from the run with expected input and expected output mode to the run with actual input and actual output mode. At the same time, it controls to roll-back to a specific roll-back time if a specific roll-back time is given from a communication and synchronization module for distributed parallel simulation (64).

If the current local simulation is being executed in the run with actual input and actual output mode (therefore, a control module of run-with-expected-input & output/run-with-actual-input & output (54) sends an output to a selection module of expected-input/actual-input (56) so that it selects actual input) and received an input from a compare module of expected-input/actual-input (59) such that the actual outputs and expected outputs match more than a certain number of times, then a control module of run-with-expected-input & output/run-with-actual-input & output (54) produces an output to a selection module of expected-input/actual-input (56) so that it selects expected input, and switches its current status variable from the run with actual input and actual output mode to the run with expected input and expected output mode.

Also, a control module of run-with-expected-input & output run-with-actual-input & output (54) sends two outputs (possibility of run_with_expected_data, and necessity of run_ with_actual_data) to a communication and synchronization module for distributed parallel simulation (64) for notifying its current status to other local simulations, and controls an s-DCP generation/save module (60) so that an s-DCP generation/save module (60) produces expected input or expected output with a right timing.

A compare module of expected-output/actual-output (58) compares the expected output stored in an s-DCP generation/save module (60) with the actual output generated from a part of a model for design verification executed in a local simulator (404) during the local simulation. If the comparison matches, it informs of the match to a control module of run-with-expected-input & output/run-with-actual-input & output (54). If the comparison does not match, it informs of the mis-match to a control module of run-with-expected-input & output run-with-actual-input & output (54), and sends the present local simulation time for possible roll-back: to a communication and synchronization module for distributed parallel simulation (64) so that a communication and synchronization module for distributed parallel simulation (64) can send it to other local simulations.

A compare module of expected-input/actual-input (59) compares the expected input stored in an s-DCP generation/save module (60) with the actual input driven by other local simulations, which are coming from a communication and synchronization module for distributed parallel simulation (64) during the local simulation. If the comparison matches to certain number of times, it informs of the match to a control module of run-with-expected-input & output/run-with-actual-input & output (54). A compare module of expected-output/actual-output (58) or a compare module of expected-input/actual-input (59) can compare the expected values with actual values not only in the unit of bit signal and the unit of absolute simulation time, but also in the unit of transaction and the unit of relative simulation time by time alignment method and s-DCP accuracy enhancement by transaction transformation method.

Last, a selection module of expected-input/actual-input selects one of the actual input from a communication and synchronization module for distributed parallel simulation (64) and the expected input from an s-DCP generation/save module (60), and applies this to a part of a model for design verification executed in a local simulator (404) as input.

If a part of a model for design verification executed in a local simulator (404) is executed in a local hardware-based verification platform, the instrumentation code (62) must be synthesizable, or a part of a model for design verification executed in a local simulator (404) is executed in a local simulator, the instrumentation code (62) must be simulation-executable. Therefore the instrumentation code could be written in HDL (for example, Verilog, VHLD, etc), SDL (for example, SystemC, SystemVerilog, etc), C/C++, or any combination of those. Moreover, the verification software in this present invention automatically generates the instrumentation code (62). In the example depicted in FIG. 3, the instrumentation code (62) is written in C/C++ or systemC so that it is interfaced with a part of a model for design verification executed in a local simulator (404) through VPI/PLI/FLI. But, as already explained, it is possible that the instrumentation code (62) can be written partially in HDL, and the rest of it in C/C++ or SystemC.

Figure 32:
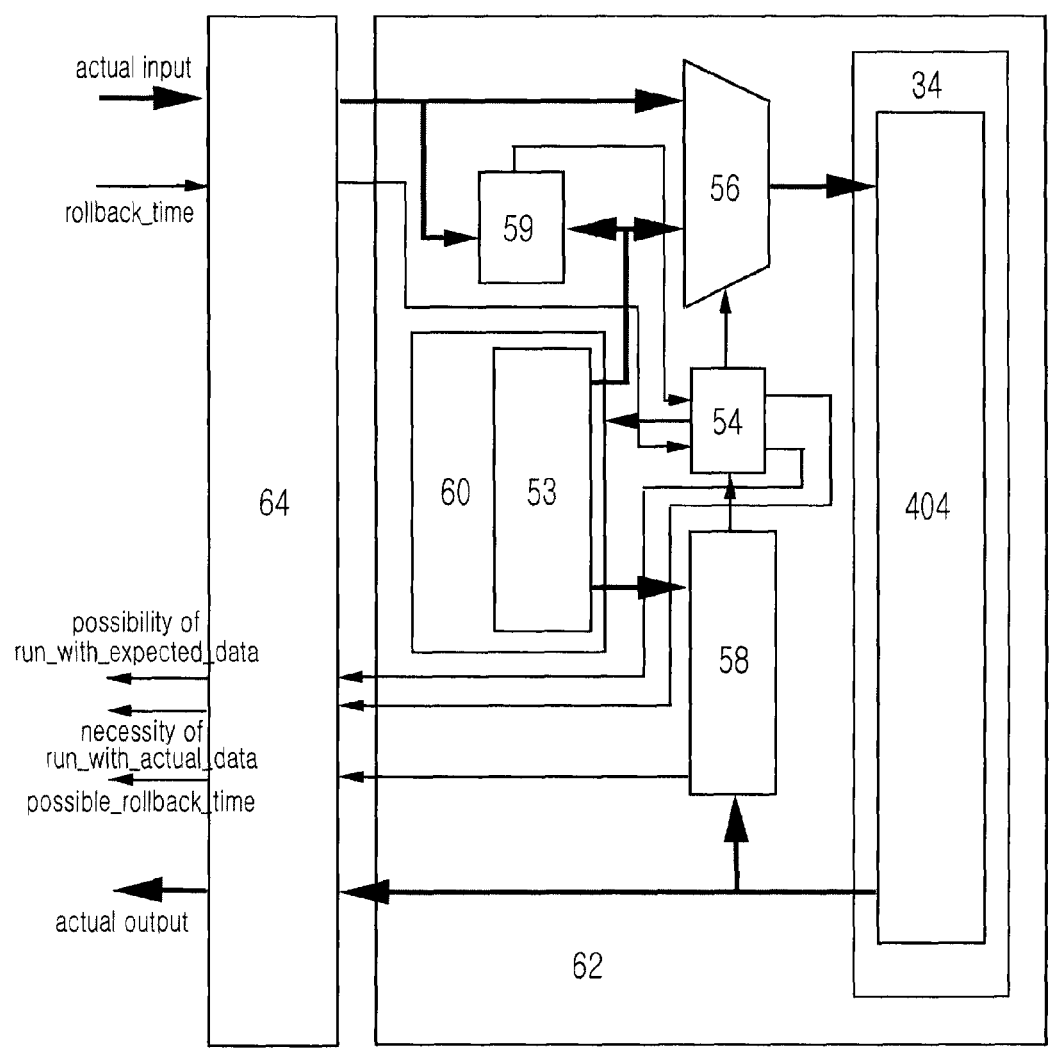
FIG. 32 is a schematic diagram of another example of components for the behavior of the instrumentation code of the distributed-processing-based parallel simulation in this present invention.

For local simulations of distributed-processing-based parallel simulation depicted in FIG. 8 or FIG. 32, their running mode can be globally synchronized such that all of local simulations should be either the run with expected input and expected output mode or the run with actual input and actual output mode, or their running mode can be individually controlled. For later case, even though the communication overhead and synchronization overhead may not be completely eliminated even in the run with expected input and expected output mode, it is still beneficial to reduce the communication overhead and synchronization overhead.

Figure 9:
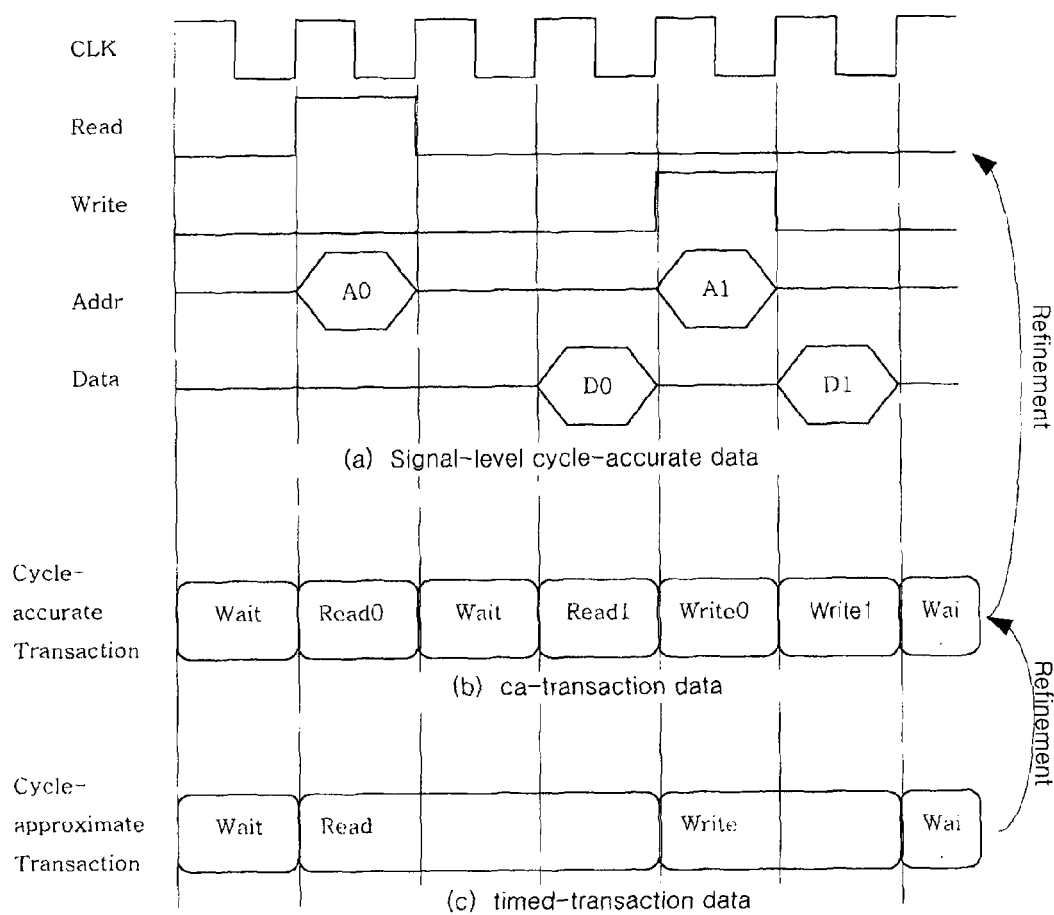
FIG. 9 is a schematic diagram of an example of a cycle-accurate bus operation in the unit of signal at RTL and its corresponding cycle-accurate bus operation in the unit of transaction at TL.

FIG. 9 is a schematic diagram of an example of a cycle-accurate bus operation in the unit of signal at RTL and its corresponding cycle-accurate bus operation in the unit of transaction at TL.

Especially, FIG. 9(c) shows timed-transaction data; FIG. 9(b) shows ca-transaction data; and FIG. 9(a) shows signal-level cycle-accurate data.

FIG. 10 is a schematic diagram of an example showing design objects in the ESL model and its corresponding design objects in the RTL model depicted in FIG. 3.

As stated, FIG. 10 corresponds to a more specific version of FIG. 3. In FIG. 10, Design Object in ESL model is shown as DOx_esl (x is one of number 1~6) and Design Object in RTL model is shown as DOx_rtl (x is one of number 1~6). For iii) DO_t_mixed(1) in FIG. 10, it will be explained in detail with regard to FIG. 11.

Figure 11:
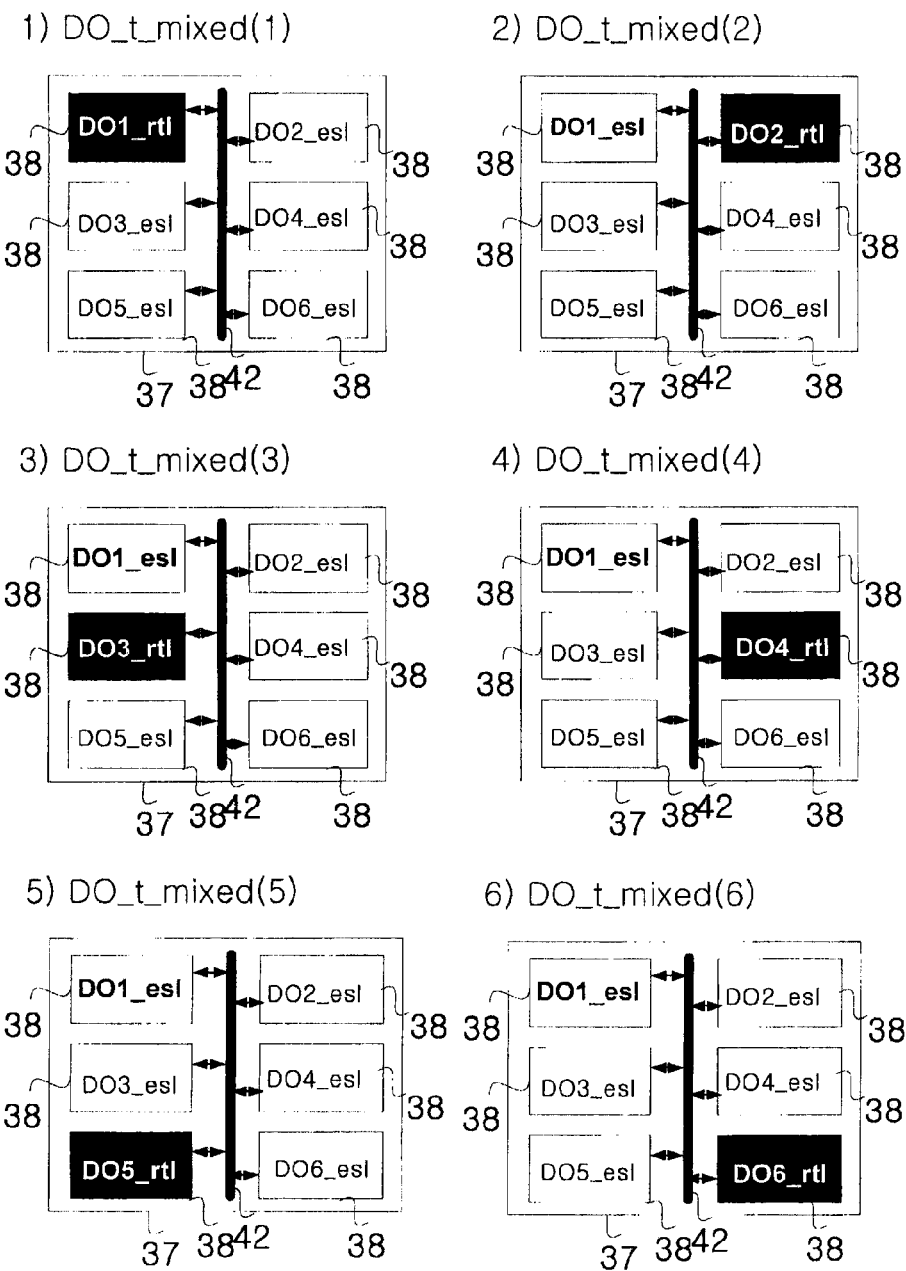
FIG. 11 is a schematic diagram of an example of a generation of design objects DO_t_mixed(i) at mixed level of abstraction such that each of design objects in the ESL model depicted in FIG. 10 is replaced a corresponding design object in the RTL model.

FIG. 11 is a schematic diagram of an example of a generation of design objects DO_t_mixed(i) at mixed level of abstraction such that each of design objects in the ESL model depicted in FIG. 10 is replaced a corresponding design object in the RTL model.

FIG. 12 is a schematic diagram of an example of an execution of a distributed-processing-based parallel simulation with a RTL model as back-end simulation by using the design state information collected at one or more simulation times and periods when six independent parallel front-end simulations with six mixed design objects DO_t_mixed(1), DO_t_mixed(2), . . . , DO_t_mixed(6) depicted in FIG. 11 are being executed.

In FIG. 12, i) denotes front-end simulation and ii) denotes back-end simulation. In a preferable embodiment, abstraction level of the front-end simulation (the first model) is higher than that of the back-end simulation (the predetermined model)

X marks in FIG. 12 denotes that the time points are checked as checkpoints.

Obtaining the expected inputs and the expected outputs for the at least one local simulation is achieved by: while executing the distributed parallel simulation for the predetermined model which has the specific abstraction level, in the at least one local simulation, simultaneously simulating a first model and a local design object corresponding to the local simulation, wherein the first model is same to the predetermined model except that an abstraction level of the first model is higher than an abstraction level of the predetermined model.

Figure 13:
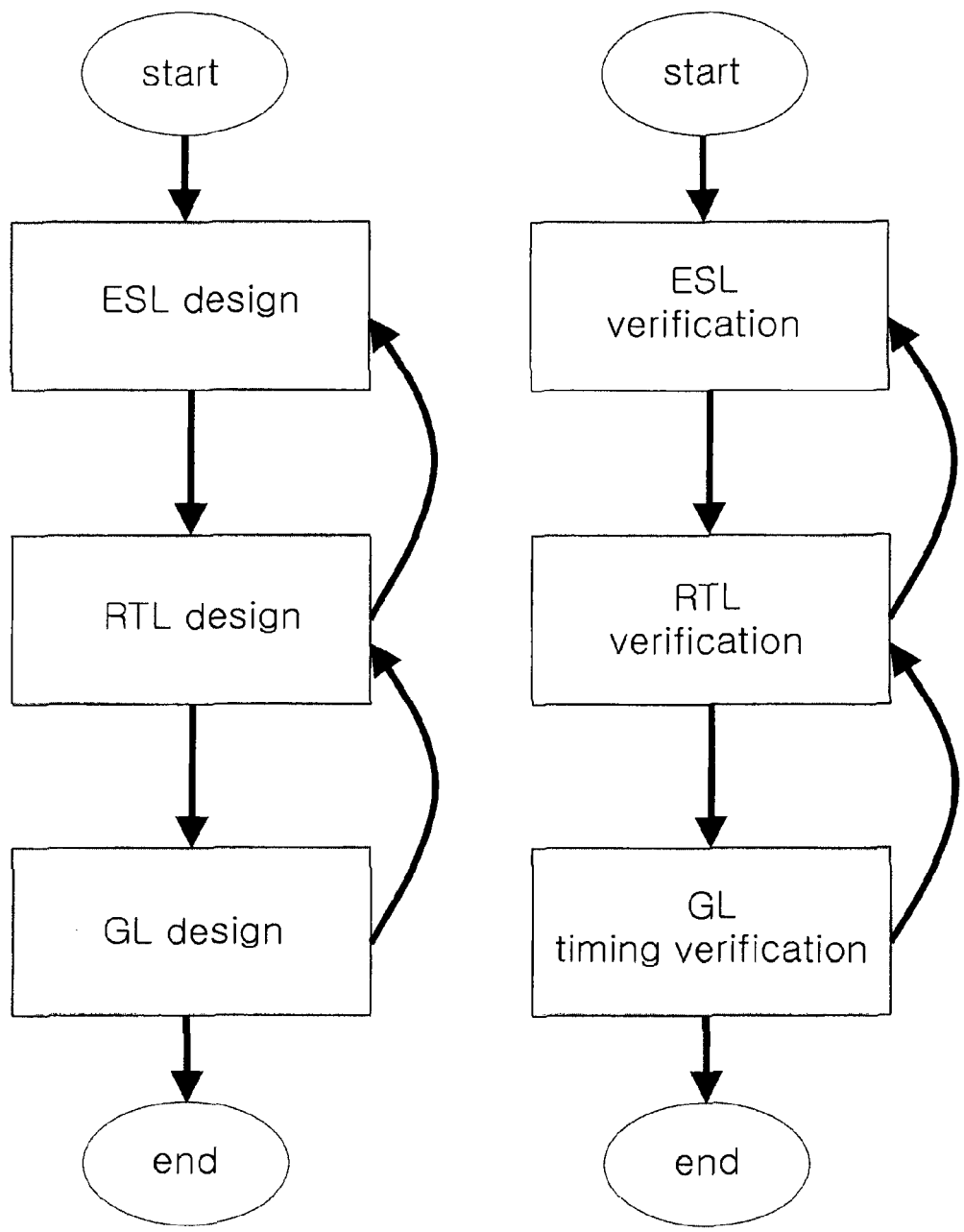
FIG. 13 is a schematic diagram of an example of the design and verification process using progressive refinement from the initial level of abstraction to the final level of abstraction.

An example of abstraction levels are shown in FIG. 13 which will be described later.

Alternatively, obtaining the expected inputs and the expected outputs for the at least one local simulation comprises: prior to execution of the distributed parallel simulation for the predetermined model which has the specific abstraction level, while performing a simulation with a first model which is same to the predetermined model except that an abstraction level of the first model is higher than an abstraction level of the predetermined model, storing input information and output information for at least one design object which exist in the first model.

FIG. 13 is a schematic diagram of an example of the design and verification process using progressive refinement from the initial level of abstraction to the final level of abstraction.

In FIG. 13, ESL (Electronic System Level) design/verification, RTL (Register Transfer Level) design/verification, and GL (Gate Level) design/timing verification are shown in order.

For example, the abstraction level of the first model is RTL (Register Transfer Level) or mixed level of RTL and GL (Gate level) if the abstraction level of the predetermined model is GL (Gate Level), or the abstraction level of the first level is ESL (Electronic System Level) or mixed level of ESL and RTL if the abstraction level of the predetermined model is RTL.

Figure 14:
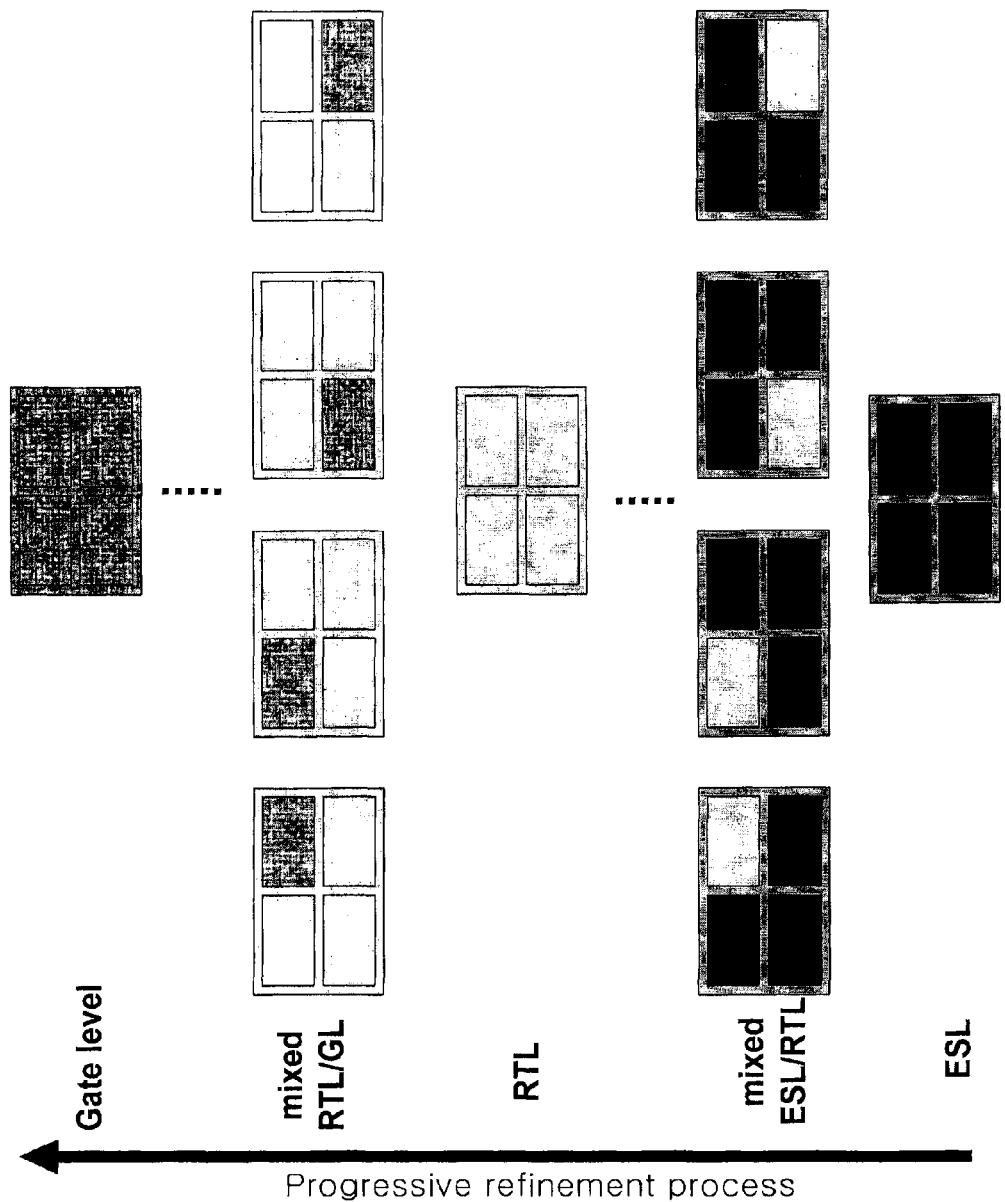
FIG. 14 is a schematic diagram of an example of a progressive refinement process from a RTL model to a GL model.

FIG. 14 is a schematic diagram of an example of a progressive refinement process from a RTL model to a GL model.

As progress, the process goes on from ESL through mixed ESL/RTL, RTL, and mixed RTL/GL to GL (Gate Level).

Figure 15:
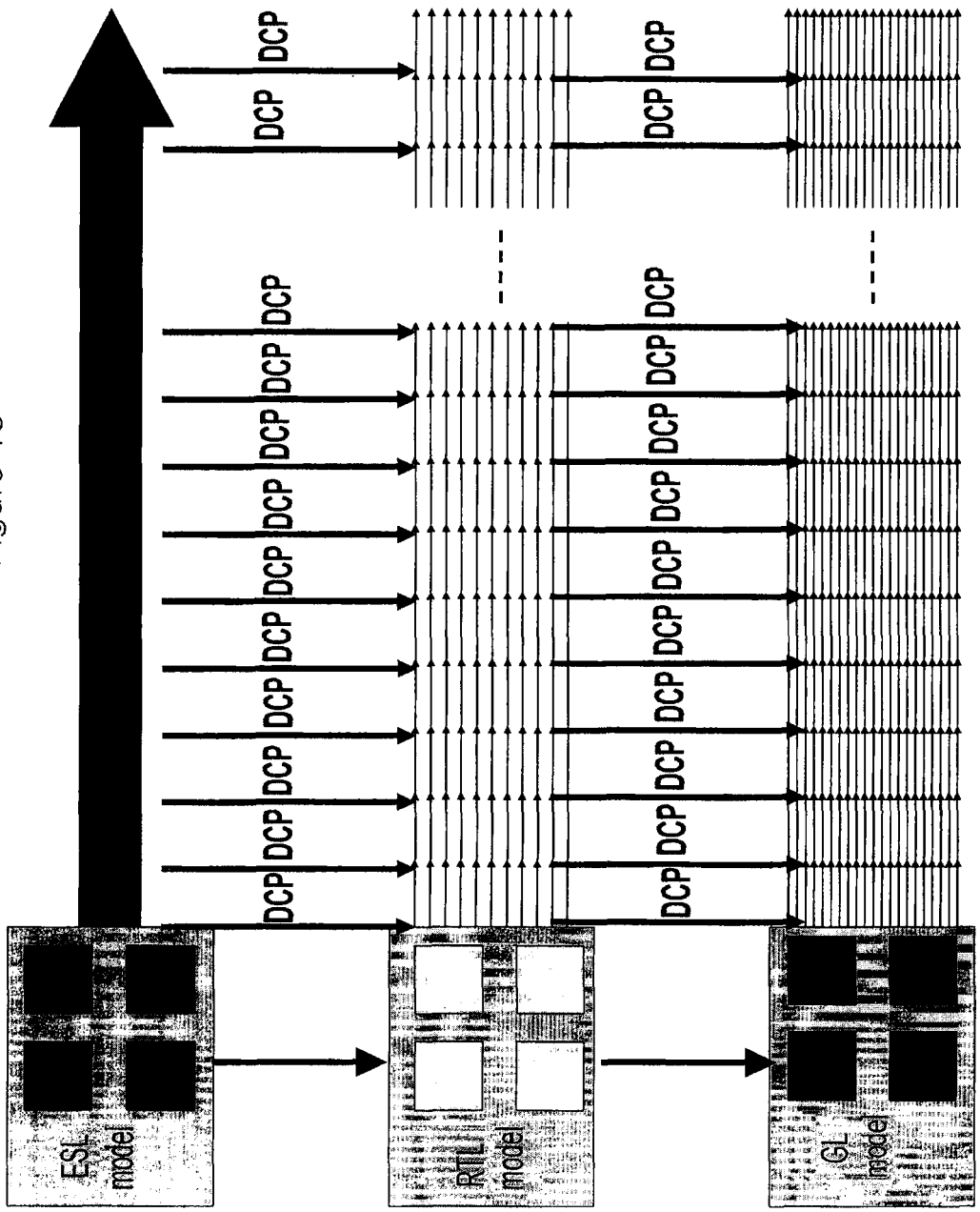
FIG. 15 is a schematic diagram of an example of a distributed-processing-based parallel simulation or time-sliced parallel simulation with a model at lower level of abstraction using s-DCP or t-DCP when the verification progresses from the verification with a TL model to the verification with a GL model through the verification with a RTL model by progressive refinement.

FIG. 15 is a schematic diagram of an example of a distributed-processing-based parallel simulation or time-sliced parallel simulation with a model at lower level of abstraction using s-DCP or t-DCP when the verification progresses from the verification with a TL model to the verification with a GL model through the verification with a RTL model by progressive refinement. In the figure, DCP is either s-DCP or t-DCP.

With regard to FIG. 10~FIG. 15, moreover, as another derivative, at any of times for run with actual input/output a different configuration for distributed-processing-based parallel simulation can be made. For example, there are four design objects B0, B1, B2, and B3 in DUV, each of them is assigned to each of four simulators in four computers for initial distributed-processing-based parallel execution, and the simulation is performed up to any of times for run with actual input/output. From this time, only two simulators are available so that B0 (for example, B0 is TB) is assigned to the first simulator, and B1, B2, and B3 are assigned to the second simulator (In this case, new simulation compilation may be necessary in some local simulations. For the example above, the 2nd simulator needs a new compilation for B1, B2, and B3). We will include this derivative in our distributed-processing-based parallel simulation, too.

Except those cases, however, it is problematic to obtain s-DCP by simulating at the same level of abstraction as that of a model for distributed parallel simulation. In such cases, it is highly desirable for s-DCP to use a model at higher level of abstraction existed in the progressive refinement process, to use an optimized DUV and TB model for faster simulation, or to use the dynamic information collected from the simulation with a model at the higher level of abstraction (This is usage-method 3, and usage-method 4 mentioned earlier).

In the case of GL timing simulation, as an example, s-DCP for each of local simulation could be a RTL model or a RTL/GL mixed model, an optimized GL model for faster simulation, the dynamic information collected in a RTL simulation, or the dynamic information collected in a RTL/GL mixed simulation (For example, the input/output information of all gate-level design objects gathered from each of one or more RTL/GL mixed models. More specifically with the example of previous GL model, when a GL model is DUV (GL)=(B(1)_gl, B(2)_gl, B(3)_gl, B(4)_gl) and a RTL model is DUV(RTL)=(B(1)_rtl, B(2)_rtl, B(3)_rtl, B(4)_rtl), there are four RTL/GL mixed models, DUV(MIXED)_4=(B(1)_rtl, B(2)_rtl, B(3)_rtl, B(4)_gl), DUV(MIXED)_3=(B(1)_ rtl, B(2)_rtl, B(3)_gl, B(4)_rtl), MODEL_DUV(MIXED)_2=(B(1)_rtl, B(2)_gl, B(3)_rtl, B(4)_rtl), and MODEL_DUV(MIXED)_1=(B(1)_gl, B(2)_rtl, B(3)_rtl, B(4)_rtl). From a simulation with DUV(MIXED)_1, the input/output information for B(1)_gl is obtained. From a simulation with DUV(MIXED)_2, the input/output information for B(2)_gl is obtained. From a simulation with DUV(MIXED)_3, the input/output information for B(3)_gl is obtained. From a simulation with DUV(MIXED)_4, the input/output information for B(4)_gl is obtained. s-DCP is those four combined). In the case of RTL simulation, as an another example, s-DCP for each of local simulation could be an ESL model or an ESL/RTL mixed model, an optimized RTL model for faster simulation, the dynamic information collected in an ESL simulation, or the dynamic information collected in an ESL/RTL mixed simulation (For example, the input/output information of all RTL design objects gathered from each of one or more ESL/RTL mixed models. More specifically with the example of previous RTL model, when a RTL model is DUV(RTL)=(B(1)_rtl, B(2)_rtl, B(3)_rtl, B(4)_rtl) and an ESL model is DUV(ESL)=(B(1)_tlm, B(2)_tlm, B(3)_tlm, B(4)_tlm), there are four ESL/RTL mixed models, DUV(MIXED)_4=(B(1)_tlm, B(2)_tlm, B(3)_tlm, B(4)_rtl), DUV(MIXED)_3=(B(1)_tlm, B(2)_tlm, B(3)_rtl, B(4)_tlm), MODEL_DUV(MIXED)_2=(B(1)_tlm, B(2)_rtl, B(3)_tlm, B(4)_tlm), and MODEL_DUV(MIXED)_1=(B(1)_rtl, B(2)_tlm, B(3)_tlm, B(4)_tlm). From a simulation with DUV(MIXED)_1, the input/output information for B(1)_rtl is obtained. From a simulation with DUV(MIXED)_2, the input/output information for B(2)_rtl is obtained. From a simulation with DUV(MIXED)_3, the input/output information for B(3)_rtl is obtained. From a simulation with DUV(MIXED)_4, the input/output information for B(4)_rtl is obtained. s-DCP is those four combined). In the case of ESL simulation, as an another example, s-DCP for each of local simulation could be a ESL model at higher level of abstraction, an optimized ESL model for faster simulation, the dynamic information collected in a ESL simulation at higher level of abstraction, or the dynamic information collected in a ESL-at-higher-level/ESL-at-present-level mixed simulation (For example, the input/output information of all ESL design objects gathered from each of one or more timed-transaction/ca-transaction mixed models. More specifically with the example of previous ESL model, when a ca-tlm model is DUV(ca-tlm)=(B(1)_ca-tlm, B(2)_ca-tlm, B(3)_ca-tlm, B(4)_ca-tlm) and a timed-tlm model is DUV(timed-tlm)=(B(1)_timed-tlm, B(2)_timed-tlm, B(3)_timed-tlm, B(4)_timed-tlm), there are four timed-tlm/ca-tlm mixed models, DUV(MIXED)_4=(B(1)_timed-tlm, B(2)_timed-tlm, B(3)_timed-tlm, B(4)_ca-tlm), DUV(MIXED)_3=(B(1)_timed-tlm, B(2)_timed-tlm, B(3)_ca-tlm, B(4)_timed-tlm), MODEL_DUV(MIXED)_2=(B(1)_timed-tlm, B(2)_ca-tlm, B(3)_timed-tlm, B(4)_timed-tlm), and MODEL_DUV(MIXED)_1=(B(1)_ca-tlm, B(2)_timed-tlm, B(3)_timed-tlm, B(4)_timed-tlm). From a simulation with DUV(MIXED)_1, the input/output information for B(1)_ca-tlm is obtained. From a simulation with DUV(MIXED)_2, the input/output information for B(2)_ca-tlm is obtained. From a simulation with DUV(MIXED)_3, the input/output information for B(3)_ca-tlm is obtained. From a simulation with DUV(MIXED)_4, the input/output information for B(4)_ca-tlm is obtained. s-DCP is those four combined).

Using a model at higher level of abstraction, an optimized model for faster simulation at same level of abstraction, the dynamic information collected from the simulation with a model at higher level of abstraction, or the dynamic information collected from the simulation with an optimized model at same of abstraction for faster simulation for s-DCP, the process for getting expected inputs and expected outputs is fast as the simulation is fast.

<Enhancing the Accuracy of s-DCP or t-DCP>

Therefore, the matter is the accuracy level of s-DCP obtained. Logically, as there are model consistency between a model at high level of abstraction and a model at low level of abstraction in the progressive refinement process, it can be thought that the accuracy of s-DCP obtained from the execution of a model at high level of abstraction is high.

Ideally, if there are a complete consistency among models existed in the progressive refinement process, it is possible to execute the entire simulation without applying single run with actual input/output. It is important to have the consistency among models because more model consistency results in minimizing the number of cancellations of run with actual input/output and the total simulation time for run with actual input/output. However, it is possible and natural to maintain the high consistency among the models at the adjacent levels of abstraction (for example, a RTL model and ca-transaction model, a RTL model and a gate-level model, etc). If the accuracy of s-DCP from the simulation with a model of higher level of abstraction is not satisfactory (in the case of an incorrect model at higher level of abstraction, or the low model accuracy or low dynamic information accuracy from the higher level abstraction), the process for enhancing the accuracy of s-DCP is needed. Therefore, using a model at higher level of abstraction at the beginning, enhancing the accuracy of s-DCP from the dynamic information by simulating a more accurate model modified from an original inaccurate model at higher level of abstraction, obtaining s-DCP with high accuracy by modifying the dynamic information by simulation an incorrect model at higher level of abstraction, or obtaining s-DCP with high accuracy by statically or dynamically modifying the dynamic information by simulation an less accurate model at higher level of abstraction is possible. One example of easily building a model with high accuracy at the high level of abstraction is to decompose a model into a communication module, which is responsible for interfacing to other blocks in a model, and a computation module, which is a model method widely used for TLM (Transaction-Level Model). The input/output timing accuracy can be provided at a computation module by annotating data-independent timing data expected while the internal computation module untouched (for example, the internal computation module is written at untimed TLM, and attaching data-dependent timing data only if necessary). By doing this, the timing accuracy necessary to a model (for example, cycle-by-cycle accuracy or cycle-count accuracy) can be established at the input and output boundary of the model, as well as its high simulation speed. s-DCP with high accuracy can be obtained from such a model.

Also, it is possible to convert the specific abstraction level of a model at the input/output boundary into a different abstraction level model by attaching a transactor to transaction-level communication module, If high-level synthesis tools (such as TLM synthesis of Cynthesizer from Forte Design) is used, corresponding TLM communication module could be synthesizable and have a signal-level accuracy. From these, s-DCP with high accuracy can also be obtained. As an specific example for obtaining s-DCP with high accuracy by a modification of s-DCP, in the case of a model at ca-transaction level of timed-transaction level, as the transaction should meet an on-chip bus protocol (such as AMBA bus protocol), s-DCP accuracy can be enhanced by modifying s-DCP so that it satisfies the bus protocol correctly. As an another specific example for obtaining s-DCP with high accuracy by a modification of s-DCP, to increase the accuracy of s-DCP obtained from a RTL simulation or RTL/GL mixed simulation for a distributed-processing-based parallel gate-level timing simulation with a GL model, s-DCP can be modified by the annotation of an exact delay information (for example, clock skew delay of flipflop, clock-to-Q(high_to_low) delay and clock-to-Q(low_to_high) delay of positive-edge sensitive flipflop, clock-to-Q(high_to_low) delay and clock-to-Q(low_to_high) delay of negative-edge sensitive flipflop, asynchronous-set_to_Q delay, asynchronous-reset_to_Q delay, etc) on specific signals (for example, clock signals, output signals of flipflops contributing the input information of each local simulation, etc) in some design objects, which can come from analyzing SDF or delay parameters of cells in a library, performing a GL timing simulation for a short period or a static timing analysis, or doing any combinations of these (For the above example of a gate-level timing simulation, the efficient partition of a model for each of local simulations is a partition such that every outputs of each local design objects are the outputs of flipflops).

As an another specific example for obtaining s-DCP with high accuracy by a modification of s-DCP, to increase the accuracy of s-DCP obtained from an ESL simulation or ESL/RTL mixed simulation for a distributed-processing-based parallel simulation with a RTL model, s-DCP can be modified by the annotation of exact timing information (for example, clock-to-Q delay of flipflop, phase difference among asynchronous clocks, etc) on specific signals in some design objects, which can come from performing a RTL timing simulation for a short period.

Also, such modification of s-DCP obtaining can be done statically, but also dynamically during the execution of distributed parallel simulation. As a specific example of the dynamic modification of s-DCP and its use for expected input or expected output, in the case of a distributed-processing-based event-driven parallel simulation at RTL, as a back-end simulation, which uses expected input and expected output collected from a front-end simulation performed at ca-transaction level, at the early stage of the simulation the distributed-processing-based parallel simulation at RTL is performed with expected inputs and expected output obtained from less accurate s-DCP, which is produced from the less accurate dynamic information. But, as the progress of the distributed-processing-based parallel simulation is made, said less accurate s-DCP becomes accurate s-DCP by reflecting the simulation result dynamically (for a specific example, if a clock-to-Q delay modeling is made at RTL, e.g. 1 nsec (#1 in Verilog syntax), which is not modeled at ca-transaction level, this delay is detected at the early stage of RTL simulation and used for dynamically modifying less accurate s-DCP collected the front-end simulation at ca-transaction level into accurate s-DCP) so that the distributed-processing-based parallel simulation can be performed with expected inputs and expected output obtained from said accurate s-DCP after the early stage of the simulation (Therefore, in this scheme, at the early stage of the simulation the simulation performance could be low as the simulation with actual inputs and actual outputs is expected, but after the early stage of the simulation, its performance will be high because the simulation with accurate expected inputs and outputs are possible, thanks to the dynamic modification of s-DCP). Such a technique can also be used in a distributed-processing-based parallel timing simulation at GL. In this case, a back-end simulation at GL uses expected input and expected output collected from a front-end simulation performed at RTL, at the early stage of the simulation the distributed-processing-based parallel timing simulation at GL is performed with expected inputs and expected output obtained from less accurate s-DCP, which is produced from the less accurate dynamic information. But, as the progress of the distributed-processing-based parallel timing simulation is made, said less accurate s-DCP becomes accurate s-DCP by reflecting the simulation result dynamically so that the distributed-processing-based parallel simulation can be performed with expected inputs and expected output obtained from said accurate s-DCP after the early stage of the simulation.

Therefore, in this present invention, we will call any of processes, which increase the accuracy of s-DCP, a process for s-DCP with enhanced accuracy. But, if original s-DCP is not the dynamic information collected during the earlier simulation, but a model at higher level of abstraction, said process for s-DCP with enhanced accuracy is a process in the simulation, which enhances the accuracy of dynamic information collected during the simulation with original s-DCP, i.e. a model at higher level of abstraction. Especially, any of processes for increasing the accuracy of s-DCP dynamically during the execution of back-end simulation from original less accurate s-DCP, which could be the simulation result of earlier front-end simulation, a model at higher level of abstraction, or an optimized model for faster simulation, is called a "process for s-DCP accuracy enhancement by dynamic learning".

There are more examples for enhancing s-DCP accuracy. One of them is to get s-DCP (2nd s-DCP) with enhanced accuracy by performing one or more parallel simulation with design objects in DUV, or DUV at lower level of abstraction with original s-DCP or t-DCP (1st s-DCP or t-DCP), which is obtained from the simulation with a model at higher level of abstraction (these two models has partial hierarchy matching relation so that said design objects at lower level of abstraction have corresponding design objects at higher level of abstraction). For more detail, the simulations for each of said design objects with 1st s-DCP as the input (such simulations can be totally independent with each other) can produce the outputs from each of said design objects, and 2nd s-DCP can be obtained from those outputs and it has higher accuracy. For another specific example, a simulation with a model at lower level of abstraction using 1st t-DCP obtained from earlier simulation with a model at higher level of abstraction is performed in temporally parallel by divided simulation time slices (TPE-based parallel simulation), and input values and output values of each design objects in DUV are collected to produce 2nd s-DCP with enhanced accuracy. For another example for s-DCP accuracy enhancement, s-DCP with enhanced accuracy can be obtained from the time alignment of two or more dynamic informations of design objects, whose union forms a model at lower level of abstraction, collected during two or more simulations with two or more models at mixed level of abstraction run in parallel s-DCP (The time alignment of dynamic informations means to align every dynamic informations in time because each of dynamic informations gathered may be skewed with other due to the model inaccuracy at higher level of abstraction. This time alignment can be done efficiently at transaction level, because the beginning of a specific transaction could be a reference point). For another example for s-DCP accuracy enhancement, the comparisons between expected inputs and actual inputs, or expected outputs and actual outputs in local simulation of distributed-processing-based parallel simulation are done at transaction level. Comparing actual values with expected values at transaction level can easily detect any on-chip protocol violation of expected values so that they can be corrected accordingly (For a specific example of comparison, the comparison can be done in the unit of transaction first, and in the unit of cycle next for finding an expected transaction matched with an actual transaction. Therefore, when the comparison is made in the unit of transaction, the absolute time of simulation is not used for the comparison between an expected transaction and an actual transaction. Instead, the transaction semantic should be used for matching. For example, even though the start time and end time of a specific expected transaction is 1,080 ns and 1,160 ns respectively and the start time and end time of its corresponding actual transaction is 1,000 ns and 1,080 ns, two transactions should be matched if their transaction semantic is same. The mismatch in the absolute time of simulation may come from a less accurate model at higher level of abstraction, or the lost of corresponding information by abstraction. Therefore a matching between an expected value and an actual value can take count of it. Also, between transactions at different levels, or transaction at a specific level and its refined RTL sequence, their appearing order could be different as well as the simulation time. For example, between a transaction T_timed={T1, T2, T3, T4} at timed-transaction level and its refined transaction T_ca={T3, T1, T4, T2} where T3={t31, t32}, T1={t11, t12, t13, t14}, T4={t41, t42}, and T2={t21, t22, t23} (tij: cycle-unit ca-transaction, e.g. a timed-transaction T3 is made of two ca-transaction, t31 and t32), their order and their simulation times are different. But they can be matched with each other semantically at timed-transaction level. A matching between an expected value and an actual value should take count of it, too).

Such a process for s-DCP with enhanced accuracy using transaction-level s-DCP is called "s-DCP accuracy enhancement by transaction transformation". Such s-DCP enhancement by transaction transformation is possible with the dynamic information obtained from a simulation model at higher level of abstraction during the execution of a local simulation if s-DCP is a simulation model at higher level of abstraction. Also, when a local design object for a local simulation is executed on a hardware-based verification platform (for example, an FPGA board connected to a computer with simulation acceleration capability) and s-DCP of said local simulation is a DUV and TB at higher level of abstraction, it is more general said s-DCP is not simulated in said hardware-based verification platform, but simulated in a computer connected to it for generating expected inputs and expected outputs. In such a situation, the communication between said hardware-based verification platform where said local design object exists and said computer where TB exists is possible in either signal level or transaction level (for the case of transaction level, a transactor should be realized in said hardware-based verification platform).

Said simulation method with expected input and expected output can increase not only the simulation performance of distributed parallel simulation using two or more processors, but also the performance of simulation with a single processor which has two or more processes or threads so that there are inter-process communication overhead and process synchronization overhead because those overheads are also greatly reduced.

With t-DCP, TPE-based parallel simulation is possible. With s-DCP, DPE-based parallel simulation is possible. In TEP-based parallel simulation, the entire simulation time is decomposed into two or more simulation-time sub-intervals (we'll call these slices), and each of slices is simulated independently. In DEP-based parallel simulation, the entire design object (DUV and TB) is partitioned into two or more smaller design objects, and each of these design objects are simulated by each of local simulators in distributed parallel fashion.

It is desirable to use a design object at specific level of abstraction in the regression test or when the design is modified locally, and to use a design object at higher level of abstraction for obtaining t-DCP or s-DCP fast with high accuracy.

The detailed explanation of three usage methods in TPE-based parallel simulation is followed. In usage method 1, the state information of a model at higher level of abstraction is collected at one or more specific simulation points or periods in time and translated into the state information of a model at lower level of abstraction at one or more those specific simulation points or periods (for detail on the translation, see Korean patent application 10-2005-116706), and the simulation with a model at lower level of abstraction is performed in parallel over entire slices or for some special slice. In usage method 2, the state information of two or more models at mixed level of abstraction is collected at one or more specific simulation points or periods in time and the state information of a model at lower level of abstraction is extracted from it (the state information of two or more models at mixed level of abstraction) at one or more those specific simulation points or periods, and the simulation with a model at lower level of abstraction is performed in parallel over entire slices or for some special slice (See FIG. 6). The detailed explanation for TPE will be omitted in this present invention because the detailed can be found in Korean patent application 10-2005-116706. Like obtaining s-DCP at higher level of abstraction, the accuracy of t-DCP obtained at higher level of abstraction could be low, therefore it may be necessary to increase its accuracy. To do this, the state information of a model at higher level of abstraction saved in front-end simulation from simulation time T_f to simulation time T_r needs to set at T_f (or at earlier than t_f), i.e. forcing the state value, and release at T_r, i.e. releasing the state value, for the model while maintaining its input information unchanged after T_r as the simulation time advances to a certain time T_s. The design state information at T_s is t-DCP with enhanced accuracy (if there are a source of an user clock in DUV, e.g. PLL, the value of this signal at T_r should be unchanged after T_r). If there are two or more asynchronous user clocks and there is some event in an user clock between T_r and T_s, the above process should be repeated.

Also, it is possible to get 1st t-DCP with low accuracy by the misalignment in time of the dynamic information due to the less accurate model at higher level of abstraction. Such a case, the time alignment explained for a process for s-DCP with enhanced accuracy can increase the accuracy of t-DCP, too. It is called any process to increase the accuracy of t-DCP a process for t-DCP with enhanced accuracy. Parallel simulation method using t-DCP in this present invention is called TPE-based parallel simulation using t-DCP, or time-sliced parallel simulation.

The simulation method proposed in the present invention can increase the simulation speed at the simulation with a model at lower level of abstraction using the simulation result from the simulation with a model at the higher level or mixed level of abstraction, but also examine the model consistency between a model at higher level of abstraction and a model at lower level of abstraction.

In DPE and TPE, both front-end simulation and back-end simulation can use same design at a specific level of abstraction, but in general two designs at two different levels of abstraction. For front-end simulation whose purpose to obtain s-DCP or t-DCP fast as much as possible, a model at higher level of abstraction is used. For back-end simulation which is for the original simulation, a model at lower level of abstraction is used (But, as already mentioned, front-end simulation is not mandatory because s-DCP for a distributed-processing-based parallel simulation could be a model at higher level of abstraction, or an optimized model for faster simulation).

For executing a simulation, i.e. front-end simulation, executed in advance fast, it is possible to run a distributed-processing-based parallel simulation using s-DCP obtained from even earlier simulation, or a conventional distributed parallel simulation.

Moreover, if distributed-processing-based parallel simulation proposed in this present invention and incremental simulation, in which the result of earlier simulation is reused for faster simulation after one or more design objects are modified, proposed in Korean patent application 10-2004-93310 are used together, another efficient simulation with a derivative of distributed-processing-based parallel simulation method is possible. When a distributed-processing-based parallel simulation is performed by using the dynamic information (state information, input information, output information, etc) collected during the earlier simulation after one or more design objects are modified due to debugging or specification change, the active local simulations (this could be even a single simulation S_s) in a distributed-processing-based parallel simulation could be only for those local design objects modified (and possibly some local design object such as TB design object) from the beginning of simulation, i.e. simulation time 0, to the simulation time ts, and then all local simulations (including local simulation S_l(i) changed from S_s without simulation compilation) become active for all local design objects only after ts. Before becoming active at ts, each of inactive local simulations should restore the state information of corresponding local design objects saved in the previous simulation performed before the design modification (It is very important to decide the right time for ts, which should be located far from the simulation time 0 as much as it can, and up to which the simulation result of unmodified local design objects should be same as one performed before the design modification. For more detail, refer to Korean patent application 10-2004-93310). In this present invention, we will call this kind of simulation method using both distributed-processing-based parallel simulation and incremental simulation "distributed-processing-based parallel simulation using incremental simulation" or "distributed-processing-based parallel simulation method using incremental simulation". The detail of incremental simulation can be found in Korean patent application 10-2004-93310.

FIG. 16 is a schematic diagram of an example of a part of a model for the simulation method in this present invention.

FIG. 17, FIG. 18 and FIG. 19 are schematic diagrams of an example of parts of the instrumentation code added to the model partially depicted in FIG. 16 for a distributed-processing-based parallel simulation by the verification software in this present invention.

FIG. 20 is a schematic diagram of an example of a combined method of distributed-processing-based parallel execution/singular execution.

Figure 21:
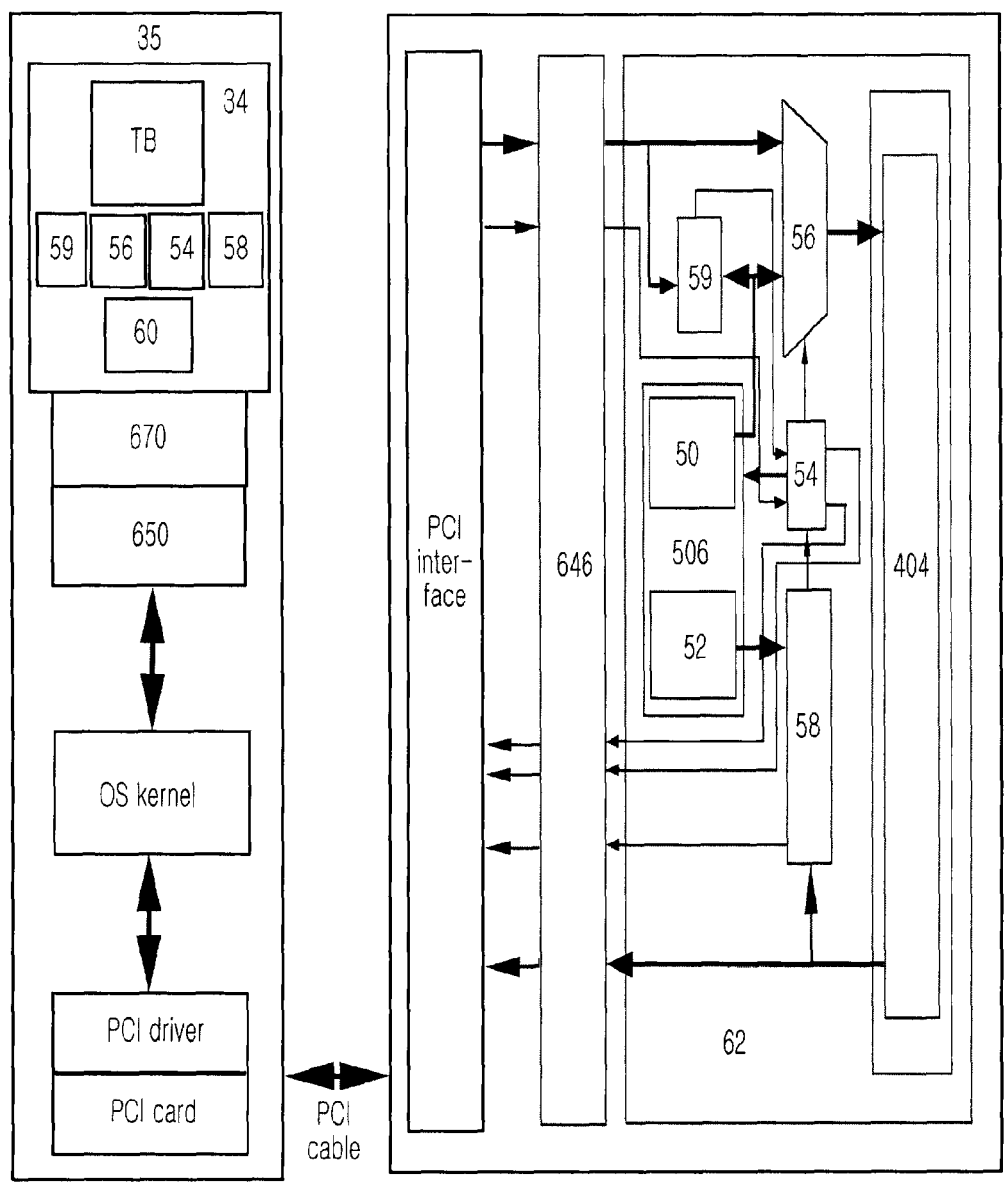
FIG. 21 is a schematic diagram of an example of the situation in which the synchronization overhead and communication overhead between a simulator and a hardware-based verification platform of simulation acceleration is reduced by distributed-processing-based parallel execution in this present invention.

FIG. 21 is a schematic diagram of an example of the situation in which the synchronization overhead and communication overhead between a simulator and a hardware-based verification platform of simulation acceleration is reduced by distributed-processing-based parallel execution in this present invention.

In FIG. 21, computer 35 includes HDL simulator 34. HDL simulator may include 54 (Control module of run-with-expected-input&output/run-with-actual-input&output), 56 (Selection module of expected-input/actual-input), 58 (Compare module of expected-output/actual-output), 59 (Compare module of expected-input/actual-input), and 60 (s-DCP generation/save module). Reference numeral 670 denotes VPI/PLI/FLI and reference numeral 650 denotes simulation acceleration run-time module.

Also, hardware-based verification platform 648 is shown. Internal structure of hardware-based verification platform 648 is similar to the one shown in FIG. 8. Reference numeral 646 denotes communication and synchronization module for simulation acceleration; reference numeral 62 denotes instrumentation code added to a design under verification by the verification software.

This hardware-based verification platform 648 may be connected to computer 35 by PCI cable.

The conventional simulation acceleration can be thought as a distributed parallel simulation which has two local simulations. One of these two local simulation is the local simulation acceleration using a local hardware-based verification platform, in which a synthesizable design object in a model (DUV, in general) is implemented on one or more FPGA or Boolean processors, the other is the local simulation using a local simulator, in which a non-synthesizable design object in a model (TB, in general) is executed. The local hardware-based verification platform and the local simulator are connected physically (for example, with PCI) so that they are co-simulated. Therefore, the distributed-processing-based parallel simulation proposed in this present invention can be applied to the conventional simulation acceleration for reducing the communication overhead and synchronization overhead between a hardware-based verification platform and a simulator without any modification.

For roll-back of design objects executed in a hardware-based verification platform, the roll-back feature of commercial hardware-based verification platforms (for example, Palladium series/Extreme series from Cadnece, Vstation series from Mentor, ZeBu series from EVE, Gemini series from Fortelink, Hammer series from Tharas, etc) can be used, the output-probing input-probing method in U.S. Pat. No. 6,701,491 can be used, or the shadow register for flipflops and latches in said design objects can be used for saving and restarting the corresponding design state information.

Each of local simulations in the distributed parallel simulation presented in this present invention could be executed by a simulator, or a hardware-based verification platform (simulation accelerator, hardware emulator, or prototyping board) if the model for verification is entirely or partially synthesizable. If the simulator is used for the local simulation, the simulator could be an event-driven Verilog simulator, SystemVerilog simulator, VHDL simulator or SystemC simulator, a cycle-based SystemC simulator, VHDL simulator, Verilog simulator or SystemVerilog simulator, an instruction-level simulator, a Vera simulator, an e simulator, or any arbitrary simulator for IC.

Therefore, one or more local simulations in a distributed parallel simulation could be event-driven simulation, and other local simulation could be cycle-based simulation (For example, the on-chip bus design object (420) in FIG. 5 is executed by a cycle-based simulation, other design objects (380, 381, 382, 383, 384, 385) are executed by event-driven simulations. Or, some design object, say 381, can be implemented in FPGA and executed in simulation acceleration mode, and other design objects are executed by event-driven simulations). Of course, all local simulations can be executed by event-driven simulation (such event-driven distributed parallel simulation is called PDES (Parallel Distributed Event-driven Simulation)), or all local simulations can be executed by cycle-based simulation, etc. in summary, the distributed parallel simulation environment in this present invention could be configured in various forms.

FIG. 22 is a schematic diagram of an example of logical connection topology among two or more local simulators installed in two or more computers for a distributed-processing-based parallel simulation in this present invention.

There could be other logical connection topology among two or more local simulators installed in two or more computers for a distributed-processing-based parallel simulation.

Figure 23:
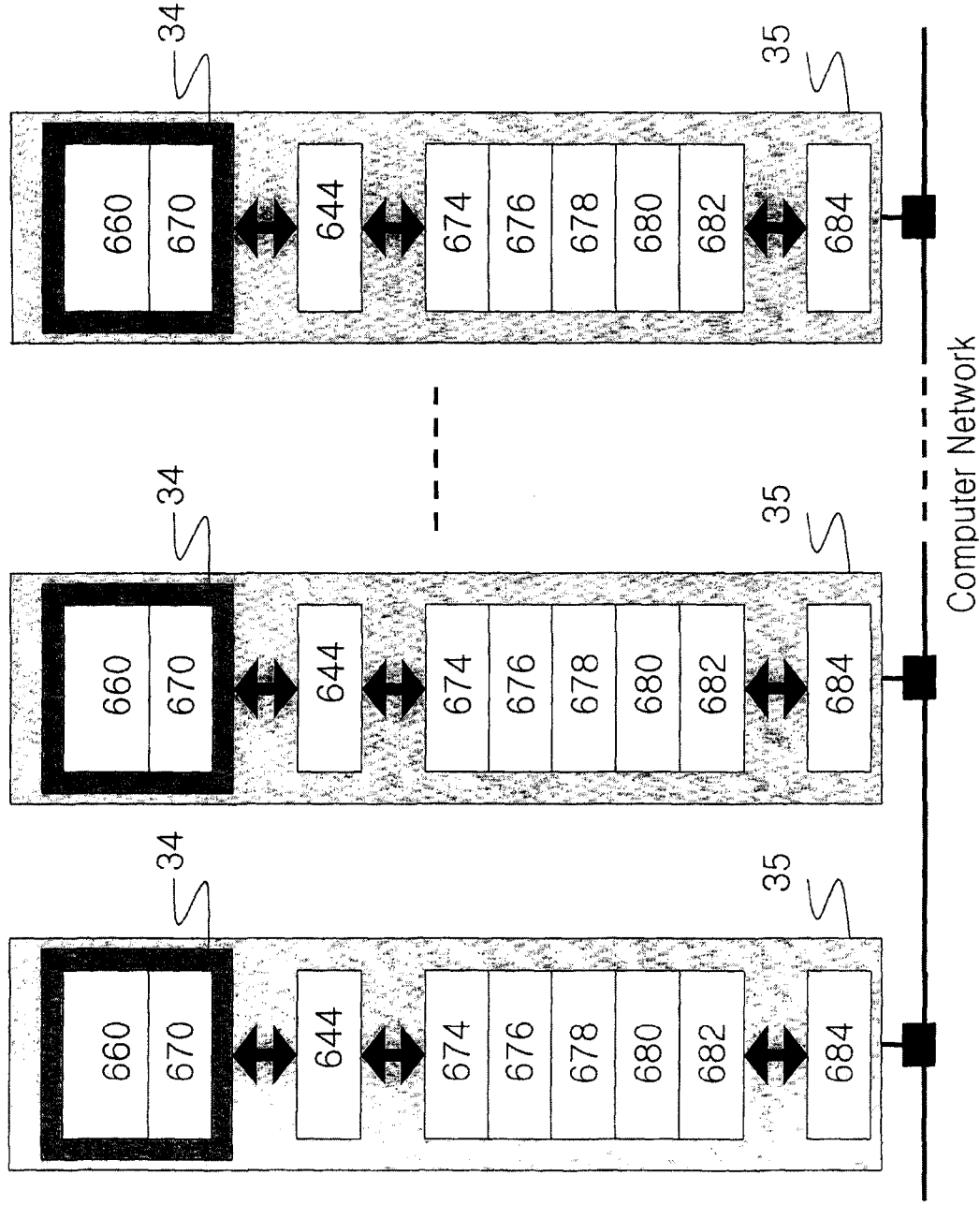
FIG. 23 is a schematic diagram of an example of a distributed parallel simulation environment which is consisted of two or more computers and two or more simulators.

FIG. 23 is a schematic diagram of an example of a distributed parallel simulation environment which is consisted of two or more computers and two or more simulators.

Computer 35 includes HDL simulator 34 which comprises design object 660 in a model partitioned to be executed in a local simulator of distributed parallel simulation and VPI/PLI/FLI 670.

In FIG. 23, reference numeral 644 denotes local simulation run-time module for distributed parallel simulation; reference numeral 674 denotes socket API; reference numeral 676 denotes TCP/IP socket; reference numeral 678 denotes device API; reference numeral 680 denotes Device Driver; reference numeral 682 denotes HAL (Hardware Abstraction Layer); and reference numeral 684 denotes Giga-bit LAN card.

This environment could be an environment of distributed-processing-based parallel simulation in this present invention.

Figure 24:
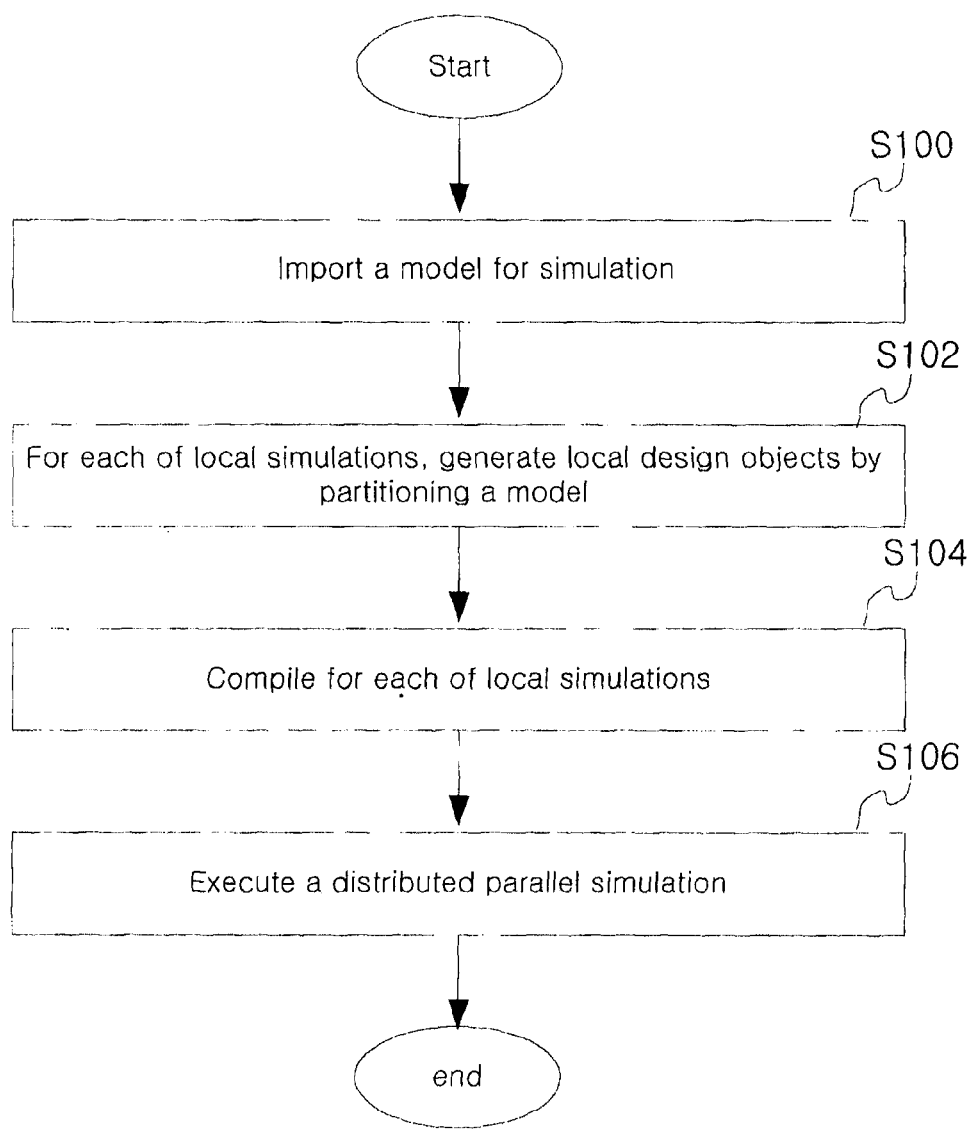
FIG. 24 is an example of the overall flow diagram of the conventional distributed parallel simulation.

FIG. 24 is an example of the overall flow diagram of the conventional distributed parallel simulation.

Therefore, it is possible to exist other flow diagrams for the distributed parallel simulation.

In FIG. 24, a model for simulation is imported (S100). Then, for each of local simulations, local design objects are generated by spatially partitioning a model (S102). Then, compiling for each of local simulations is performed (S104). Then, a distributed parallel simulation is performed (S106).

Figure 25:
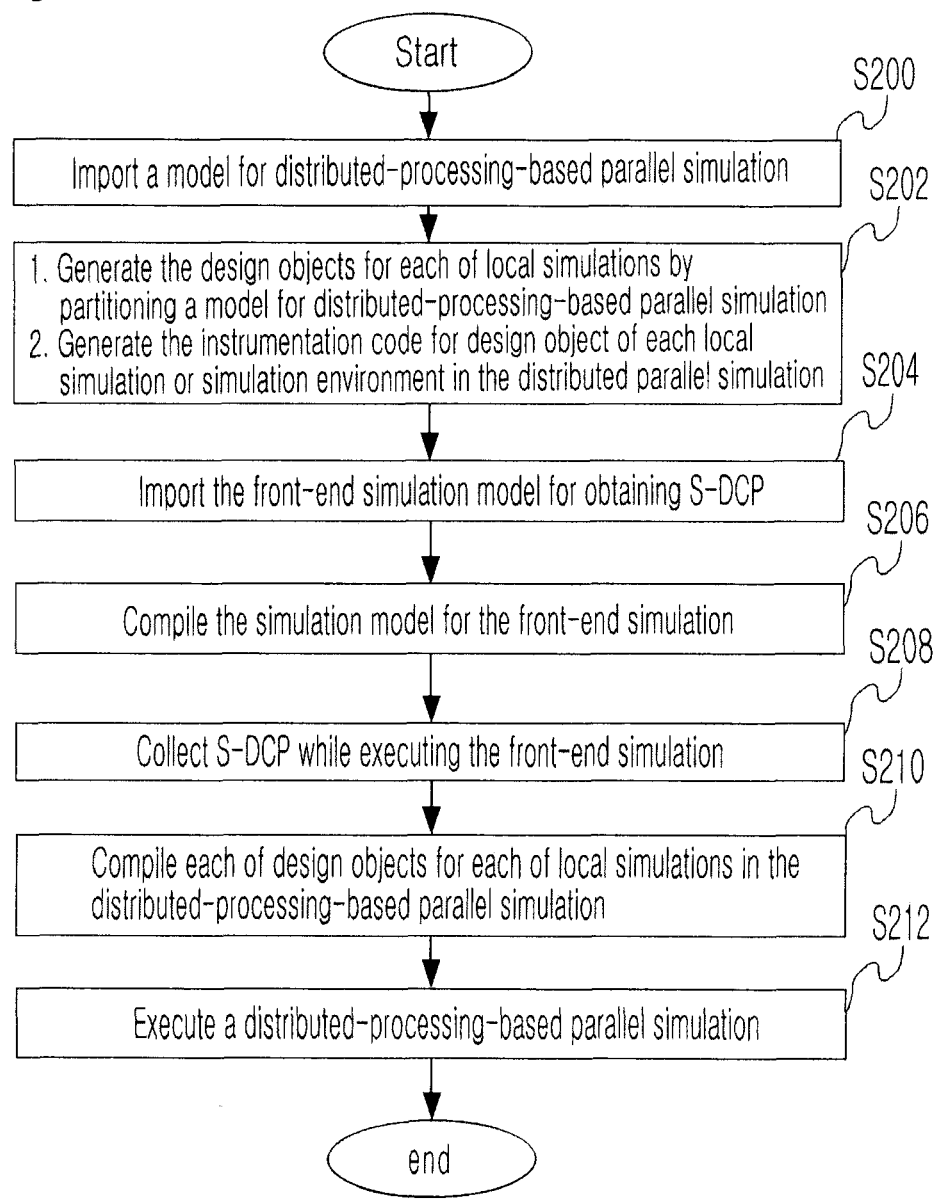
FIG. 25 is an example of the overall flow diagram of the distributed-processing-based parallel simulation in this present invention.

FIG. 25 is an example of the overall flow diagram of the distributed-processing-based parallel simulation in this present invention.

Therefore, it is possible to exist other flow diagrams for the distributed-processing-based parallel simulation.

Also, the execution order of the sub-blocks (for example, S200, S202, S204, S206, S208, S210, or S212 in FIG. 25) can be changed if it is not disturb the correct execution of the entire processes, or more than one sub-block can be executed at the same time if it is also not disturb the correct execution of the entire processes.

In FIG. 25, the overall flow diagram of the distributed-processing-based parallel simulation is explained; and it consists of eight sub-blocks excluding start and end.

According to the one embodiment, it is determined whether actual outputs match with the expected outputs obtained, wherein the actual outputs are outputs obtained from an execution in which the at least one local simulation among the plurality of local simulations is executed independently with other local simulations by using the expected inputs as inputs of simulation for local design object corresponding to the local simulation while omitting a communication and a synchronization with other local simulations.

Then, if it is determined that the actual outputs do not match with the expected outputs in the prior step, at least one local simulation among the plurality of local simulations is executed by using actual inputs as inputs of simulation for local design object corresponding to the local simulation, wherein the actual inputs are inputs obtained from an execution in which at least one local simulation is executed while performing a communication and a synchronization with other local simulations.

As an example, these flows may be embodied as follows.

At step S200, a model for distributed-processing-based parallel simulation is imported. The flow proceeds to the step S202. At step S202, the design objects for each of local simulations are produced by partitioning a model for distributed-processing-based parallel simulation. The instrumentation code for design object of each local simulation or simulation environment (for example, SW server module that exists in the central computer in the logical connecting structure of star topology) in the distributed parallel simulation is generated. The flow proceeds to the step S204. At step S204, the front-end simulation model for obtaining S-DCP is imported. The flow proceeds to the step S206. At step 3206, the simulation model for the front-end simulation is compiled. The flow proceeds to the step S208. At step S208, S-DCP is collected in the execution of front-end simulation. The flow proceeds to the step S210. At step S210, each of design objects for each of local simulations in the distributed-processing-based parallel simulation are compiled. The flow proceeds to step S212. During these compilations, the instrumentation codes added at step S202 are also compiled together. At step S212, the distributed-processing-based parallel simulation is executed, and the whole processes are terminated.

Figure 26:
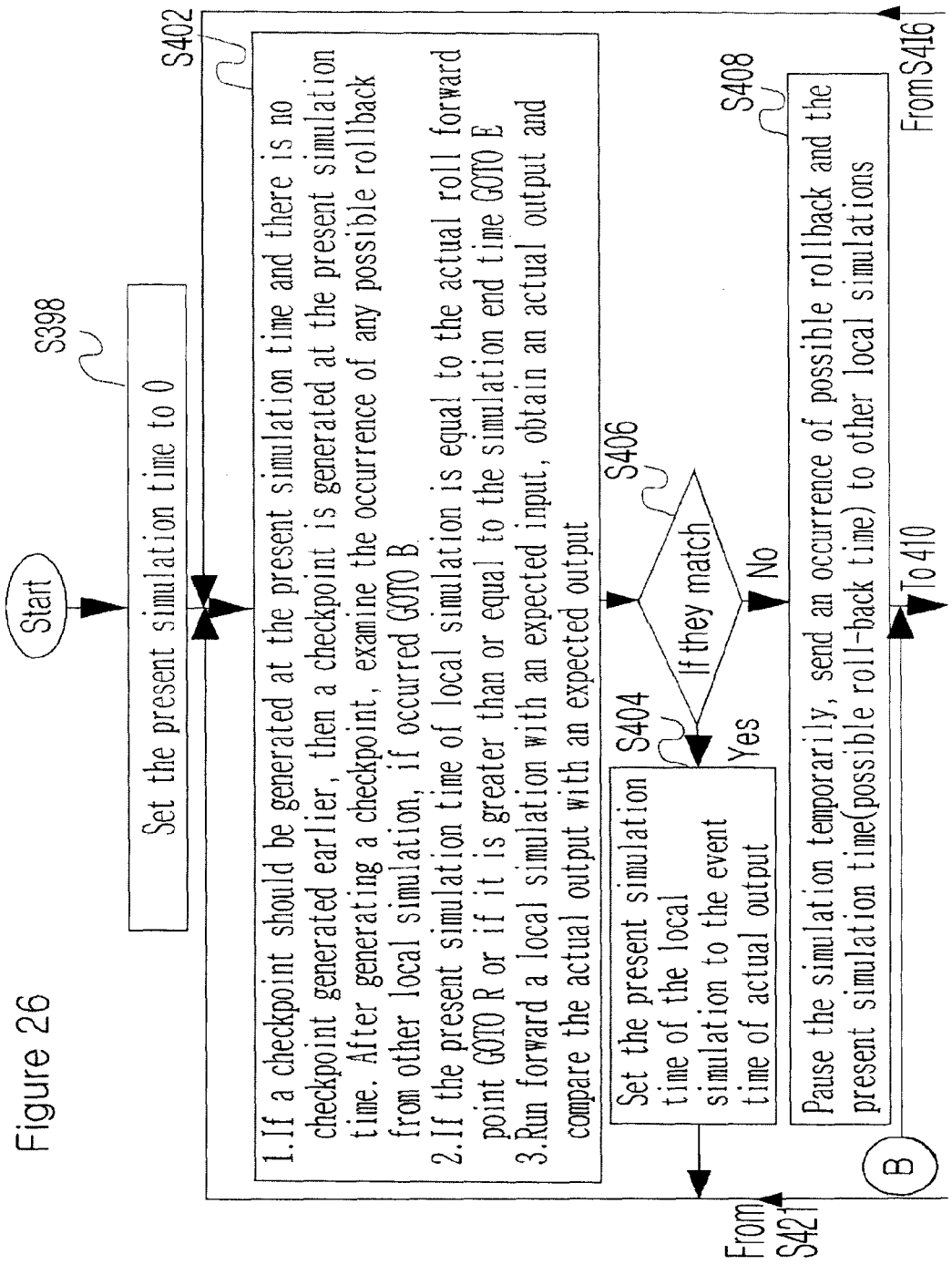
FIG. 26 is an example of the overall flow diagram for the execution of the local simulation for the execution of distributed-processing-based parallel simulation in this present invention.
Figure 26:
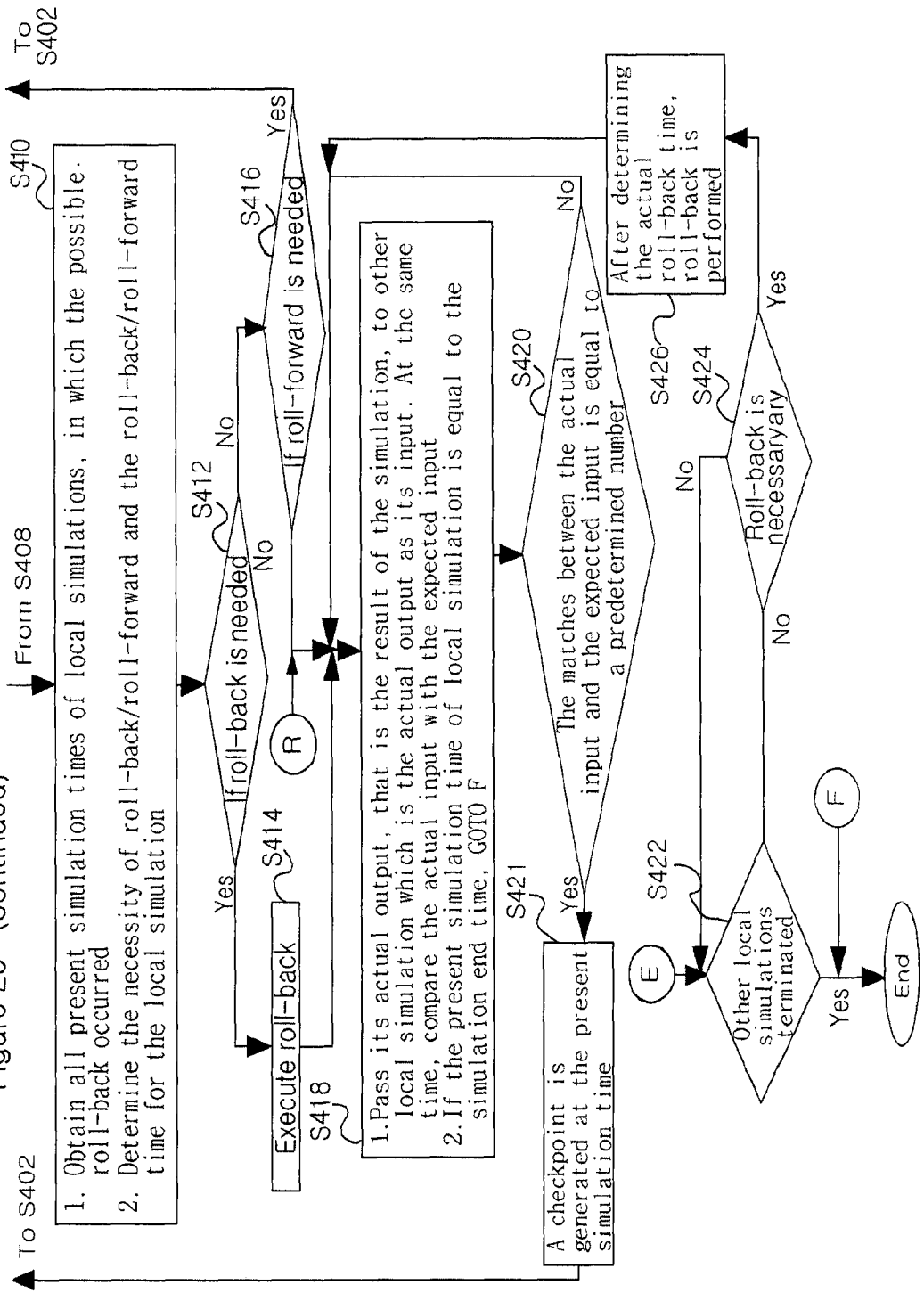

FIG. 26 is an example of the overall flow diagram for the execution of the local simulation for the execution of distributed-processing-based parallel simulation (sub-block S212 in FIG. 25) in this present invention.

Therefore, it is possible to exist other flow diagrams for the execution of distributed-processing-based parallel simulation. Also, the execution order of the sub-blocks can be changed if it is not disturb the correct execution of the entire processes, or more than one sub-block can be executed at the same time if it is also not disturb the correct execution of the entire processes.

In FIG. 26, the flow diagram is consisted of fifteen sub-blocks excluding start and end. At step S398, the present simulation time is set to 0, and the flow proceeds to step S402. At step S402, if a checkpoint should be generated at the present simulation time and there is no checkpoint generated earlier, then a checkpoint is generated at the present simulation time. After generating a checkpoint, examine the occurrence of any possible rollback from other local simulation and go to step S410 if occurred. Otherwise, the flow proceeds to step S418 if the present simulation time of local simulation is equal to the actual roll-forward time, or it proceeds to step S422 if it is greater than or equal to the simulation end time. If none of these holds, run forward a local simulation with an expected input, obtain an actual output, and compare the actual output with an expected output. Then, the flow proceeds to step S406. At step S406, if the correct output and the expected output obtained at step S402 match, proceed to step S404, or proceed to step S408 if no match. At step S404, set the present simulation time of the local simulation to the event time of actual output (the time of actual output change happening), and proceed to step S402. At step S408, pause the simulation temporarily, send an occurrence of possible roll-back and the present simulation time (the possible roll-back time) to other local simulations, then proceed to step S410. At step S410, all present simulation times of local simulations, in which the possible roll-back occurred, are obtained and the necessity of roll-back/roll-forward and the roll-back/roll-forward time for the local simulation is determined from the all rollback produce possibility local simulations. Then, the flow proceeds to step S412.

In other words, every local simulation times $T\_rb=(t\_rb(1), t\_rb(2), \ldots, t\_rb(N-1), t\_rb(N))$, (where, $t\_rb(i)$ indicates the possible roll-back time for local simulation i, in which the possible roll-back occurred) become a set of possible roll-back times. The actual roll-back time T_rb(FINAL) is the smallest value among t_rb(1), t_rb(2), ..., t_rb(N−1), and t_rb(N). i.e. the earliest time among them (in equation, T_rb (FINAL)=min(t_rb(1), t_rb(2), ..., t_rb(N−1), t_rb(N))). If the present simulation time of a specific local simulation LP(k), t_c(k), is equal or greater than T_rb(FINAL), a roll-back requires for said local simulation LP(k). It t_c(k) is smaller than T_rb(FINAL), then a roll-forward requires for LP(k).

At step S412 if roll-back is needed, the flow proceeds to S414. Or, the flow proceeds to S416. At step S416, if roll-forward is needed, the flow proceeds to step S402, otherwise, the flow proceeds to step S418. At step S414, the roll-back for the local simulation is executed, and then the flow proceeds to step S418. At step S418, the simulation with actual input is performed, and passes its actual output, that is the result of the simulation, to other local simulation which is the actual output as its input. At the same time, the comparison is made with the actual input and the expected input. If the present simulation time of local simulation is equal to the simulation end time, then the flow proceeds to the end for termination. If not, the flow proceeds to step S420. At step S420, the number of matches of the comparison between the actual input and the expected input made at step S418 is equal to a predetermined number (for example, three times), then the flow proceeds to step S421. Otherwise, the flow proceeds to step S418. At step S422, if all of other local simulations end, then terminate the local simulation. Otherwise, the flow proceeds to step S424. At step S424, if the roll-back is required, then the flow proceeds to step S426. Otherwise, the flow proceeds to step S422. At step S426, the roll-back is performed after determining the actual roll-back time, then proceed to step S418.

At least one local simulation among the plurality of local simulations is executed while performing at least one checkpoint, the checkpoint being performed for roll-back which can happen in the future. The checkpoint is exemplified as X marks in FIGS. 6 and 12.

In performing a local simulation, the next steps may be provided.

(e1) determining whether the actual outputs match with the expected outputs obtained in the step (a), wherein the actual outputs are outputs obtained from an execution in which the at least one local simulation among the plurality of local simulations is executed independently with other local simulations by using the expected inputs as inputs of simulation for local design object corresponding to the local simulation while omitting a communication and a synchronization with other local simulations;

(e2) if the actual outputs do not match with the expected outputs in the step (e1), informing other local simulations of an occurrence of mismatch and a corresponding simulation time at which the mismatch occurred, (e3) in each of the local simulations, determining whether the roll-back is needed by comparing the corresponding simulation time informed by the local simulation in which the mismatch occurred in the step (e2) to a current simulation time, and performing the roll-back if it is determined that the roll-back is needed, and (e4) executing at least one local simulation among the plurality of local simulations by using the actual inputs as inputs of simulation for local design object corresponding to the local simulation, wherein the actual inputs are inputs obtained from an execution in which the at least one local simulation is executed while performing a communication and a synchronization with other local simulations.

Alternatively, in performing a local simulation, the next steps may be provided.

(f1) determining whether the actual outputs match with the expected outputs obtained in the step (a), wherein the actual outputs are outputs obtained from an execution in which the at least one local simulation among the plurality of local simulations is executed by using the expected inputs as inputs of simulation for local design object corresponding to the local simulation while omitting a communication and a synchronization with other local simulations;

(f2) if the actual outputs do not match with the expected outputs in the step (f1), informing other local simulations of an occurrence of mismatch and a corresponding simulation time t_d at which the mismatch occurred, (f3) in each of the local simulations, comparing the corresponding simulation time t_d, which is informed by the local simulation in which the mismatch occurred in the step (f2), to a current simulation time t_d of each of local simulations, (f4) setting the current simulation time of every local simulation identical by either determining that a roll-back is needed if the time t_c is later than the time t_d (i.e., t_c>t_d) and performed a roll-back, or determining that a roll-forward is needed if the time t_c is earlier than the time t_d (i.e., t_c<t_d) and performing a roll-forward, and (f5) executing every local simulation by using actual inputs as inputs of simulation for local design object corresponding to the local simulation, wherein the actual inputs are inputs obtained from an execution in which the every local simulation is executed while performing a communication and a synchronization with other local simulations.

Figure 27:
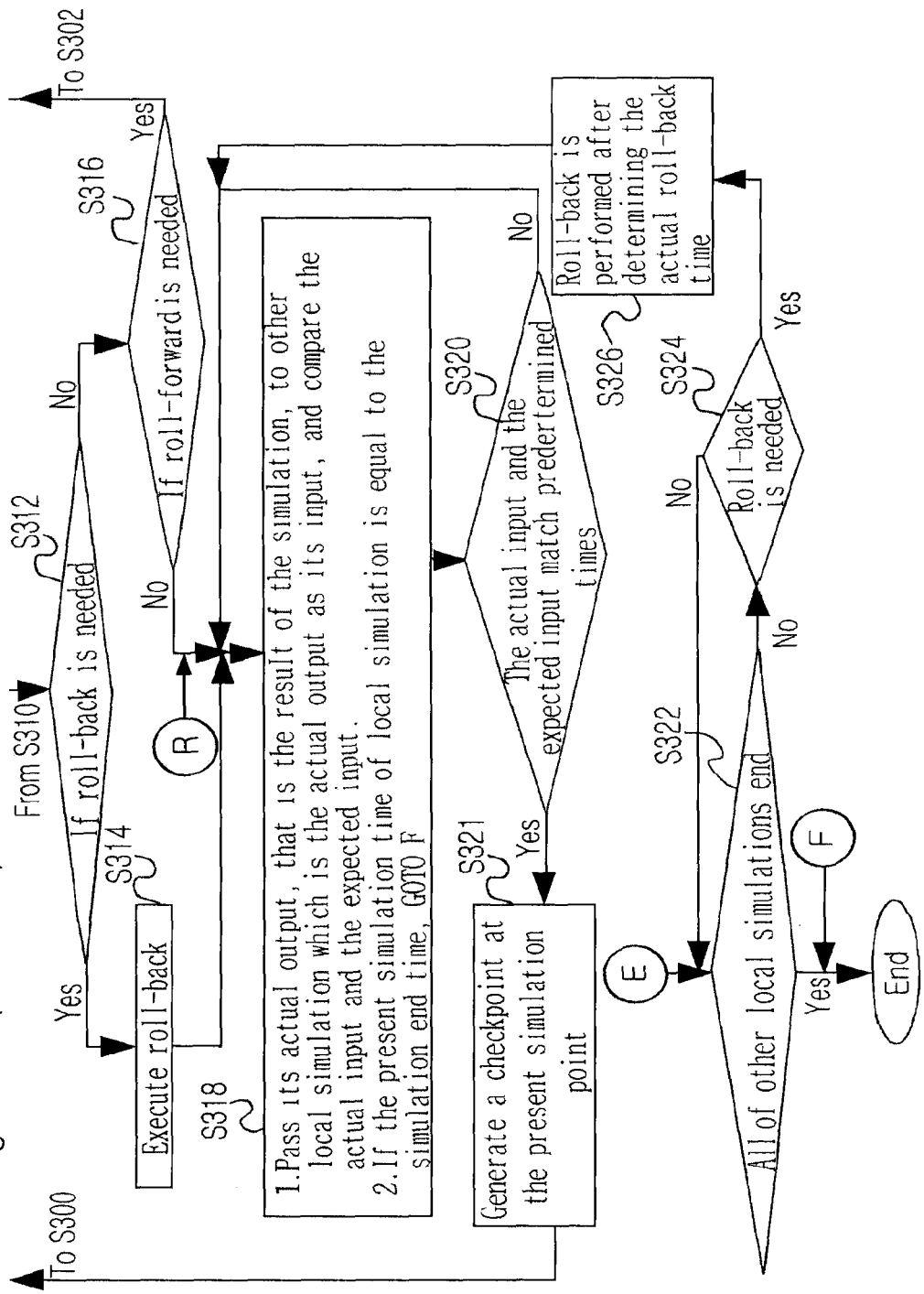
FIG. 27 is another example of the overall flow diagram for the execution of the local simulation for the execution of distributed-processing-based parallel simulation in this present invention.

Details for these steps are shown as flow charts in FIGS. 26-29, especially in FIGS. 26 and 27.

FIG. 27 is another example of the overall flow diagram for the execution of the local simulation for the execution of distributed-processing-based parallel simulation (sub-block S212 in FIG. 25).

Therefore, it is possible to exist other flow diagrams for the execution of distributed-processing-based parallel simulation. Also, the execution order of the sub-blocks can be changed if it is not disturb the correct execution of the entire processes, or more than one sub-block can be executed at the same time if it is also not disturb the correct execution of the entire processes.

In FIG. 27, the flow diagram is consisted of sixteen sub-blocks excluding start and end. At step S298, the present simulation time is set to 0, and the flow proceeds to step S300. At step S300, if the possible roll-back is occurred in other local simulation, the flow proceeds to step S310, otherwise proceeds to step S302. At step S302, if a checkpoint should be generated at the present simulation time and there is no checkpoint generated earner, then a checkpoint is generated at the present simulation time. The flow proceeds to step S318 if the present simulation time of local simulation is equal to the actual roll-forward time, or it proceeds to step S322 if it is greater than or equal to the simulation end time. If none of these holds, run forward a local simulation with an expected input, obtain an actual output, and compare the actual output with an expected output. Then, the flow proceeds to step S306. At step S306, if the correct output and the expected output obtained at step S302 match, proceed to step S304, or proceed to step S308 if no match. At step S304, set the present simulation time of the local simulation to the event time of actual output (the time of actual output change happening), and proceed to step S302. At step S308, pause the simulation temporarily, send an occurrence of possible rollback and the present simulation time (the possible roll-back time) to other local simulations, then proceed to step S310. At step S310, all present simulation times of local simulations, in which the possible roll-back occurred, are obtained and the necessity of roll-back/roll-forward and the roll-back/roll-forward time for the local simulation is determined, from the all rollback produce possibility local simulations. Then, the flow proceeds to step S312.

In other words, every local simulation times T_rb=(t_rb(1), t_rb(2), . . . , t_rb(N−1), t_rb(N)), (where, t_rb(i) indicates the possible roll-back time for local simulation i, in which the possible roll-back occurred) become a set of possible roll-back times. The actual roll-back time T_rb(FINAL) is the smallest value among t_rb(1), t_rb(2), . . . , t_rb(N−1), and t_rb(N). i.e. the earnest time among them (in equation, T_rb (FINAL)=min(t_rb(1), t_rb(2), . . . , t_rb(N−1), t_rb(N))). If the present simulation time of a specific local simulation LP(k), t_c(k), is equal or greater than T_rb(FINAL), a rollback requires for said local simulation LP(k). It t_c(k) is smaller than T_rb(FINAL), then a roll-forward requires for LP(k).

At step S312 if roll-back is needed, the flow proceeds to S314. Or, the flow proceeds to S316. At step S316, if roll-forward is needed, the flow proceeds to step S302, otherwise, the flow proceeds to step S318. At step S314, the roll-back for the local simulation is executed, and then the flow proceeds to step S318. At step S318, the simulation with actual input is performed, and passes its actual output, that is the result of the simulation, to other local simulation which is the actual output as its input. At the same time, the comparison is made with the actual input and the expected input. If the present simulation time of local simulation is equal to the simulation end time, then the flow proceeds to the end for termination. If not, the flow proceeds to step S320. At step S320, the number of matches of the comparison between the actual input and the expected input made at step S318 is equal to a predetermined number (for example, three times), then the flow proceeds to step S321. Otherwise, the flow proceeds to step S318. At step S322, if all of other local simulations end, then terminate the local simulation. Otherwise, the flow proceeds to step S324. At step S324, if the roll-back is required, then the flow proceeds to step S326. Otherwise, the flow proceeds to step S322. At step S326, the roll-back is performed after determining the actual roll-back time, then proceed to step S318.

Because the examples in FIG. 26 and FIG. 27 do not use SW sever model, that existed in a central computer, controlling and connecting local simulations in the distributed-processing-based parallel simulation (refer FIG. 22), the role of controlling and connecting local simulations should be dispersed to a run-time module in each of local simulations, which makes the flow complex.

Figure 28:
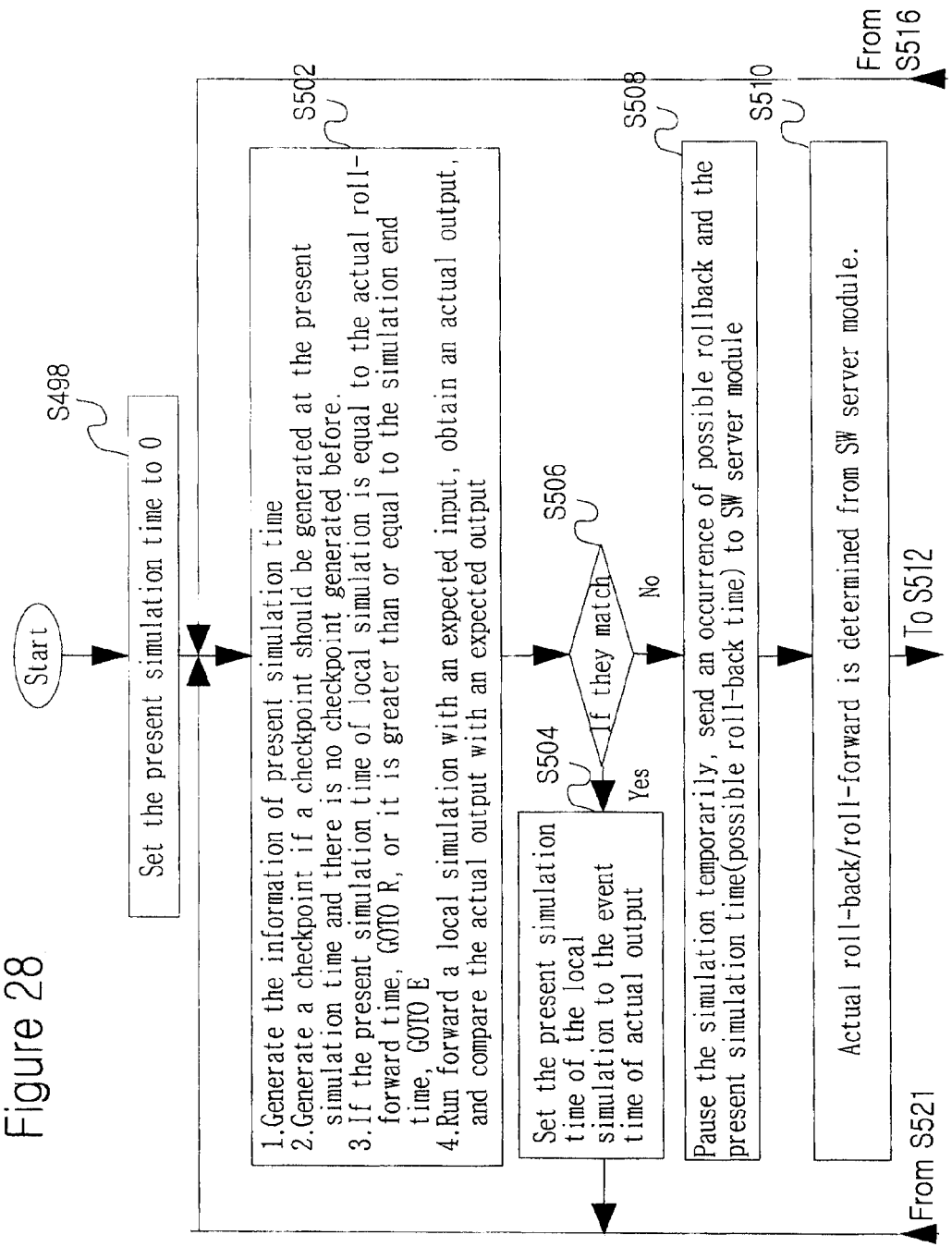
FIG. 28 is an example of the overall flow diagram for the execution of a local simulation by a local simulator in the star connection topology.
Figure 28:
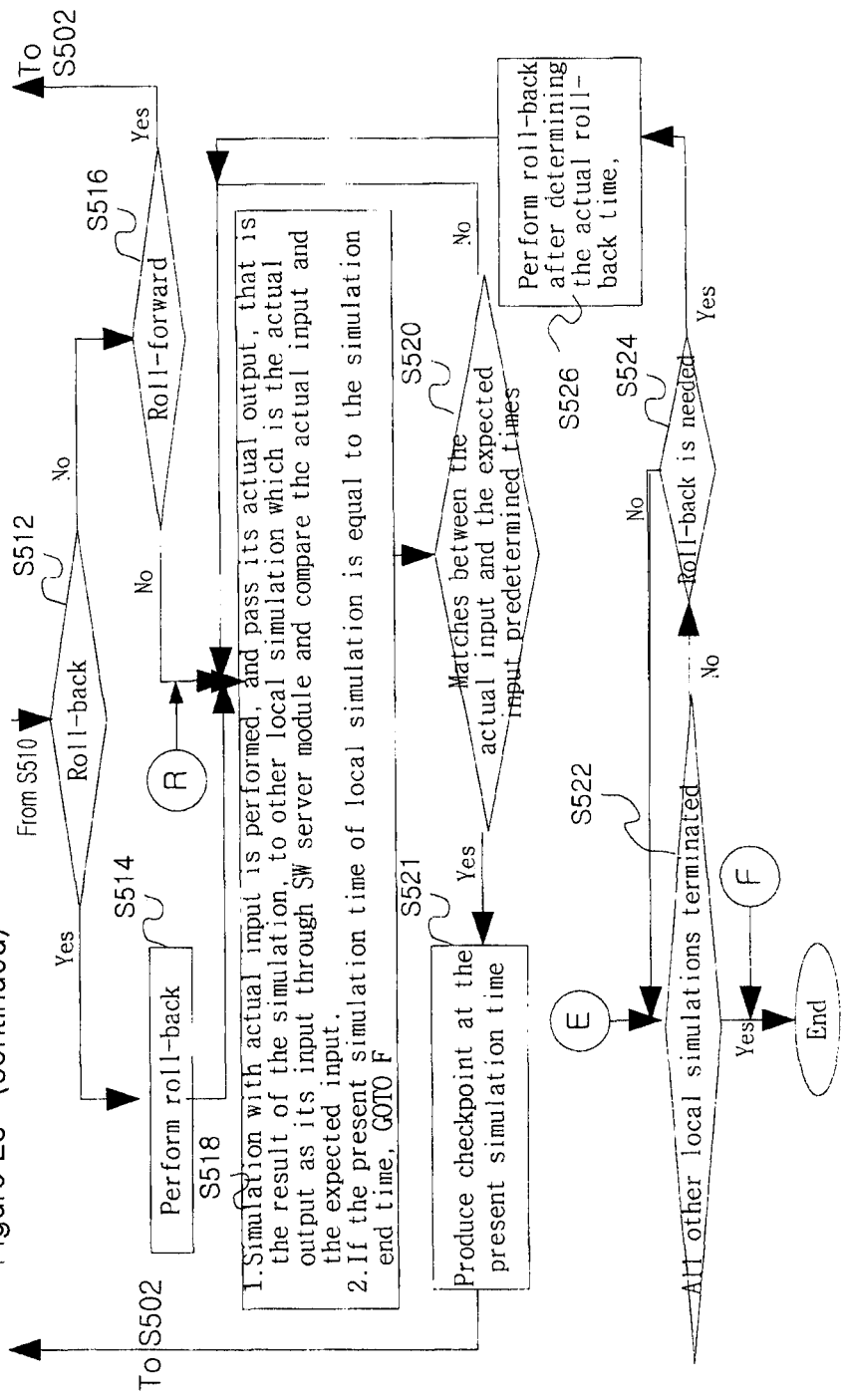
Figure 29:
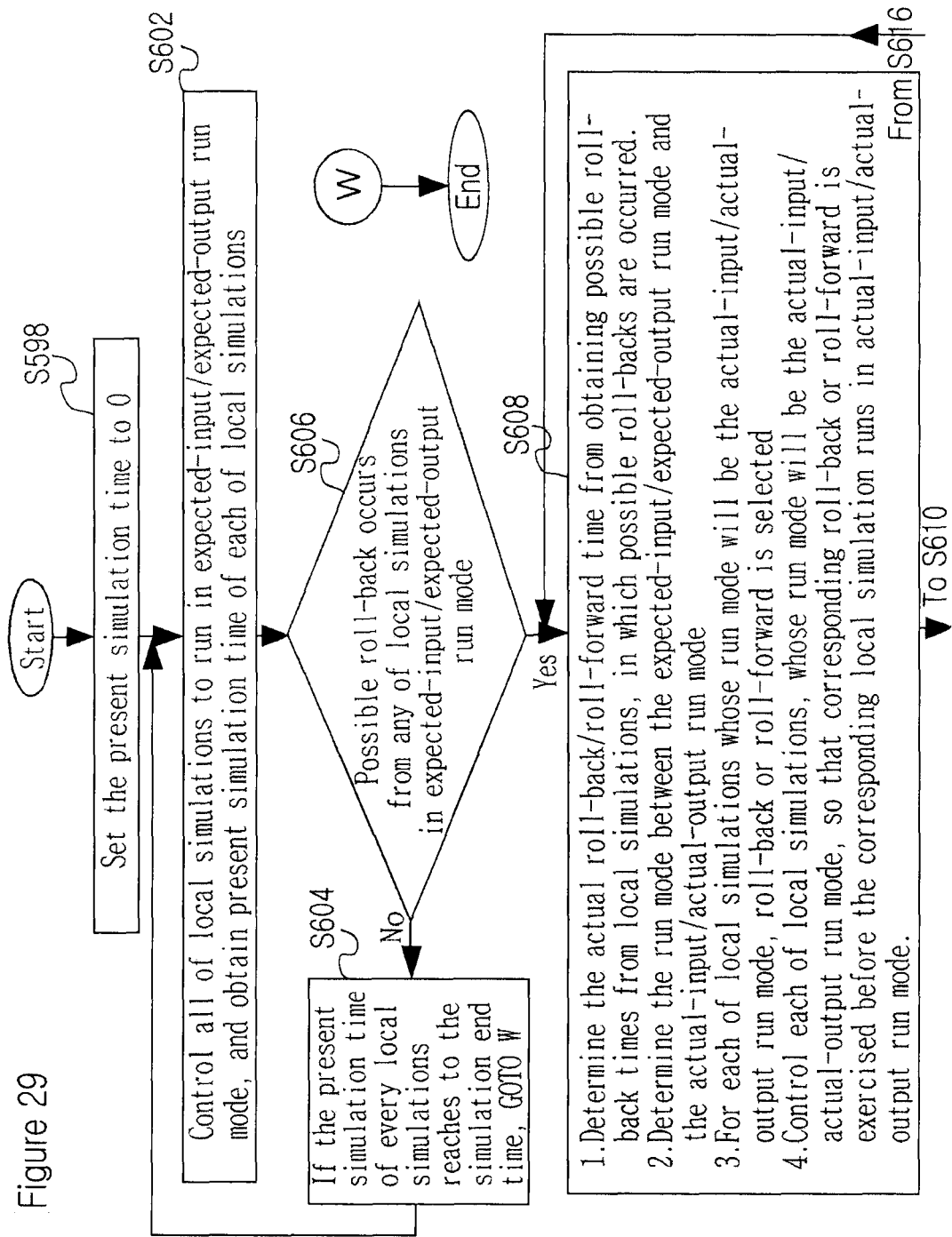
FIG. 29 is an example of the overall flow diagram of the SW sever module in a central computer in the star connection topology.
Figure 29:
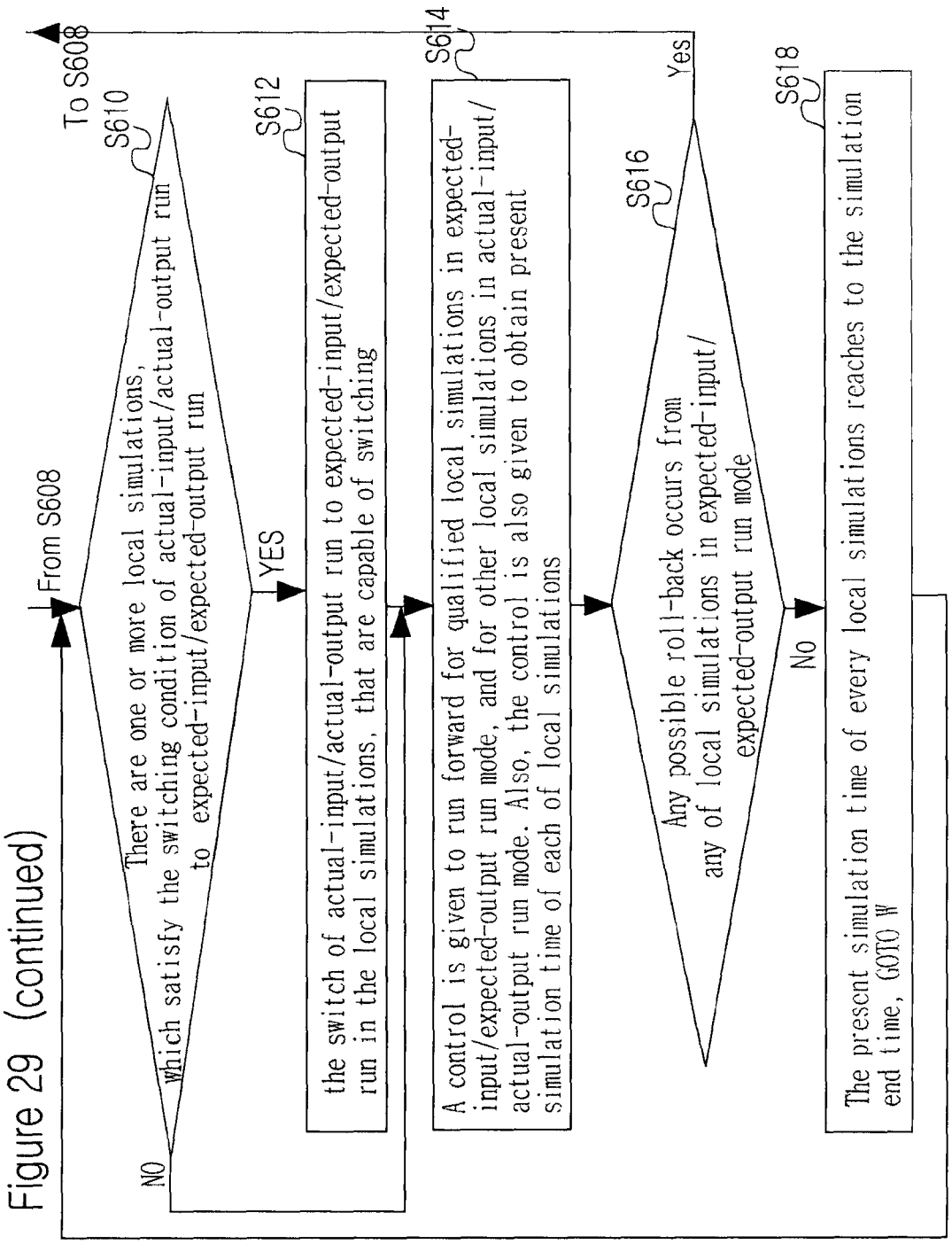

FIG. 28 and FIG. 29 show other examples of the flow diagrams of the execution of the distributed-processing-based parallel simulation using a SW sever module, which exists in a central computer that is in charge of controlling and connecting local simulation during the execution of the distributed-processing-based parallel simulation (S212 in FIG. 25) in the star connection topology (refer FIG. 22).

FIG. 28 is an example of the overall flow diagram for the execution of a local simulation by a local simulator. FIG. 29 is an example of the overall flow diagram of the SW sever module in said central computer.

As these examples are shown, there can be many different flow diagrams for the execution of the distributed-processing-based parallel simulation.

Also, the execution order of the sub-blocks can be changed if it is not disturb the correct execution of the entire processes, or more than one sub-block can be executed at the same time if it is also not disturb the correct execution of the entire processes.

In FIG. 28, the flow diagram is consisted of fifteen sub-blocks excluding start and end. At step S598, the present simulation time is set to 0, and the flow proceeds to step S502. At step S502, the information of present simulation time is generated. If a checkpoint should be generated at the present simulation time and there is no checkpoint generated earlier, then a checkpoint is generated at the present simulation time. The flow proceeds to step S518 if the present simulation time of local simulation is equal to the actual roll-forward time, or it proceeds to step S522 if it is greater than or equal to the simulation end time. If none of these holds, run forward a local simulation with an expected input, obtain an actual output, and compare the actual output with an expected output. Then, the flow proceeds to step S506. At step S506, if the correct output and the expected output obtained at step S502 match, proceed to step S504, or proceed to step S508 if no match. At step S504, set the present simulation time of the local simulation to the event time of actual output (the time of actual output change happening), and proceed to step S502. At step S508, pause the simulation temporarily, send an occurrence of possible rollback and the present simulation time (the possible roll-back time) to SW server module, then proceed to step S510. At step S510, actual roll-back/roll-forward is determined from SW server module. Then, the flow proceeds to step S512. At step S512 if roll-back is needed, the flow proceeds to S514. Or, the flow proceeds to S516. At step S516, if roll-forward is needed, the flow proceeds to step S502, otherwise, the flow proceeds to step S518. At step S514, the roll-back for the local simulation is executed, and then the flow proceeds to step S518. At step S518, the simulation with actual input is performed, and passes its actual output, that is the result of the simulation, to other local simulation which is the actual output as its input through SW server module. At the same time, the comparison is made with the actual input and the expected input. If the present simulation time of local simulation is equal to the simulation end time, then the flow proceeds to the end for termination. If not, the flow proceeds to step S520. At step S520, the number of matches of the comparison between the actual input and the expected input made at step S518 is equal to a predetermined number (for example, three times), then the flow proceeds to step S521. Otherwise, the flow proceeds to step S518. At step S522, if all of other local simulations end, then terminate the local simulation. Otherwise, the flow proceeds to step S524. At step S524, if the roll-back is required, then the flow proceeds to step S526. Otherwise, the flow proceeds to step S522. At step S526, the roll-back is performed after determining the actual roll-back time, then proceed to step S518.

FIG. 29 is a schematic diagram of an example of a flow for SW server module of for local simulations in distributed-processing-based parallel simulation. In FIG. 29, the flow diagram is consisted of ten sub-blocks excluding start and end.

At step S598, the present simulation time is set to 0, and the flow proceeds to step S602. At step S602, a control is given to run all of local simulations in expected-input/expected-output run mode, and to obtain present simulation time of each of local simulations. Then, the flow proceeds to step S606. At step S606, if any possible roll-back occurs in any of local simulations in expected-input/expected-output run mode, the flow proceeds to step S608. Otherwise, the flow proceeds to step S604. At step S604, if the present simulation time of every local simulations reaches to the simulation end time, proceed to the termination. Otherwise, the flow proceeds to step S602. At step S608, the actual roll-back/roll-forward time is determined from possible roll-back times from local simulations, in which possible roll-backs are occurred. Next, for each of local simulations, the run mode between the expected-input/expected-output run mode and the actual-input/actual-output run mode is determined. Next, for each of local simulations whose run mode will be the actual-input/actual-output run mode, roll-back or roll-forward is selected. Next, a control is given to each of local simulations, whose run mode will be the actual-input/actual-output run mode, so that corresponding roll-back or roll forward is exercised before the corresponding local simulation runs in actual-input/actual-output run mode. Then, the flow proceeds to step S610. At step S610, if there are one or more local simulations, which satisfy the switching condition of actual-input/actual-output run to expected-input/expected-output run, the flow proceeds to step S612. Otherwise, the flow proceeds to step S614. At step S612, the switch of actual-input/actual-output run to expected-input/expected-output run in the local simulations capable of switching, is occurred. The flow proceeds to step S614. At step S614, a control is given to run forward for qualified local simulations in expected-input/expected-output run mode, and for other local simulations in actual-input/actual-output run mode. Also, the control is also given to obtain present simulation time of each of local simulations. Then, the flow proceeds to step S616. At step S616, if any possible roll-back occurs in any of local simulations in expected-input/expected-output run mode, the flow proceeds to step S608. Otherwise, the flow proceeds to step S618. At step S618, if the present simulation time of every local simulation reaches to the simulation end time, proceed to the termination. Otherwise, the flow proceeds to step S610.

In FIG. 29, the SW server module controls individually the execution of local simulation with actual-input/actual-output or expected-input/expected-output in a distributed-processing-based parallel simulation. However, as already explained, in other configuration, it is also possible that the execution of local simulation with expected-input/expected-output in a distributed-processing-based parallel simulation is performed only when all of local simulations can be executed with expected-inputs and expected-outputs, which may provide a limited performance improvement, but with simpler control.

FIG. 30 and FIG. 31 are schematic diagrams of an example of pseudo code for the behavior of some components in FIG. 8.

If such code is added in synthesizable, it can be implemented in a hardware-based verification platform.

The emphasis should be put on the definition of simulation in this present invention. The simulation in this present invention includes not only the simulation execution using one or more simulators, but also the execution of one or more simulation acceleration execution using one or more hardware-based verification platforms. Therefore, a local simulation in a distributed-processing-based parallel simulation can be executed by a local simulator, a local hardware-based verification platform, or a combination of a local simulator and a local hardware-based verification platform.

Also, the distributed-processing-based parallel simulation can be applied not only the in a refinement process from IL to GL, but also in a refinement process from other level of abstraction.

FIG. 32 is a schematic diagram of another example of components for the behavior of the instrumentation code of the distributed-processing-based parallel simulation in this present invention. FIG. 32 is similar to FIG. 8, but the difference is the s-DCP generation/save module (60), which has a design object containing DUV and TB at higher level of abstraction (53) than that of the local design object, execute it together with the local design object to generate expected inputs and expected outputs dynamically, and use them. The difference of methods between FIG. 32 and FIG. 8 is similar to two automatic simulation result comparison methods in conventional simulation, which are the method using a golden model and the method using a golden vector. For expected inputs and expected outputs used in a distributed-processing-based parallel simulation in this present invention for reducing the communication overhead and synchronization overhead of local simulations, they can be obtained from the dynamic information of previous simulation, or dynamically generated from a model at higher level of abstraction. Moreover, instead of a design object containing TB and DUV at higher level of abstraction (53), an optimized design object containing TB and DUV for faster simulation can be used to dynamically generate expected inputs and expected outputs. Also, if a model at the specific level of abstraction (for example, a RTL model, a RTL/GL mixed model, a TLM/RTL mixed model, a TLM/RTL/GL mixed model, etc) need to be simulated by a distributed-processing-based parallel simulation, the level of abstraction of the model, or one or more design objects in the model can be raised automatically, the model, or one or more design objects in the model can be optimized for faster simulation, or the combination of two methods can be used for obtaining s-DCP (for example, using VSP from Carbon Design Systems, or VTOC from TenisonEDA, or using methods proposed in Korean patent application 10-2005-116706, or code optimization methods in HDL simulators, etc).

Figure 33:
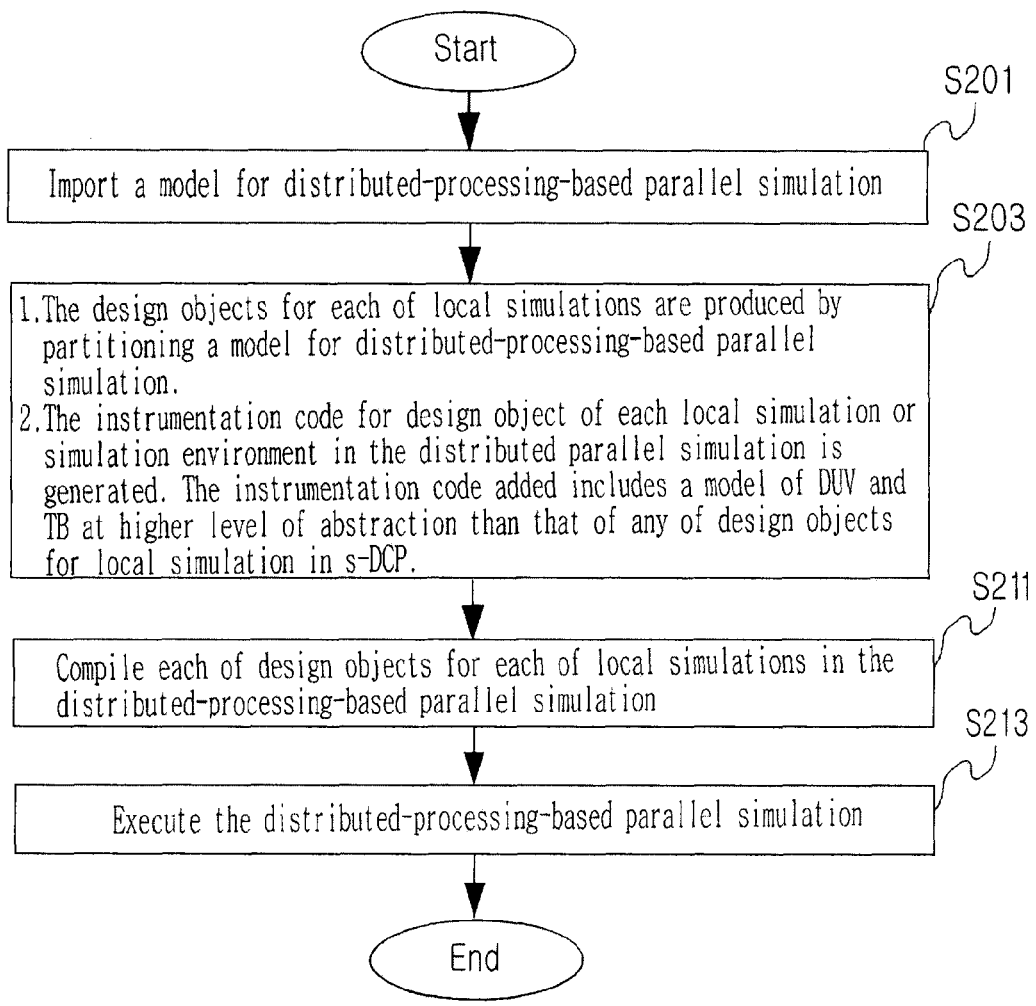
FIG. 33 is another example of the entire flow diagram for a distributed-processing-based parallel simulation in this present invention.

FIG. 33 is another example of the overall flow diagram of the distributed-processing-based parallel simulation. Therefore, it is possible to exist other flow diagrams for the execution of distributed-processing-based parallel simulation. Also, the execution order of the sub-blocks can be changed if it is not disturb the correct execution of the entire processes, or more than one sub-block (for example, S201, S203, S211, or S213 in FIG. 33) can be executed at the same time if it is also not disturb the correct execution of the entire processes.

The flow diagram of FIG. 33 is consisted of four sub-blocks excluding the start and end. At step S201, a model for the distributed-processing-based parallel simulation is imported. The flow proceeds to step S203. At step S203, the design objects for each of local simulations are produced by partitioning a model for distributed-processing-based parallel simulation. The instrumentation code for design object of each local simulation or simulation environment (for example, SW server module that exists in the central computer in the logical connecting structure of star topology) in the distributed parallel simulation is generated. The flow proceeds to the step S211. The instrumentation code added at step 203 includes DUV and TB at higher level of abstraction than that of any of design objects for local simulation in s-DCP. At step S211, each of design objects for each of local simulations in the distributed-processing-based parallel simulation are compiled. The flow proceeds to step S213. During these compilations, the instrumentation codes added at step S203 are also compiled together. At step S213, the distributed-processing-based parallel simulation is executed, and the whole processes are terminated.

Figure 34:
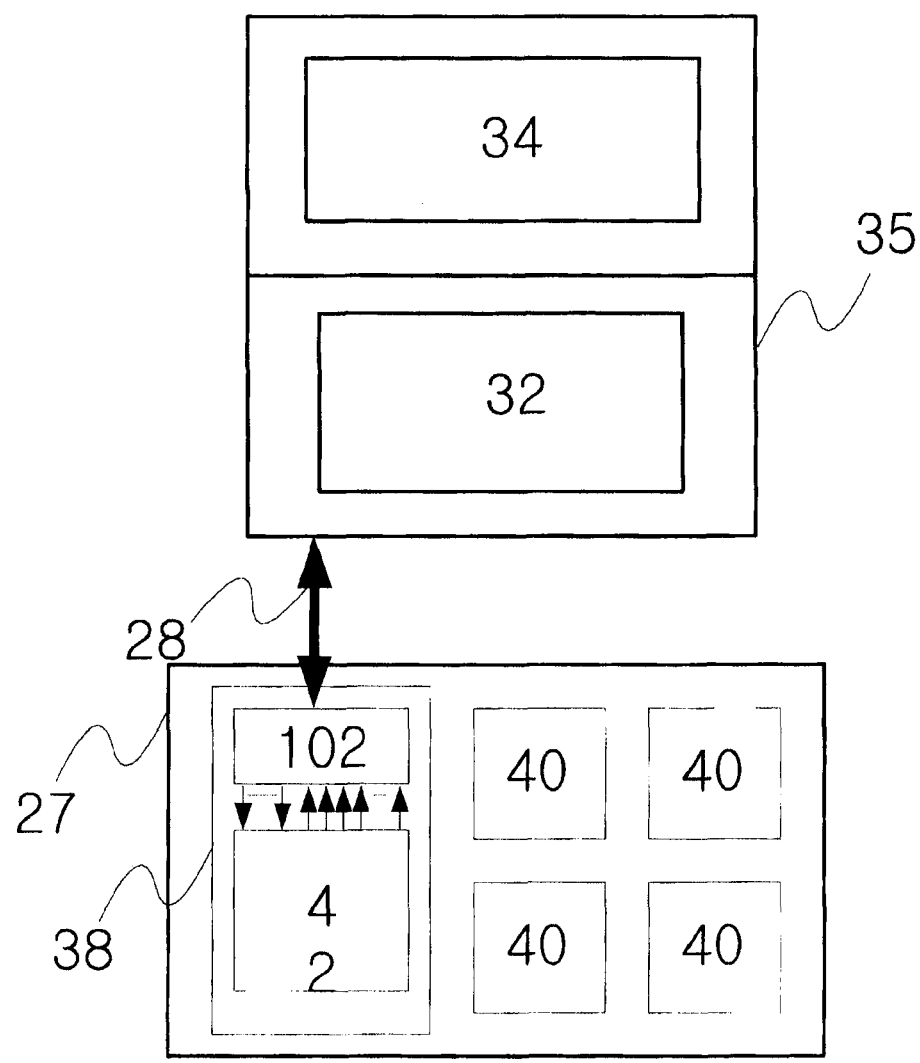
FIG. 34 is a schematic diagram of an example of the design verification apparatus in this present invention.

FIG. 34 is a schematic diagram of an example of the design verification apparatus in this present invention.

A computer (835) has in-circuit/in-system debugging software (832) and HDL simulator (834), and is connected to an arbitrary target board (827) through a debugging interface cable (828) (for example, USB cable, parallel cable, PCI cable, etc). One or more FPGA or non-memory IC chips (838) are mounted on said arbitrary target board (827) so that they are operated in the in-circuit or in-system environment. The instrumentation circuit for debugging or instrumentation code for debugging (902) is implemented in said one or more FPGA or non-memory IC chips (838) together with DUV (842) so that the design state information and the input information of DUV, or one or more design objects in DUV are saved and obtained by said instrumentation circuit for debugging or instrumentation code for debugging (902) in the in-circuit or in-system environment of said target board (827), and 100% visibility for DUV, or one or more design objects in DUV is provided by simulation using a simulator (834).

In this present invention, there is more detailed explanation about saving method of the design state information and input information for DUV, or one or more design objects in DUV by said instrumentation circuit for debugging or instrumentation code for debugging than the explanation about obtaining method (the method for bringing said saved design state information and input information into a computer). The reason is because the obtaining method of the data (the design state information and input information) saved in flipflops, embedded memories, or configuration memory inside of FPGA or non-memory IC chips is well-known already, such as using JTAG (Joint Test Access Group) built in said chips.

That is, the design state information and input information can be read into a computer (835) by putting a software component in said in-circuit/in-system debugging software (832), and using said software component which controls a JTAG logic inside of said FPGA or non-memory IC chip (838) through a debugging interface cable (28) with JTAG protocol-compatible signals (TDI, TDO, TCK, TMS). More detailed information can be found in technical documents about JTAG of corresponding FPGA or non-memory IC chips, e.g. JTAG-related technical document about Xilinx FPGA or Altera FPGA. Also, specific methods to read some data in said chips using JTAG can be found in other technical document related debugging using JTAG, e.g. ChipScope user manual and related technical documents from Xilinx, Altera୬] SignalTap user manual and related technical documents from Altera, Identify user manual and related technical documents from Synplicity, Configuration and Readback of VIRTEX FPGAs Using JTAG Boundary Scan application note from Xilinx. Also, it can be also found in other patents (U.S. Pat. Nos. 6,182,247, 6,247,147, 6,286,114, 6,389,558, 6,460,148, 6,704,889, 6,760,898, 6,826,717, 7,036,046).

Figure 35:
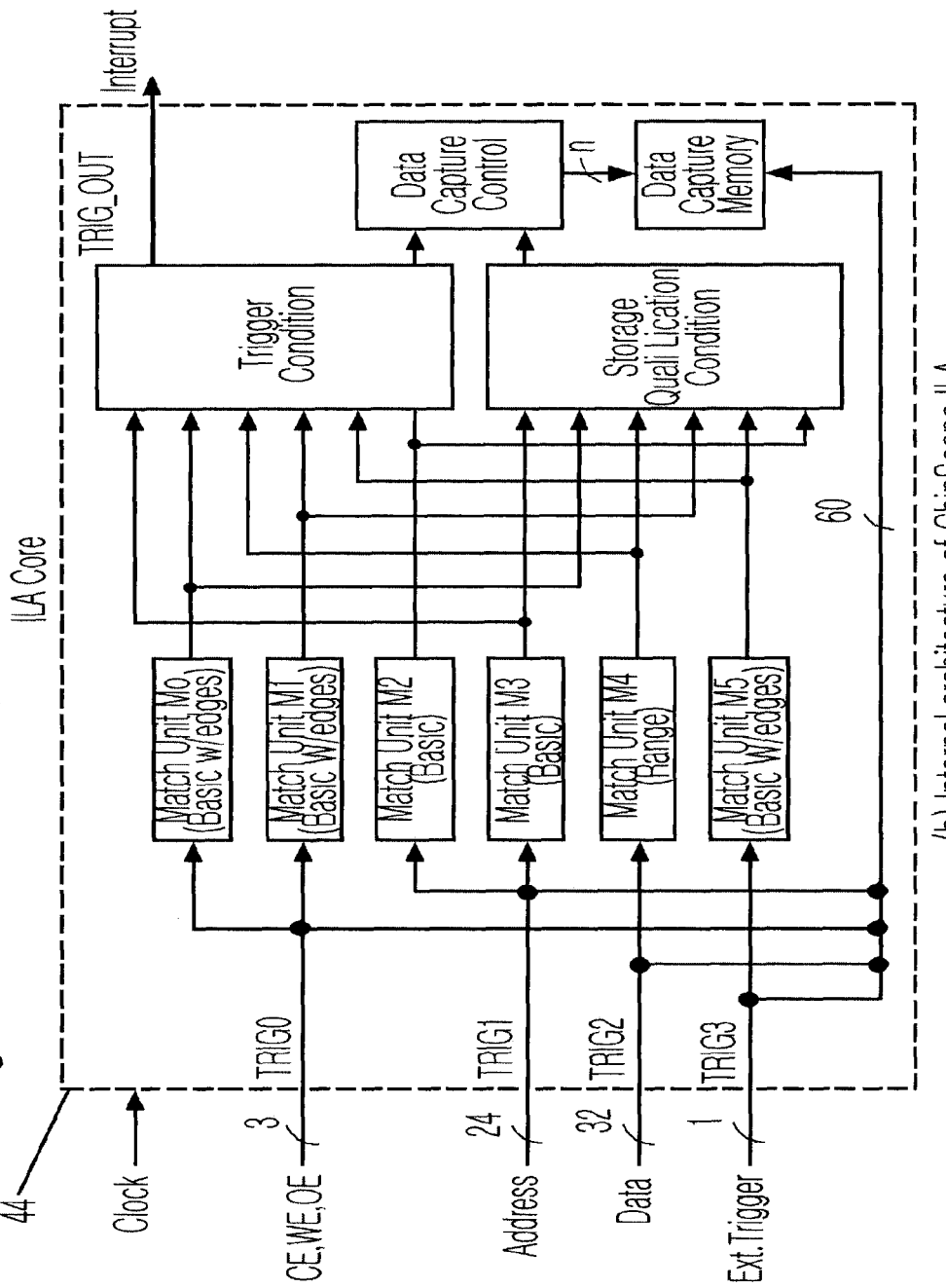
FIG. 35 is a schematic diagram of the system structure of ChipScope and ILA core from Xilinx.

FIG. 35 is a schematic diagram of the system structure of ChipScope and ILA core from Xilinx.

Figure 36:
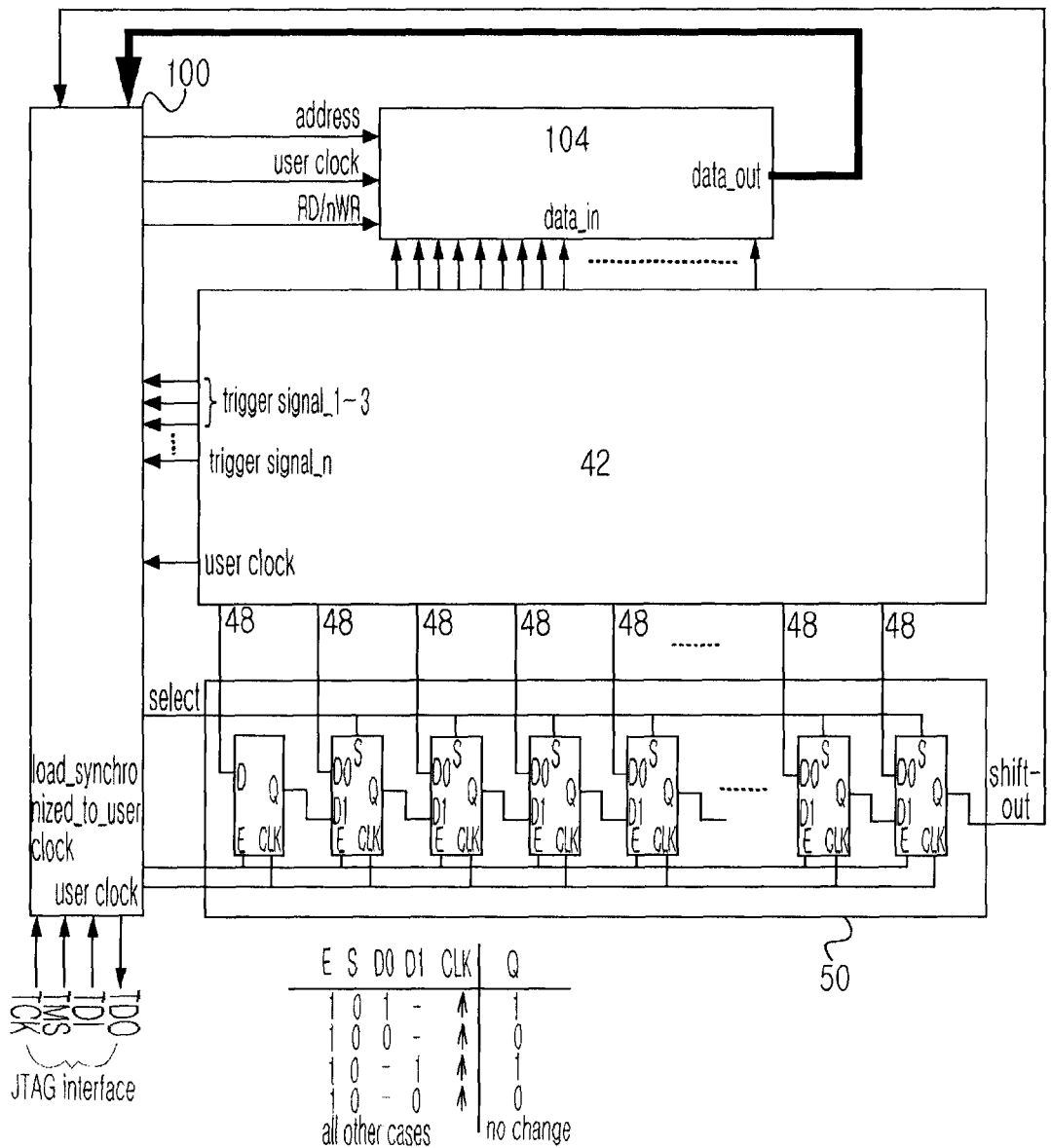
FIG. 36 is a schematic diagram of an example of the instrumentation circuit for debugging or instrumentation code for debugging including a parallel-load/serial-scanout register added to a user design.

FIG. 36 is a schematic diagram of an example of the instrumentation circuit for debugging or instrumentation code for debugging including a parallel-load/serial-scanout register added to a user design.

Figure 37:
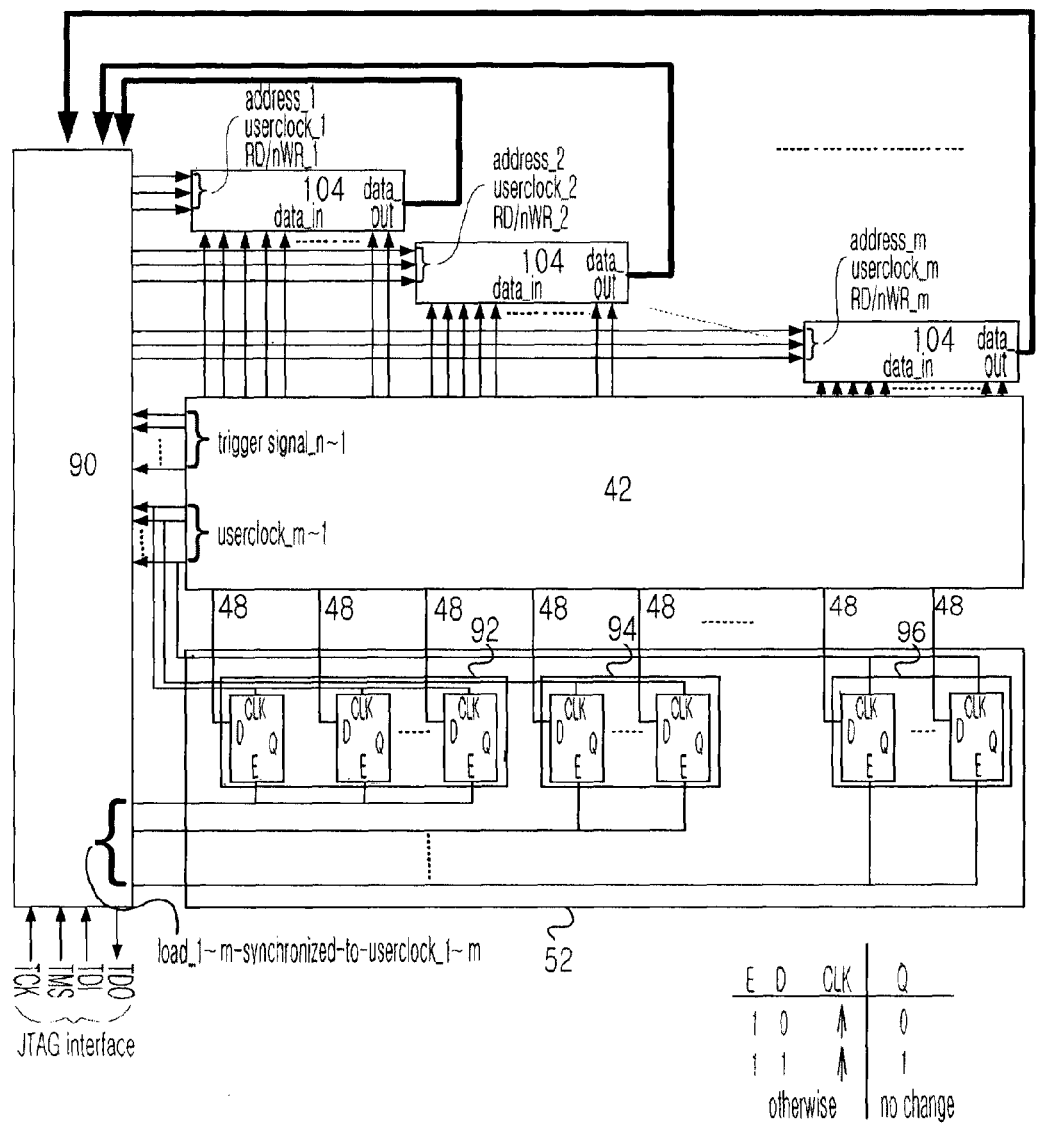
FIG. 37 is a schematic diagram of an example of the instrumentation circuit for debugging or instrumentation code for debugging including a parallel-load register added to a user design.

FIG. 37 is a schematic diagram of an example of the instrumentation circuit for debugging or instrumentation code for debugging including a parallel-load register added to a user design.

Figure 38:
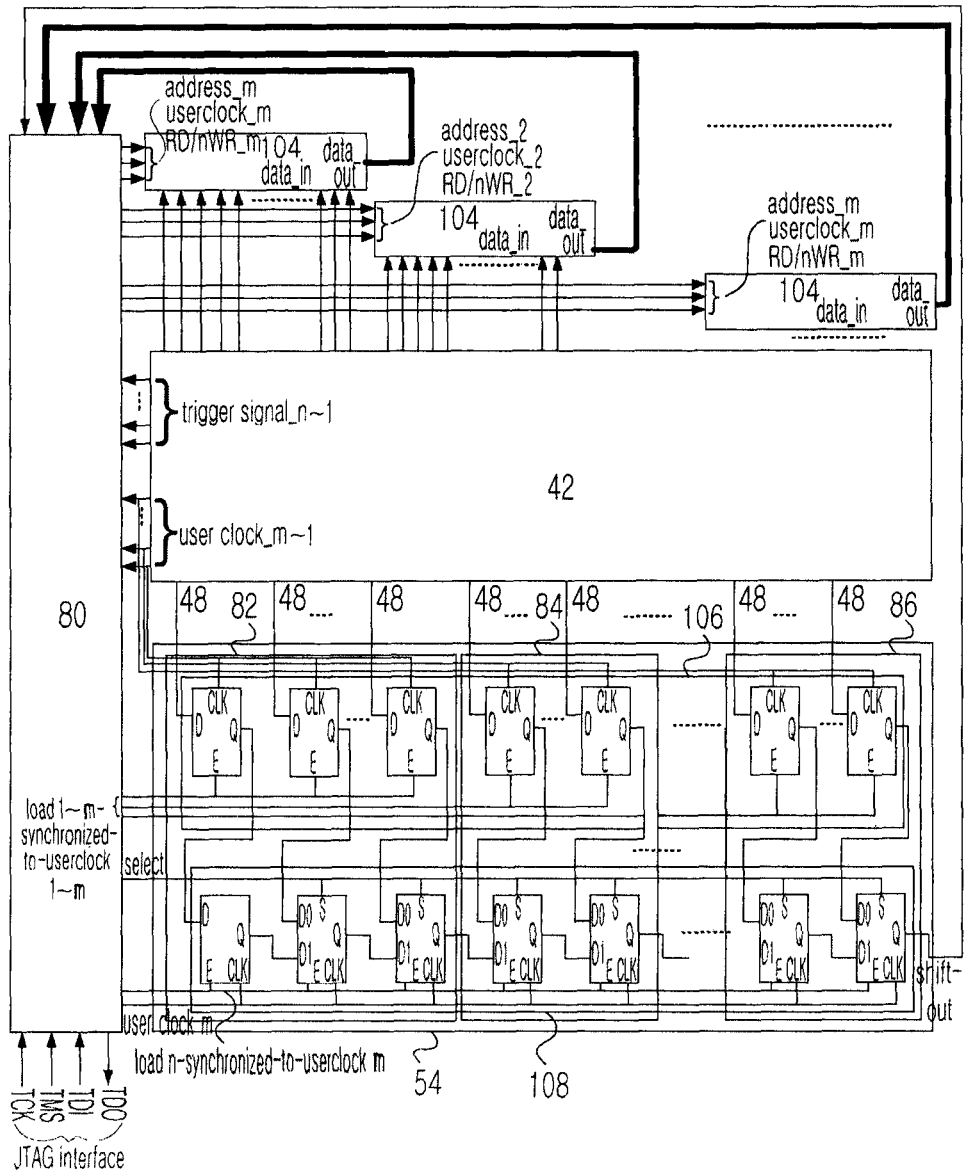
FIG. 38 is a schematic diagram of an example of the instrumentation circuit for debugging or instrumentation code for debugging including a two-level parallel-load/serial-scanout register added to a user design.

FIG. 38 is a schematic diagram of an example of the instrumentation circuit for debugging or instrumentation code for debugging including a two-level parallel-load/serial-scanout register added to a user design.

Especially, the efficient debugging is possible with the instrumentation circuit for debugging or the instrumentation code for debugging for Xilinx FPGA chips having readback capture capability or other FPGA or non-memory IC chips having similar capability depicted in FIG. 37 as an example, or other FPGA or non-memory IC chips having no such similar capability depicted in FIG. 38 as an example, when said chips are non-deterministically malfunctioning or there are two or more user clocks with no phase relation.

For saving the design state information of DUV, or one or more design objects in DUV having one user clock, or two or more user clocks with no phase relation, which are implemented into Xilinx FPGA chips having readback capture capability or other FPGA or non-memory IC chips having similar capability depicted in FIG. 37 as an example, additionally instrumented circuit for debugging or additionally instrumented code for debugging isn't required as the already built-in instrumentation circuit can be used.

For this purpose, in the case of Xilinx FPGA, readback_capture macro (such as CAPTURE_VIRTEX primitive, CAPTURE_SPARTAN primitive, etc) is used in a design state information and input information saving and obtaining controller including a controller for loading time of a parallel-load register (890), and the 1-2 loading enable signal (to be explained later) is fed to CAP input of readback_capture macro and a user clock m, which drives said 1-2 loading enable signal (said 1-2 loading enable signal is synchronized to said user clock m), is fed to CLK input of readback_capture macro.

For effective debugging over the user design having two or more user clocks with no phase relation, the visibility for each of all signals in said user design, which is synchronized to each of user clocks, must be provided.

For this purpose, the driving user clock must be determined for each of flipflops or latches in DUV, or one or more design objects in DUV with a fully or partially automatic method so that said flipflops and latches in said design objects, which requires 100% signal visibility, are grouped by their driving user clock (we'll call each of groups a region of a clock domain). (There are something to consider more in detail. First, if a flipflop or a latch is driven by a combination of two or more user clocks (e.g. driven by a combinational output from two user clocks), then a combination of two or more user clocks must be declared as a new user clock. Second, the objects for 100% visibility are signals, i.e. inputs, outputs, or inputs of a component or primitive component, not components or primitive components themselves. Therefore, if two regions of a clock domain, say a region A and a region B, are met, an output from the region A drives an input of region B, and the input of region B is an input of flipflop, then the output of the flipflop must be included for obtaining the input information, not for the design state information. In other words, such flipflop must exist at the outside, i.e. the boundary, of design objects which require 100% visibility.

For each of regions of a clock domain, the outputs of corresponding flipflops and latches in DUV or one or more design objects, which require 100% visibility, are saved at a specific time (we will define this specific time as 1-2 loading time, and such loading operation as 1-2 loading and the enable signal (E) of parallel-load register in the region of a specific k user clock clock's domain for such 1-2 loading is called 1-2 loading enable signal) into flipflops consisting of a parallel-load register (FIG. 37) or a parallel-load register of two-level parallel-load/serial-scanout register (FIG. 38) in the instrumentation circuit for debugging or the instrumentation code for debugging by using the loading signal (load_i-synchronized-to-userclock_i in FIG. 37 and FIG. 38) synchronized to the user clock of corresponding clock domain (In FIG. 37 and FIG. 38, the signal, load_m-synchronized-to-userclock_m, is an 1-2 loading enable signal).

At 1-2 loading time, in addition to such parallel loading of output values of corresponding flipflops or latches into a parallel-load register (852) (FIG. 37) or a parallel-load register of two-level parallel-load/serial-scanout register (906) (FIG. 38) in the instrumentation circuit for debugging or the instrumentation code for debugging, the content of said parallel register must be also saved into a storage (for example, saving into a configuration memory by readback capture in Xilinx FPGA) as in the case of FIG. 37 where FPGA or non-memory IC chips has a built-in instrumentation circuit, or a serial-scanout register of two-level parallel-load/serial-scanout register as in the case of FIG. 38 where FPGA or non-memory IC chips has no such built-in instrumentation circuit (This is necessary for supporting pre-trigger debugging mode or mid-trigger debugging mode, and more detail will be followed).

For this purpose, the instrumentation circuit for debugging or the instrumentation code for debugging should include a design state information and input information saving and obtaining controller in which has a controller for controlling the loading time (890 in FIGS. 37, and 880 in FIG. 38).

For debugging in the case of non-deterministic malfunction, which is not repeatable, the debugging with one of three debugging modes should be possible after the execution is over in the in-circuit or in-system environment (but, the debugging mode is selected prior to the execution). Specially useful debugging modes among three are pre-trigger debugging mode and mid-trigger debugging mode because the visibility over the user design is needed much earlier (for example, 1,000 cycles earlier) than a debugging reference point in time W(t) in most of cases (FIG. 42 (a) and (b)).

The architecture like ones in FIG. 37 or FIG. 38 makes any of three debugging modes possible. To explain more in detail, the time when a trigger is fired in a trigger module becomes the time at which an erroneous behavior found, W(t) (this is the debugging reference point in time), and for both pre-trigger debugging mode and mid-trigger debugging mode the design state information of DUV or one or more design objects in DUV for 100% visibility must be saved at much earlier than W(t).

For this, the following method can be used. One of user clocks (for example, the slowest one) is selected, and a binary counter with a fixed bit length counts up its number with said user clock selected (such counter can be put in 890 of FIG. 37, or 880 of FIG. 38) in the in-circuit or in-system environment. When the value of the binary counter reaches to a specific predetermined value (for example, its terminal count value) at time $L12(t)$ and there is no trigger fired from a trigger module (such trigger module can be also put in 890 of FIG. 37, or 880 of FIG. 38) until $L12(t)$, an 1-2 loading occurs at $L12(t)$ (that is, there will be a periodic 1-2 loading every time when the binary counter reaches to a specific predetermined value until a trigger fired), and there will be no more 1-2 loading after a trigger fired (that is, the trigger fired time is the debugging reference point in time). Such control can be possible by having a finite state machine in 890 of FIG. 37, or 880 of FIG. 38.

If there is no more 1-2 loading after a trigger fires, the instrumentation circuit for debugging or the instrumentation code for debugging has the design state information of DUV, or one or more design objects in DUV, which requires 100% visibility, at two points in time, $L12(t1)$ and $L12(t2)$ ($L12(t1)$ is earlier than $L12(t2)$), that are both earlier than the time at which the trigger fires (let's call the time at which the trigger fires the time of trigger-fired).

If the instrumentation circuit for debugging or the instrumentation code for debugging has the design state information of DUV, or one or more design objects in DUV, which requires 100% visibility, at two points in time, $L12(t1)$ and $L12(t2)$, then even though $L12(t2)$ is very close to the time of trigger-fired, $L12(t1)$ is pretty far away from it (the time of trigger-fired) so that the debugging with either pre-trigger debugging mode or mid-trigger debugging mode is possible (for example, if the interval of 1-2 loading is 1,000 clock cycles, then $L12(t1)$ is at least 1,000 clock cycles far away from the time of trigger-fired). The pre-trigger debugging mode or mid-trigger debugging mode can be determined by the length of 1-2 loading interval. More specifically, if the bit length of the binary counter is relatively short, then the mid-trigger debugging mode is possible, and if the bit length of the binary counter is relatively long, then the pre-trigger debugging mode is possible In this present invention, 1-2 loading is defined as the saving operation of the design state information of DUV, or one or more design objects in DUV, which requires 100% visibility, at "two points" in time, which both are earlier than the time of erroneous behavior revealed W(t), into a storage location of the instrumentation circuit for debugging or the instrumentation code for debugging by using the instrumentation circuit for debugging or the instrumentation code for debugging. The instrumentation circuit for debugging or instrumentation code for debugging for 1-2 loading is defined as the instrumentation circuit for debugging or the instrumentation code for debugging, with which said 1-2 loading is performed.

Similarly, in this present invention, 1 loading is defined as the saving operation of the design state information of DUV, or one or more design objects in DUV, which requires 100% visibility, at "one point", which is earlier than the time of erroneous behavior revealed W(t), in time into a storage location of the instrumentation circuit for debugging or the instrumentation code for debugging by using the instrumentation circuit for debugging or the instrumentation code for debugging. The instrumentation circuit for debugging or instrumentation code for debugging for 1 loading is defined as the instrumentation circuit for debugging or the instrumentation code for debugging, with which said 1 loading is performed.

Figure 39:
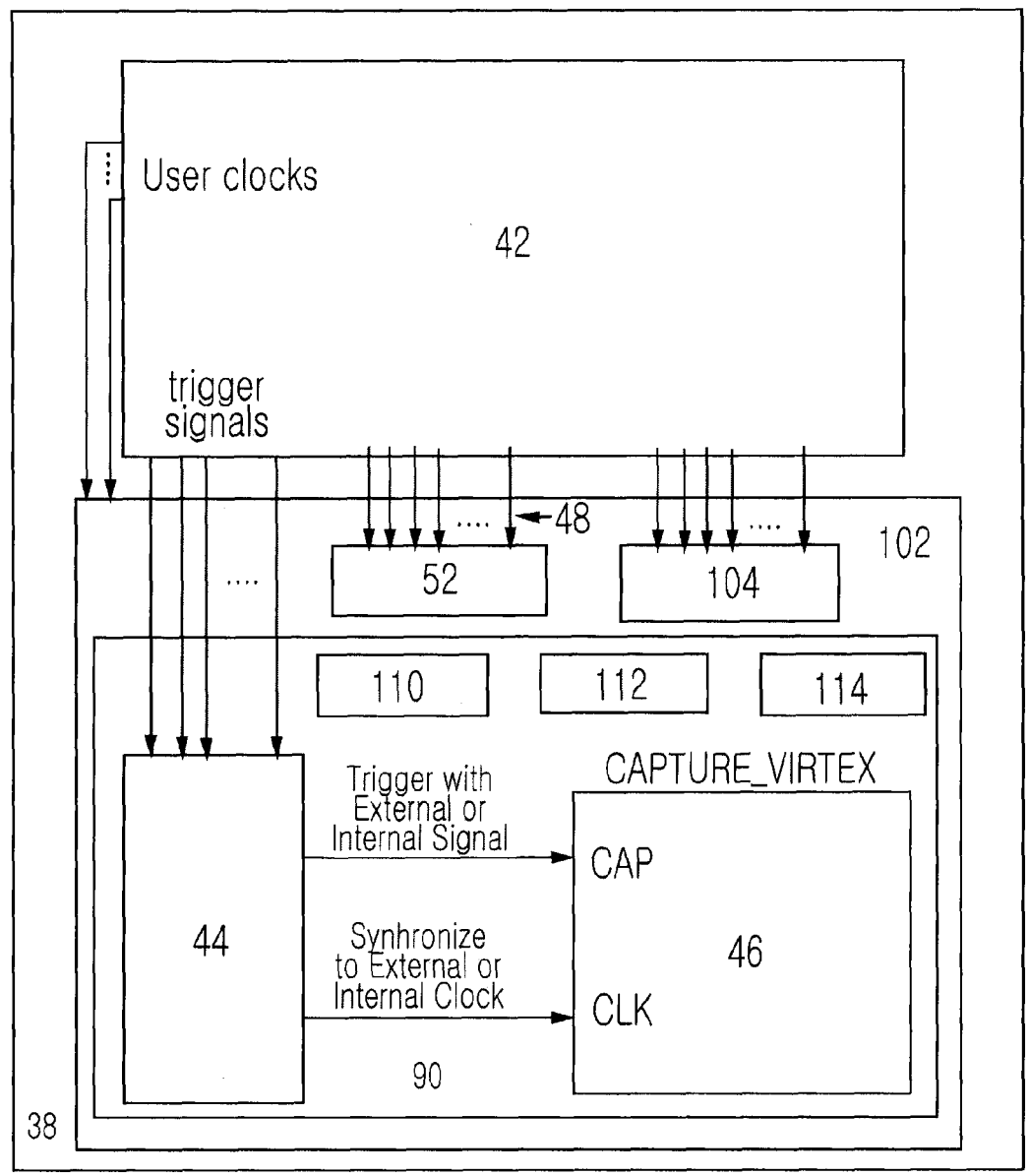
FIG. 39 is a schematic diagram of an example of the instrumentation circuit for debugging or instrumentation code for debugging including CAPTURE_VIRTEX primitive for using the readback capture capability of Xilinx.

FIG. 39 is a schematic diagram of an example of the instrumentation circuit for debugging or instrumentation code for debugging including CAPTURE_VIRTEX primitive for using the readback capture capability of Xilinx.

Figure 40:
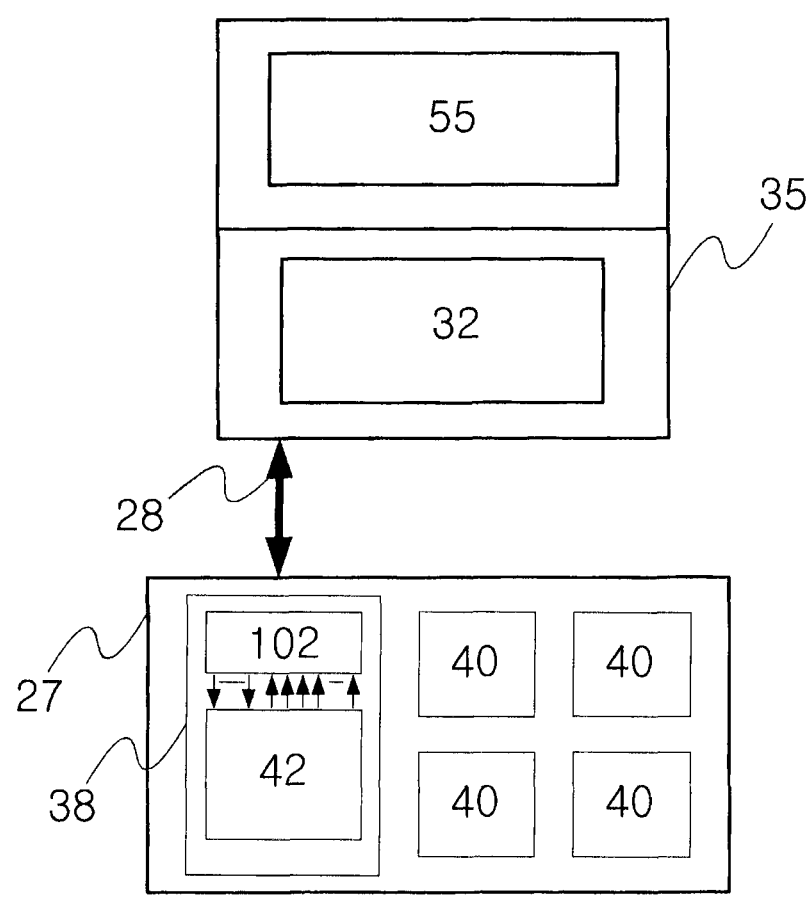
FIG. 40 is a schematic diagram of another example of the design verification apparatus in this present invention.

FIG. 40 is a schematic diagram of another example of the design verification apparatus in this present invention.

A computer (835) has in-circuit/in-system debugging software (832) and model checker (855), and is connected to an arbitrary target board (827) through a debugging interface cable (828). One or more FPGA or non-memory IC chips (838) are mounted on said arbitrary target board (827) so that they are operated in the in-circuit or in-system environment. The instrumentation circuit for debugging or instrumentation code for debugging (902) is implemented in said one or more FPGA or non-memory IC chips (838) together with DUV (842) so that the design state information of DUV, or one or more design objects in DUV are saved and obtained by said instrumentation circuit for debugging or instrumentation code for debugging (902) in the in-circuit or in-system environment of said target board (827), and semi-formal verification can be performed for DUV, or one or more design objects in DUV by said model checker (855).

Figure 41:
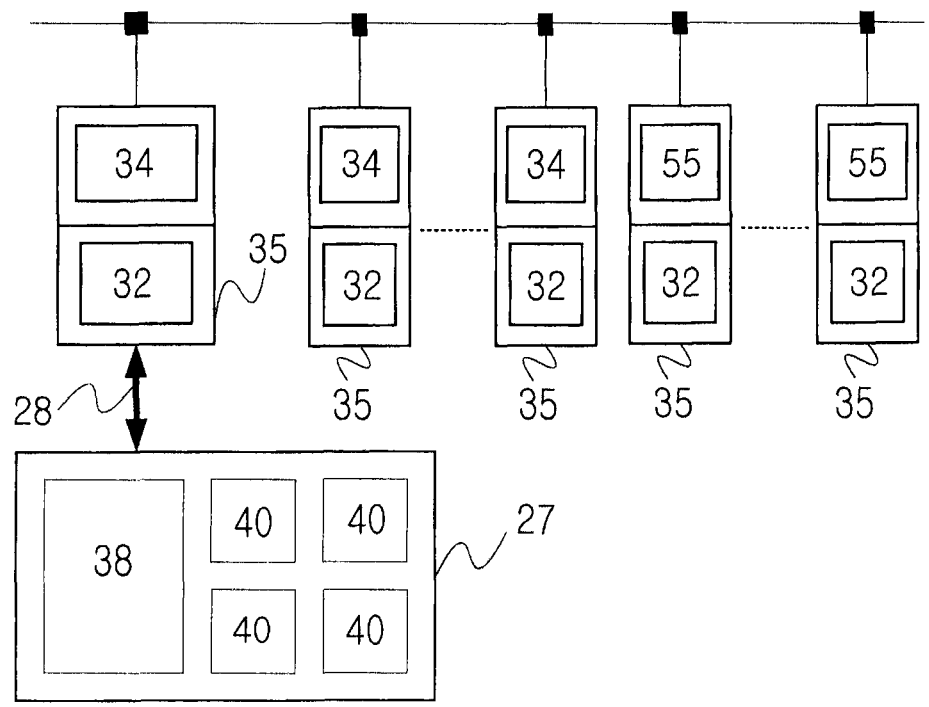
FIG. 41 is a schematic diagram of another example of the design verification apparatus in this present invention.

FIG. 41 is a schematic diagram of another example of the design verification apparatus in this present invention.

Figure 42:
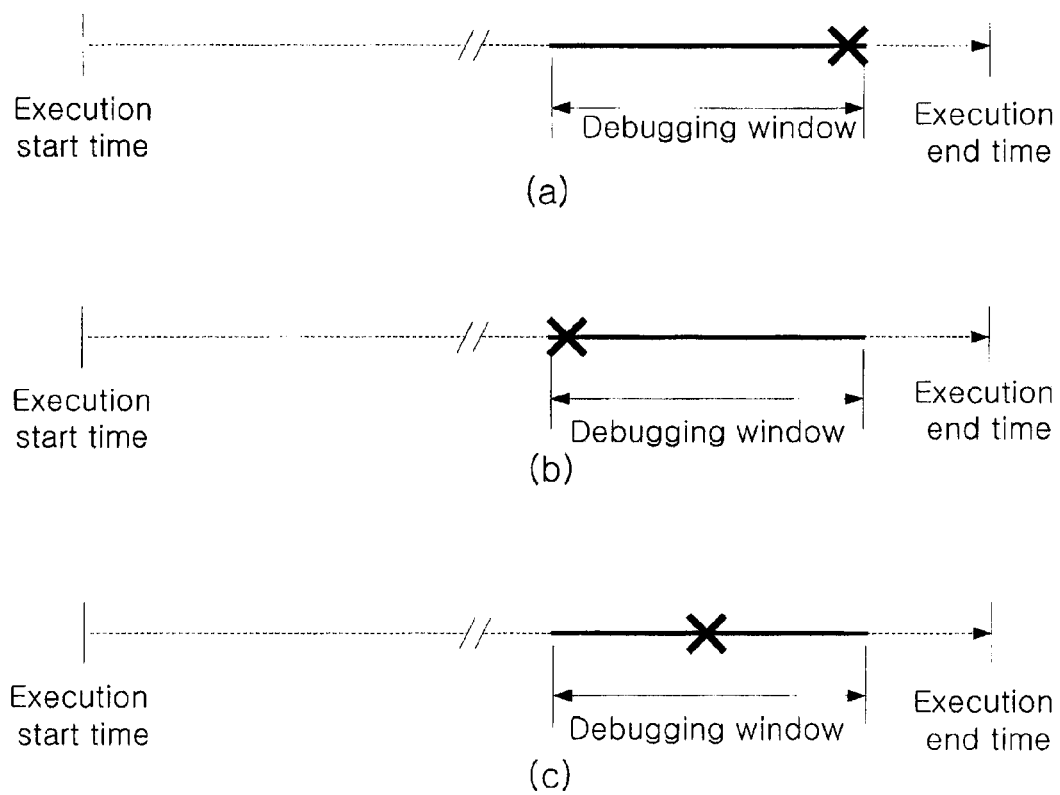
FIG. 42 is a schematic diagram of an example of situations in which a debugging reference point in time is located in a debugging window.

FIG. 42 is a schematic diagram of an example of situations in which a debugging reference point in time is located in a debugging window.

Figure 43:
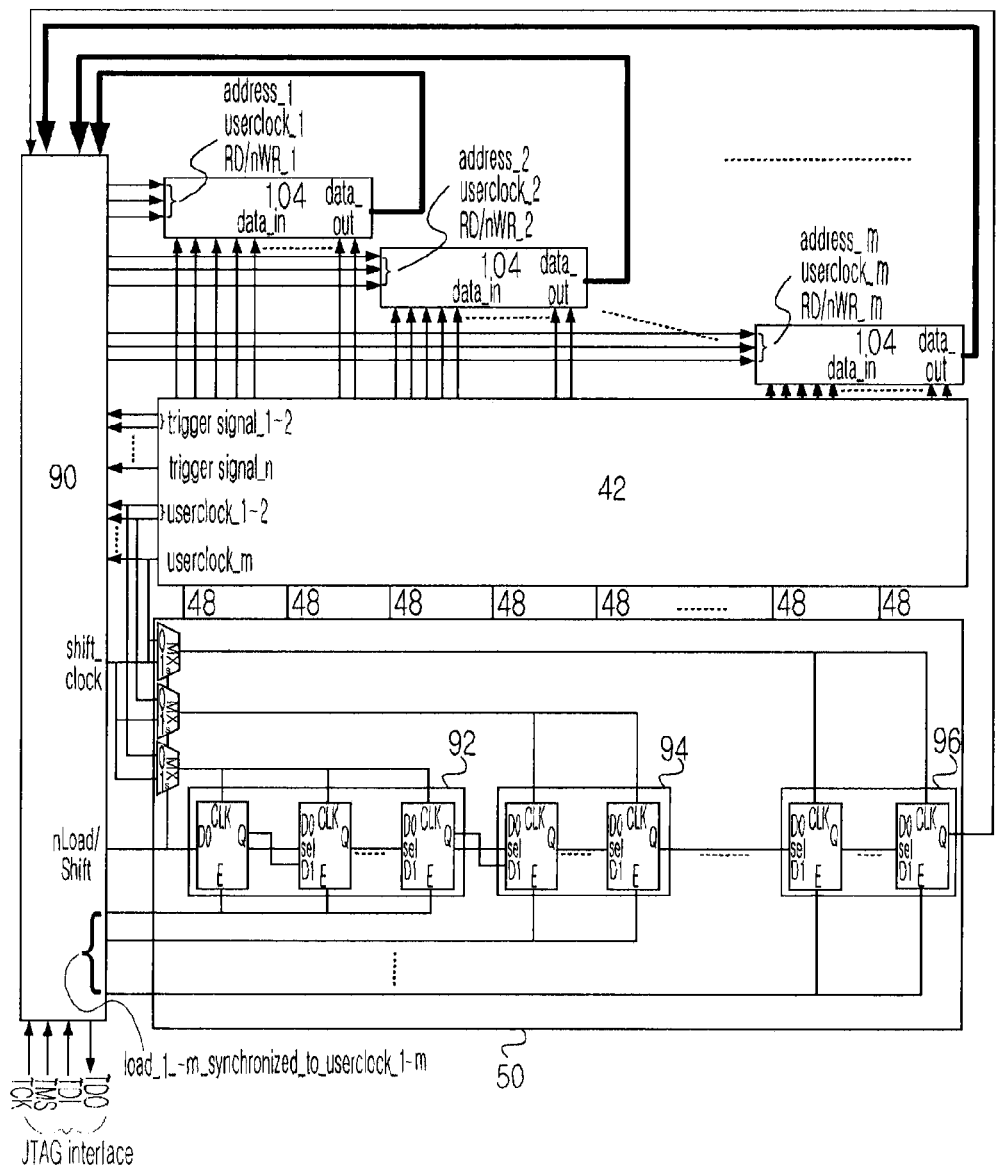
FIG. 43 is a schematic diagram of another example of the instrumentation circuit for debugging or instrumentation code for debugging including a parallel-load/serial-scanout register added to a user design.

FIG. 43 is a schematic diagram of another example of the instrumentation circuit for debugging or instrumentation code for debugging including a parallel-load/serial-scanout register added to a user design.

By a instrumentation circuit for debugging or instrumentation code for debugging like this, 1-loading is possible when there are two or more user clocks with no phase relation.

With regard to the present invention, after a DUV is refined at synthesizable RTL, synthesized GL, or mixed RTL/GL from a VP, which models DUV or one or more design objects in DUV at TL, a physical prototype instead of VP is built for verifying in the in-circuit or in-system environment instead of with TB. In this case, the verification speed with physical prototypes is very high (for example, VP can run at 1 MHz at most, but physical prototype can run at multiple MHz at least and more than 100 MHz at best), but the debugging becomes extremely difficult due to the very limited visibility and controllability. The main reason for limited visibility and controllability of physical prototypes basically comes from the fact that they are operated in the in-circuit or in-system environment so that the control for getting the visibility and controllability is much more difficult than simulation or simulation acceleration. The debugging for DUV in the prototype which is running in the in-circuit or in-system environment needs to set the debugging window for the visibility in which there is a debugging reference point in time, and to examine the values of one or more signals in DUV within the debugging window. It may be necessary the debugging reference point in time must be located at the end part of the debugging window (hereafter, we'll call this pre-trigger debugging mode), at the middle part of the debugging window (hereafter, we'll call this mid-trigger debugging mode), or at the beginning part of the debugging window (hereafter, we'll call this post-trigger debugging mode) to debug a particular design error, Therefore, in the verification using physical prototypes, one of three debugging modes (pre-trigger debugging mode, mid-trigger debugging mode, or post-trigger debugging mode) could be chosen arbitrarily during the debugging process. Also, it is necessary to provide 100% visibility for the fast debugging of DUV or one or more design objects in DUV where there are one or more user clocks having no phase relationship.

To achieve the said objectives, the debugging method in the verification using physical prototypes (hereafter we'll call this PP-debugging method) instruments an instrumentation circuit for debugging or instrumentation code for debugging (to be defined later) into DUV, which is implemented in one or more FPGA or non-memory IC chips on the target board so that the input information (the values of all inputs and inputs of a specific design object for a specific time period) can be saved, and simultaneously the design state information (the values of all flipflop outputs, latch outputs, memory contents, and combinational feedback signals or variables in each of all closed combinational feedback loops at a specific time in the execution) can be saved while the target board is running at speed, and they (the input information and the design state information) are obtained later (for a simulation in a computer). Here, we'd like to emphasize the separation of design state information saving and design state information obtaining. Saving design state information means to save the state information of DUV or one or more design objects in DUV into a separate storage in said FPGA or non-memory chips at the specific time while the target board is running at full speed in the in-circuit or in-system environment. Obtaining design state information means to read the design state information saved in said chips into a computer so that it can be used for simulating DUV or one or more design objects in DUV (with Verilog simulator, VHDL simulator, SystemVerilog simulator, SystemC simulator, virtual prototype, etc). Saving input information and obtaining input information are similarly defined. To read the design state information and input information saved in said FPGA and non-memory IC chips (hereafter we'll call them chips, in short) to computer, said chips and said computer are connected with a cable (for example, a USB cable connection between a JTAG port of FPGA and a USB port of computer, or a parallel cable connection between a JTAG port of FPGA and a parallel port of computer) and said chips are controlled by a software running in said computer (For detail, refer to JTAG interface document for Xilinx FPGA or Altera FPGA).

It is possible to choose the some part of a design module or subblock in a user design as a design object (for example, if memories exist in the design module or subblock, the design object could be its remaining part except the memories), the design state information of said design object is the values of all sequential elements at the specific time if there is no closed combinational feedback loop. For example, it a specific design object is constructed by excluding memories, the design state information of said design object does not have any memory value, but if some outputs and inputs of memories are inputs and inputs of said design object, then the values of some outputs and inputs of memories are used for constructing the input information of said design object. In this present invention, a method for simulating a design object including memory from a specific period without reading the contents of memory in DUV implemented in FPGA operated in the in-circuit or in-system environment will be explained later (refer to the partial memory reconstruction method). The emphasis is put on the fact that the input information is defined for a specific time period (t1, t2) (that is, from t1 to t2), and the design state information is defined at a specific time ti (Therefore, the every input event changes are recorded in the input information). Of course, the input information can be defined at the specific time if t1=t2 for the period (t1, t2). However, if this is the case, we will use the terminology of input information at the specific time, not for a period. That is, as the input information implies the input information at the specific period, the terminology of input information at the specific time should be used for the input information at the specific time.

The method to determine the saving time of design state information is to use trigger IP (Intellectual Property) or some logic module providing similar feature (For example, ILA/IBA core provided in ChipScope from Xilinx, or trigger module provided SignalTap from Altera. Those can include some assertion logic which will be explained later). Also, the firing time of one or more triggers can be determined by the assertion logic, which is synthesized and implemented from one or more assertion statements using OVL (Open Verification Library), PSL (Property Specification Language), SVA (SystemVerilog Assertion), or proprietary assertion technique. In this case, it can be thought the assertion logic does the role of trigger module, and the time at which the assertion is fired could be the debugging reference point in time. Moreover, the debugging reference point in time in HW/SW co-verification could be determined by the occurrence of special situation (for example, a privilege instruction executed) which is resulted from the SW execution, or one (for example, an interrupt occurred) which is resulted from the HW execution. If the debugging reference point in time is determined by the occurrence of special situation from SW side or HW side, 100% visibility for HW part implemented in one or more FPGA or non-memory chips is provided within a debugging window. Therefore, the debugging reference point in time could be a reference point for both HW part and SW part so that 100 visibility for HW part (by the method in this present invention) and 100% visibility for SW part (by any of the traditional in-circuit debuggers for processor) could be synchronized.

Said logic module for trigger handling, that is included in the instrumentation circuit for debugging or the instrumentation code for debugging, can be generated automatically for the software in a computer which reads and analyzes a DUV. Or, if FPGA chips on a target board are Xilinx FPGA, saving the design state information without stopping the operation of the target board and obtaining the design state information is to use the readback capture capability of Xilinx, that uses Readback Capture Library Primitive such as CAPTURE_VIRTEX of Xilinx Virtex series.

The advantage of using Xilinx's readback capture capability for saving and obtaining the design state information is to decrease the overhead of extra logic for debugging because that capability is already built-in in FPGA chips, and make saving and obtaining the design state information of DUV or one or more design objects in DUV easier when there are more than one user clocks with no phase relation in DUV. In other words, when there are many user docks with no phase relation and a parallel-load/serial-scanout method is used for a general method for saving/obtaining the design state information, the parallel loading operation for a parallel-load/serial-scanout register (see FIG. 36) must use each of user docks as a loading dock for capturing the corresponding outputs of flipflops or latches in each clock domain without any timing errors. But, the scan-out operation for the register must use single scan dock. Therefore the register should be consisted of flipflops having dual dock inputs (we'll call this kind of flipflop FF-dclk, in short), one for capturing and the other for scanning-out. However, every FPGAs in the market do not have such flipflops. In this situation, the readback capture capability of Xilinx FPGA are very useful for debugging when erroneous behavior is non-deterministic, which is un-repeatable, or there are two or more user dock with no phase relation (More detailed explanation is given later). Also, if the readback capture capability of Xilinx FPGA is used, the timing variation due to the instrumentation for debugging can be minimized. If CAP input port, which is one of inputs of Readback Capture Library Primitive, is used, one or more FPGA flipflop state information capturing times can be determined. CAP input can be driven by a trigger output of a trigger module in the in-circuit or in-system environment.

The other way capturing and obtaining the design state information is to use two-level parallel-load/serial-scanout register. The first level of this register is a parallel-loadable register (see FIG. 37) for parallel load, and its second level is a parallel-load/serial-scanout register for parallel load and serial scanout. When FPGA or non-memory IC chips do not have readback capture capability, two-level parallel-load/serial-scanout register can be useful for debugging when erroneous behavior is non-deterministic, which means it is un-repeatable, or there are two or more user dock with no phase relation (More detailed explanation is given later).

When to obtain the design state information with the method using FPGA readback capture capability, it is necessary to extract it (design state information) from FPGA flipflop state information (FPGA flipflop state information represents the logic state of all FPGA flipflops in a chip) or FPGA flipflop/memory state information (FPGA flipflop/memory state information represents the logic state of all FPGA flipflops and BlockRAMs in a chip) read by the readback capture.

It is possible to obtain a FPGA flipflop state information using the readback capture capability without pausing DUV, which is running at high speed in the in-circuit or in-system environment. It is not possible to obtain a FPGA flipflop/memory state information using the readback capture capability without pausing DUV, which is running at high speed in the in-circuit or in-system environment, because the memory access using a dock of Readback Capture Library Primitive for reading the contents of memory through the readback capture prevents a user dock simultaneous accessing it, and requires DUV to be paused (Therefore, it is impossible to read out memory using the readback capture in the in-circuit or in-system environment). But, if the memory state is not read out when DUV, or one or more design objects in DUV have memory and it is implemented by the embedded memory in FPGA or using the external memory attached to FPGA, the simulation is only possible with the part of design excluding the memory. To solve this problem, we propose an efficient method (hereafter we'll call it "partial memory reconstruction method") explained below. In partial memory reconstruction method, the logical values of minimal memory input/output signals (such as memory address input, memory data input, memory read/write input, memory dock input, memory data out) of memories, which are either one or more FPGA embedded memories or one or more external memories attached to FPGA, are saved and obtained for a specific time period from ta to tb while FPGA is running at speed (the specific method for saving and obtaining is same as the method for saving and obtaining the input information explained later), and analyzed it later for partially reconstructing the contents of memories from ta to tb (For example, let's assume a memory have addresses from 00 to FF, and the data is 8 bit wide. Let's assume there are memory operations from ta to tb as follows. The data 16 in hex is written at the address 04, the data 19 in hex written at the address 06, the data 21 in hex read from at the address 07, and the data 20 in hex written at the address 03 in the order. The partial memory reconstruction method in this present invention reconstruct 19 in hex at the address 06, 21 in hex at the address 07, and XX (X: unknown) at all remaining addresses at ta). The partially reconstructed memory contents at ta is used together with the design state information of DUV or, one or more design objects in DUV excluding the memory for the simulation with it (the memory).

The process of design state information extraction for DUV, or one or more design objects in DUV from an FPGA state information needs to know that which physical elements in FPGA actually implement the flipflops and latches in the gate-level netlist if the simulation using the design state information of DUV, or one or more design objects in DUV is gate-level simulation using a gate-level netlist (because the FPGA state information read by readback capture has the values of said physical elements in FPGA). This information can be known by analyzing the result of placement by FPGA P&R tool because this is determined at the placement (For a specific example, in the case of Xilinx FPGA, this is possible by analyzing files whose file extension are .ll, .mrp, .xdl, etc). Also, if the simulation using the design state information of DUV, or one or more design objects in DUV is RTL simulation using RTL codes, then we need to know not only which physical elements in FPGA actually implement the flipflops and latches in the gate-level netlist synthesized from RTL codes (this can be done be analyzing the placement result of FPGA P&R tool), but also what the corresponding signals or variables names at the gate-level of those (signals or variables names) at RTL for outputs of flipflops and latches, and address input, read/write control input, data input, data output (if data is bi-directional, then data input) of memories are. But, it is relatively not difficult to co-relate the signals or variables names at RTL for outputs of flipflops and latches, and address input, read/write control input, data input, data output (if data is bi-directional, then data input) of memories with the signals or variables names of correspondings at the gate-level, because the synthesis process generally preserve those names, or some synthesis tools (for example, Design-Cornpiler from Synopsys, SynplifyPro from Synplicity, Encounter RTL Compiler from Cadence, Precision from Mentor, etc) only change their names with a specific name changing rules. Also, in the case of prototyping using FPGA, the technology transformation is needed for changing a gate-level netlist using a specific standard cell library or gate-array library to a gate-level netlist using a FPGA library, it is also not difficult to co-relate those signals or variables names as those names are unchanged or only changed with a specific name changing rules.

For saving and obtaining the input information, the corresponding IP of ChipScope from Xilinx or SignalTal from Altera, the logic module of Identify from Synplicity providing the corresponding feature, the logic module of other commercial embedded logic analyzers providing the corresponding feature (such as ClearBlue from DAFCA, etc), or some logic module providing similar feature (basically, this logic module has a memory writing capability with an input data stream coming into an input port of DUV, or one or more design objects for a specific verification time period in the entire verification time, and a memory reading capability for reading written contents later, and this logic module is the part of said instrumentation logic for debugging or instrumentation code for debugging in this present invention) are instrumented to DUV in an automatic way, and then the input information is saved into the embedded memories (for example, BlockRAM) inside chip or massive external memories (one or more DDR-SDRAM's, SDRAMs, DRAM's, SRAM's, etc) first, and retrieved into a computer later.

Said logic module can be created by executing a SW in a computer so that it can be done automatically by reading and analyzing a DUV for debugging, or made as IP in a library and reused. DUV in FPGA or non-memory chips on a target board is executed at speed in the in-circuit or in-system environment while the input sequence is provided from the outside of chips. In this situation, said instrumentation circuit for debugging or instrumentation code for debugging is also executing with DUV, it collects (in this present invention collecting means saving and obtaining) the input information of DUV, or one or more design objects in DUV for a specific time period from Ts to Te, (Ts, Te), and the design state information of DUV, or one or more design objects in DUV at one or more specific time Tr between Ts and Te in real time (In general, Tr includes Ts and additionally one or more arbitrary time points between Ts and Te, or one or more one or more arbitrary time points between Ts and Te. But for specific example it is desirable Tr may be two time points between Ts and Te in the in-circuit or in-system environment, as explained later). An example of method to determine the times of saving the design state information is to use a binary counter and a trigger module in said instrumentation circuit for debugging or instrumentation code for debugging, and its time is determined by the specific condition of the counter (for example, when the counter reaches its terminal count) and the use of event trigger or sequence trigger feature of trigger module. Trigger module can be implemented by using ILA/IBA core (ILA, ILA/ACT, IBA/OPB, IBA/PLB) provided in Chip-Scope from Xilinx, trigger module provided SignalTap from Altera, or some logic module providing similar triggering feature. Said logic module (the part of instrumentation logic for debugging or instrumentation code for debugging) can be created by executing a SW in a computer so that it can be done automatically by reading and analyzing a DUV for debug-ging. Therefore, in this present invention, we will call each of instrumented circuit to DUV, IP module, library cell, synthesizable HDL code, or any combination of these for collecting the input information and design state information, the instrumentation circuit for debugging or instrumentation code for debugging.

If we don't use the built-in feature of built-in instrumentation logic for debugging such as readback capture of Xilinx FPGA Xilinx FPGAs, the instrumentation logic for debugging or instrumentation code for debugging, which should be an additional instrumented circuit into DUV, IP module, library cell, synthesizable HDL code, or any combination of these for collecting the input information and design state information, must be instrumented. Especially, we will call the instrumentation circuit for debugging or instrumentation code for debugging probing the design state information, which is consisted of flipflops and latches only in DUV, or one or more design objects in DUV, the flipflop/latch-probing instrumentation circuit for debugging or instrumentation code for debugging. The instrumentation circuit for debugging or instrumentation code for debugging in this present invention could be classified into the instrumentation circuit for debugging or instrumentation code for debugging already built-in during the manufacturing of FPGA, SOC, or ASIC chips, and the instrumentation circuit for debugging or instrumentation code for debugging instrumented into DUV and programmed with DUV during FPGA programming. We'll call the former the built-in instrumentation circuit for debugging, and the later the additionally instrumented instrumentation circuit for debugging or additionally instrumented instrumentation code for debugging if we need to distinguish them each other. We'd call the instrumentation circuit for debugging or instrumentation code for debugging if we don't need to distinguish them each other. Therefore, in this present invention, using the instrumentation circuit for debugging or instrumentation code for debugging implemented with DUV could mean to use the built-in instrumentation circuit for debugging or instrumentation code for debugging, the additionally instrumented instrumentation circuit for debugging or additionally instrumented instrumentation code for debugging, or the combination of two.

For performing one or more simulations using one or more simulators (arbitrary simulators for design verification such as HDL simulators, VP, etc), TB and DFS (Design For Simulation) (DFS is one or more design objects for simulation) are generated from said input information and design state information, which are saved and obtained from a target board in the in-circuit or in-system environment, and said DUV or one or more design objects in DUV (The detailed method for producing TB and DFS for simulation could be found in Korean patent application 10-2005-116706).

By simulation-compiling and elaborating said TB and DFS using one or more simulators (such as HDL simulators) to generate one or more simulation execution files, and performing one or more simulations, high controllability and 100% visibility can be provided for DUV, which is difficult in the conventional hardware debugging on a target board, thereby enabling efficient debugging. For enhancing the visibility, when the simulation is performed with the design state information and input information collected from the in-circuit or in-system environment for DUV or one or more design objects in DUV where there are two or more user clocks, the visibility for all clock domains can be made by a single simulation execution, not multiple simulation executions for each clock domain if force/release statement, assign/deassign statement, force/release simulation command, or assign/deassign simulation command available in most of commercial simulators (such as NC-Verilog, VCS, Mode Sim, etc) is used for driving said design state information and input information. For simulation, if necessary, by using SDF which has an exact timing information about DIN, said simulation could be a timing simulation so that a debugging for timing error is even possible.

What is claimed is:

1. A distributed parallel simulation method for a predetermined model at a specific abstraction level comprising:
   (a) obtaining expected inputs and expected outputs for at least one local simulation among a plurality of local simulations in the distributed parallel simulation for the predetermined model, wherein the local simulation is defined as each of simulations for local design objects in case of executing a parallel simulation by spatially dividing the predetermined model into a plurality of local design objects; and
   (b) for at least one part of entire simulation time period, executing said at least one local simulation in the distribution parallel simulation for the predetermined model by using the expected inputs and the expected outputs,
   wherein the expected inputs and the expected outputs for the at least one local simulation of the step (a) is obtained by:
   (a1) while executing the distributed parallel simulation for the predetermined model at the specific abstraction level,
   in said at least one local simulation, simultaneously simulating a first model and a local design object corresponding to the local simulation, wherein the first model is same to the predetermined model except that an abstraction level of the first model is higher than an abstraction level of the predetermined model, and
   the step (b) comprises:
   (b1) determining whether actual outputs match with the expected outputs obtained in the step (a), wherein the actual outputs are outputs obtained from an execution in which said at least one local simulation among the plurality of local simulations is executed independently with other local simulations by using the expected inputs as inputs of simulation for local design object corresponding to the local simulation while not performing a communication and a synchronization, which maintains causality relationship between the plurality of local simulations, with other local simulations;
   (b2) if it is determined that the actual outputs do not match with the expected outputs in the step (b1), executing at least one local simulation among the plurality of local simulations by using actual inputs as inputs of simulation for local design object corresponding to the local simulation, wherein the actual inputs are inputs obtained from an execution in which the at least one local simulation is executed while performing the communication and the synchronization with other local simulations;
   (b3) while executing the at least one local simulation according to the step (b2), determining whether actual outputs match with the expected outputs obtained in the step (a), wherein the actual outputs are outputs obtained from an execution in which the at least one local simulation among the plurality of local simulations is executed by using the actual inputs, which is obtained through the communication and the synchronization with other local simulations, as inputs of simulation for local design object corresponding to the local simulation; and
   (b4) if it is determined that, in the step (b3), the actual outputs match with the expected outputs at least for a predetermined times in a specific time point, executing the at least one local simulation among the plurality of local simulations by using again the expected inputs and the expected outputs of the step (a) from the specific time point while not performing the communication and the synchronization with other local simulations.

2. The distributed parallel simulation method of claim 1, wherein, through the step (b), at least one local simulation among said plurality of local simulations is executed while performing at least one checkpoint, the checkpoint being performed for a roll-back which can happen in a future,
   wherein the step (b2) comprises:
   (c1) if the actual outputs do not match with the expected outputs in the step (b1), informing other local simulations of an occurrence of mismatch and a corresponding simulation time at which the mismatch occurred,
   (c2) in each of the local simulations, determining whether the roll-back is needed by comparing the corresponding simulation time informed by the local simulation in which the mismatch occurred in the step (c1) to a current simulation time, and performing the roll-back if it is determined that the roll-back is needed, and
   (c3) executing at least one local simulation among said plurality of local simulations by using actual inputs as inputs of simulation for local design object corresponding to the local simulation, wherein the actual inputs are inputs obtained from an execution in which the at least one local simulation is executed while performing the communication and the synchronization with other local simulations, at the same time, output of the local design object corresponding to the local simulation is being compared with the expected output for returning to the local simulation with the expected input, which could eliminate the communication and the synchronization with other local simulations.

3. The distributed parallel simulation method of claim 1, wherein, through the step (b), at least one local simulation among said plurality of local simulations is executed while performing at least one checkpoint, the checkpoint being performed for a roll-back which can happen in a future,
   wherein the step (b2) comprises:
   (d1) if the actual outputs do not match with the expected outputs in the step (b1), informing other local simulations of an occurrence of mismatch and a simulation time t_d, wherein the simulation time t_d is a time at which the mismatch occurred,
   (d2) in each of the local simulations, comparing the simulation time t_d, which is informed by the local simulation in which the mismatch occurred in the step (d1), to a simulation time t_c of each of local simulations, wherein the simulation time t_c is a current simulation time of the each of local simulations,
   (d3) setting the current simulation time of every local simulation identical by either determining that a roll-back is needed if the simulation time t_c is later than the simulation time t_d (i.e., t_c>t_d) and performing a roll-back, or determining that a roll-forward is needed if the simulation time t_c is earlier than the simulation time t_d (i.e., t_c<t_d) and performing a roll-forward, and
   (d4) executing said every local simulation by using actual inputs as inputs of simulation for local design object corresponding to the local simulation, wherein the actual inputs are inputs obtained from an execution in which said every local simulation is executed while performing the communication and the synchronization with other local simulations, at the same time, output of the local design object corresponding to the local simulation is being compared with the expected output for returning to the local simulation with the expected input, which could eliminate the communication and the synchronization with other local simulations.

4. The distributed parallel simulation method of claim 1, wherein said specific abstraction level of said predetermined model is GL (Gate Level), and the abstraction level of said first model is RTL (Register Transfer Level) or mixed level of RTL and GL (Gate level).

5. The distributed parallel simulation method of claim 1, wherein said specific abstraction level of said predetermined model is RTL, and the abstraction level of said first model is ESL (Electronic System Level) or mixed level of ESL and RTL.

6. A distributed parallel simulation method for a predetermined model at a specific abstraction level comprising:
(a) obtaining expected inputs and expected outputs for at least one local simulation among a plurality of local simulations in the distributed parallel simulation for the predetermined model, wherein the local simulation is defined as each of simulations for local design objects in case of executing a parallel simulation by spatially dividing the predetermined model into a plurality of local design objects; and
(b) for at least one part of entire simulation time period, executing said at least one local simulation in the distribution parallel simulation for the predetermined model by using the expected inputs and the expected outputs,
wherein the expected inputs and the expected outputs for the at least one local simulation of the step (a) is obtained by:
prior to execution of the distributed parallel simulation for the predetermined model at the specific abstraction level,
while performing a simulation with a first model which is same to the predetermined model except that an abstraction level of the first model is higher than an abstraction level of the predetermined model,
storing input information and output information for at least one design object, which exist in the first model, as the expected inputs and the expected outputs, and
the step (b) comprises:
(b1) determining whether actual outputs match with the expected outputs obtained in the step (a), wherein the actual outputs are outputs obtained from an execution in which said at least one local simulation among the plurality of local simulations is executed independently with other local simulations by using the expected inputs as inputs of simulation for local design object corresponding to the local simulation while not performing a communication and a synchronization, which maintains causality relationship between the plurality of local simulations, with other local simulations;
(b2) if it is determined that the actual outputs do not match with the expected outputs in the step (b1), executing at least one local simulation among the plurality of local simulations by using actual inputs as inputs of simulation for local design object corresponding to the local simulation, wherein the actual inputs are inputs obtained from an execution in which the at least one local simulation is executed while performing the communication and the synchronization with other local simulations;
(b3) while executing the at least one local simulation according to the step (b2), determining whether actual outputs match with the expected outputs obtained in the step (a), wherein the actual outputs are outputs obtained from an execution in which the at least one local simulation among the plurality of local simulations is executed by using the actual inputs, which is obtained through the communication and the synchronization with other local simulations, as inputs of simulation for local design object corresponding to the local simulation; and
(b4) if it is determined that, in the step (b3), the actual outputs match with the expected outputs at least for a predetermined times in a specific time point, executing the at least one local simulation among the plurality of local simulations by using again the expected inputs and the expected outputs of the step (a) from the specific time point while not performing the communication and the synchronization with other local simulations.

7. The distributed parallel simulation method of claim 6, wherein said specific abstraction level of said predetermined model is GL (Gate Level), and the abstraction level of said first model is RTL (Register Transfer Level) or mixed level of RTL and GL (Gate level).

8. The distributed parallel simulation method of claim 6, wherein said specific abstraction level of said predetermined model is RTL, and the abstraction level of said first model is ESL (Electronic System Level) or mixed level of ESL and RTL.

9. The distributed parallel simulation method of claim 6, wherein, through the step (b), at least one local simulation among said plurality of local simulations is executed while performing at least one checkpoint, the checkpoint being performed for a roll-back which can happen in a future,
wherein the step (b2) comprises:
(c1) if the actual outputs do not match with the expected outputs in the step (b1), informing other local simulations of an occurrence of mismatch and a corresponding simulation time at which the mismatch occurred,
(c2) in each of the local simulations, determining whether the roll-back is needed by comparing the corresponding simulation time informed by the local simulation in which the mismatch occurred in the step (c1) to a current simulation time, and performing the roll-back if it is determined that the roll-back is needed, and
(c3) executing at least one local simulation among said plurality of local simulations by using actual inputs as inputs of simulation for local design object corresponding to the local simulation, wherein the actual inputs are inputs obtained from an execution in which the at least one local simulation is executed while performing the communication and the synchronization with other local simulations, at the same time, output of the local design object corresponding to the local simulation is being compared with the expected output for returning to the local simulation with the expected input, which could eliminate the communication and the synchronization with other local simulations.

10. The distributed parallel simulation method of claim 6, wherein, through the step (b), at least one local simulation among said plurality of local simulations is executed while performing at least one checkpoint, the checkpoint being performed for a roll-back which can happen in a future,
wherein the step (b2) comprises:
(d1) if the actual outputs do not match with the expected outputs in the step (b1), informing other local simulations of an occurrence of mismatch and a simulation time t_d, wherein the simulation time t_d is a time at which the mismatch occurred,
(d2) in each of the local simulations, comparing the simulation time t_d, which is informed by the local simulation in which the mismatch occurred in the step (d1), to a simulation time t_c of each of local simulations, wherein the simulation time t_c is a current simulation time of the each of local simulations, (d3) setting the current simulation time of every local simulation identical by either determining that a roll-back is needed if the simulation time t_c is later than the simulation time t_d (i.e., t_c>t_d) and performing a roll-back, or determining that a roll-forward is needed if the simulation time t_c is earlier than the simulation time t_d (i.e., t_c<t_d) and performing a roll-forward, and (d4) executing said every local simulation by using actual inputs as inputs of simulation for local design object corresponding to the local simulation, wherein the actual inputs are inputs obtained from an execution in which said every local simulation is executed while performing the communication and the synchronization with other local simulations, at the same time, output of the local design object corresponding to the local simulation is being compared with the expected output for returning to the local simulation with the expected input, which could eliminate the communication and the synchronization with other local simulations.

11. A distributed parallel simulation method for a predetermined model at a specific abstraction level comprising:

(a) obtaining expected inputs and expected outputs for at least one local simulation among a plurality of local simulations in the distributed parallel simulation for the predetermined model, wherein the local simulation is defined as each of simulations for local design objects in case of executing a parallel simulation by spatially dividing the predetermined model into a plurality of local design objects; and (b) for at least one part of entire simulation time period, executing said at least one local simulation in the distribution parallel simulation for the predetermined model by using the expected inputs and the expected outputs, wherein the expected inputs and the expected outputs for the at least one local simulation of the step (a) is obtained by:

prior to execution of the distributed parallel simulation for the predetermined model at the specific abstraction level, while performing a simulation with a first model which is same to the predetermined model except that at least one design modification exists in at least one design object in the predetermined model, storing input information and output information for at least one design object, which exist in the first model, as the expected inputs and the expected outputs, and the step (b) comprises:

(b1) determining whether actual outputs match with the expected outputs obtained in the step (a), wherein the actual outputs are outputs obtained from an execution in which said at least one local simulation among the plurality of local simulations is executed independently with other local simulations by using the expected inputs as inputs of simulation for local design object corresponding to the local simulation while not performing a communication and a synchronization, which maintains causality relationship between the plurality of local simulations, with other local simulations;

(b2) if it is determined that the actual outputs do not match with the expected outputs in the step (b1), executing at least one local simulation among the plurality of local simulations by using actual inputs as inputs of simulation for local design object corresponding to the local simulation, wherein the actual inputs are inputs obtained from an execution in which the at least one local simulation is executed while performing the communication and the synchronization with other local simulations;

(b3) while executing the at least one local simulation according to the step (b2), determining whether actual outputs match with the expected outputs obtained in the step (a), wherein the actual outputs are outputs obtained from an execution in which the at least one local simulation among the plurality of local simulations is executed by using the actual inputs, which is obtained through the communication and the synchronization with other local simulations, as inputs of simulation for local design object corresponding to the local simulation; and (b4) if it is determined that, in the step (b3), the actual outputs match with the expected outputs at least for a predetermined times in a specific time point, executing the at least one local simulation among the plurality of local simulations by using again the expected inputs and the expected outputs of the step (a) from the specific time point while not performing the communication and the synchronization with other local simulations.

12. The distributed parallel simulation method of claim 11, wherein, through the step (b), at least one local simulation among said plurality of local simulations is executed while performing at least one checkpoint, the checkpoint being performed for a roll-back which can happen in a future, wherein the step (b2) comprises:

(c1) if the actual outputs do not match with the expected outputs in the step (b1), informing other local simulations of an occurrence of mismatch and a corresponding simulation time at which the mismatch occurred, (c2) in each of the local simulations, determining whether the roll-back is needed by comparing the corresponding simulation time informed by the local simulation in which the mismatch occurred in the step (c1) to a current simulation time, and performing the roll-back if it is determined that the roll-back is needed, and (c3) executing at least one local simulation among said plurality of local simulations by using actual inputs as inputs of simulation for local design object corresponding to the local simulation, wherein the actual inputs are inputs obtained from an execution in which the at least one local simulation is executed while performing the communication and the synchronization with other local simulations, at the same time, output of the local design object corresponding to the local simulation is being compared with the expected output for returning to the local simulation with the expected input, which could eliminate the communication and the synchronization with other local simulations.

13. The distributed parallel simulation method of claim 11, wherein, through the step (b), at least one local simulation among said plurality of local simulations is executed while performing at least one checkpoint, the checkpoint being performed for a roll-back which can happen in a future, wherein the step (b2) comprises:

(d1) if the actual outputs do not match with the expected outputs in the step (b1), informing other local simulations of an occurrence of mismatch and a simulation time t_d, wherein the simulation time t_d is a time at which the mismatch occurred, (d2) in each of the local simulations, comparing the simulation time t_d, which is informed by the local simulation in which the mismatch occurred in the step (d1), to a simulation time t_c of each of local simulations, wherein the simulation time $t\_c$ is a current simulation time of the each of local simulations, (d3) setting the current simulation time of every local simulation identical by either determining that a roll-back is needed if the simulation time $t\_c$ is later than the simulation time $t\_d$ (i.e., $t\_c > t\_d$) and performing a roll-back, or determining that a roll-forward is needed if the simulation time $t\_c$ is earlier than the simulation time $t\_d$ (i.e., $t\_c < t\_d$) and performing a roll-forward, and (d4) executing said every local simulation by using actual inputs as inputs of simulation for local design object corresponding to the local simulation, wherein the actual inputs are inputs obtained from an execution in which said every local simulation is executed while performing the communication and the synchronization with other local simulations, at the same time, output of the local design object corresponding to the local simulation is being compared with the expected output for returning to the local simulation with the expected input, which could eliminate the communication and the synchronization with other local simulations.

\* \* \* \* \*